US007723011B2

(12) United States Patent
Wariishi

(10) Patent No.: US 7,723,011 B2

(45) Date of Patent: May 25, 2010

(54) IMAGE RECORDING MATERIAL AND NOVEL COMPOUND

(75) Inventor: Koji Wariishi, Shizuoka-ken (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 11/950,978

(22) Filed: Dec. 5, 2007

(65) Prior Publication Data

US 2008/0145782 A1 Jun. 19, 2008

(30) Foreign Application Priority Data

Dec. 7, 2006 (JP) ............................ 2006-331121

(51) Int. Cl.
*G03C 1/00* (2006.01)

(52) U.S. Cl. .................................................. 430/270.1

(58) Field of Classification Search ............. 430/270.1, 430/273.1, 281.1

See application file for complete search history.

(56) References Cited

U.S. PATENT DOCUMENTS 4,211,839 A * 7/1980 Suzuki et al. ............... 430/619
2002/0155951 A1* 10/2002 Shuku et al. ................ 503/200
2005/0028697 A1* 2/2005 Makino et al. ........... 101/450.1
2005/0048404 A1* 3/2005 Okamoto .................... 430/302
2007/0048663 A1* 3/2007 Sakata ..................... 430/270.1

FOREIGN PATENT DOCUMENTS

JP 58-29803 A 2/1983
JP 4-31863 A 2/1992
JP 4-106548 A 4/1992
JP 11-38633 A 2/1999
JP 2000-131837 A 5/2000

* cited by examiner

*Primary Examiner*—Amanda C Walke
*Assistant Examiner*—Chanceity N Robinson
(74) *Attorney, Agent, or Firm*—Sughrue Mion, PLLC

(57) ABSTRACT

This invention provides an image recording material, comprising: on a support, a protective layer that contains a crosslinked polymer formed of a polymer (a) having at least one kind of ionically crosslinkable functional group, and a low molecular weight compound (b) having at least one kind of ionically crosslinkable functional group, on an image recording layer, the image recording layer containing a compound (A), having at least one kind of ethylenically unsaturated bond, and a polymerization initiator (B).

11 Claims, No Drawings

IMAGE RECORDING MATERIAL AND NOVEL COMPOUND

CROSS REFERENCES TO RELATED APPLICATIONS

This invention claims priority under 35 USC 119 from Japanese Patent Application No. 2006-331121, the disclosure of which is incorporated by reference herein.

BACKGROUND OF THE INVENTION

1. Field of the Invention

The present invention relates to an image recording material sensitive to radiation; specifically, an image recording material suitable for use as a so-called direct plate-making negative-working lithographic printing plate precursor capable of directly making a plate with a laser from a digital signal of a computer, and a novel compound suitable for use in the image recording material.

2. Description of the Related Art

So far, as a method of forming an image by exposure with a photopolymerizable composition, various kinds of methods are known, such as a method where a recording layer is formed on a support surface and includes a photopolymerizable composition containing an ethylenically unsaturated compound and a photopolymerization initiator, wherein after image-wise exposure to polymerize and cure the ethylenically unsaturated compound of an exposed portion, a non-exposed portion is dissolved and removed to form a cured relief image, and a further method where, after the adhesive strength of a photopolymerizable composition layer (recording layer) to a support is altered by exposure, the support is peeled to form an image, and a further method where an image is formed by making use of the change in toner adhesiveness of a photopolymerizable composition layer due to light.

Examples of photopolymerization initiators that can be used in these methods include benzoin, benzoin alkyl ether, benzyl ketal, benzophenone, anthraquinone, benzyl ketone or Micheler's ketone, all of which are sensitive to short wavelength light with a center in a UV-region of 400 nm or less.

On the other hand, with the recent developments in the image formation techniques, photosensitive materials highly sensitive to light in a visible region are strongly demanded. For example, many photopolymerizable compositions with a sensitivity range extended to about 500 nm are proposed for a laser plate making system employing an oscillation beam at 488 nm of an argon ion laser. Further, photopolymerizable compositions sensitive to lights in the longer wavelength range exceeding 600 nm are actively studied in response to laser plate making systems employing a He—Ne laser or semiconductor laser, and reproduction techniques for full color images.

There is a known photopolymerizable composition which includes an ethylenically unsaturated compound and a photopolymerization initiation system, wherein the photopolymerization initiation system is composed of a cyanine dye having a specific structure and heterocycles linked through a monomethine, trimethine, pentamethine, or heptamethine chain, and a s-triazine derivative having a specific structure (e.g. see Japanese Patent Application Laid-Open (JP-A) No. 58-29803 and JP-A 4-31863). Besides, another photopolymerizable composition containing a polymerization initiator system composed of a squarylium compound having a specific structure and a specific s-triazine compound is proposed (e.g. see JP-A No. 4-106548).

However, it is known that when considering the active radical generation ability of a photopolymerization initiator with respect to light having a wavelength of 500 nm or more, in particular to light having a wavelength exceeding 600 nm, a decrease in photo-excitation energy is usually accompanied by a rapid decrease in sensitivity. All of the photopolymerizable compositions mentioned above, or that have been proposed so far, are insufficient in sensitivity to light in a long-wavelength region as mentioned above. Furthermore, there is a problem in that the polymerization reaction proceeds when the photopolymerizable compositions are handled under a white fluorescent lamp, making photopolymerizable compositions having stable qualities difficult to obtain at present.

In order to overcome the problems of low sensitivity and inconvenient handling properties under white light, a photopolymerizable composition containing an ethylenically unsaturated compound, a particular dye and a photopolymerization initiator (such as a triazine compound) has been proposed (JP-A No. 2000-131837).

However, a lithographic printing plate precursor that uses such a composition in a recording layer hinders the polymerization due to oxygen in the air at the time of a polymerization reaction, resulting in such problems as deteriorated sensitivity or insufficient strength of a formed image portion.

In order to overcome these problems, methods where a protective layer (oxygen-shielding layer) containing a water-soluble polymer is formed on an image recording layer, or where a protective layer containing an inorganic layered compound and a water-soluble polymer is used, are known (JP-A No. 11-38633). These protective layers are excellent in development removability and, owing to the presence of the protective layer, the effect of polymerization hindrance is prevented, the polymerization reaction of the image recording layer is accelerated, the sensitivity is heightened, and the mechanical strength of an image portion can be improved.

For improved productivity in the plate-making operation of photopolymerizing lithographic printing plate precursors that may be developed conveniently, it is important to shorten the time that the exposure process takes. In the exposure process, lithographic printing plate precursors are usually fed as a stack with an interleaf interposed therebetween. Accordingly, the time it takes to remove an interleaf in the exposure step is a cause of inefficiency. In order to improve the efficiency of the exposure step, it is possible to use a stacked body where an interleaf is not interposed between the precursors to omit the interleaf removing step. However, in such a stack, a protective layer surface of a lithographic printing plate precursor is rubbed by an aluminum support of another plate to cause scratches, affecting the polymerization reaction of the image recording layers, resulting in problems such as deteriorated sensitivity and development removability.

For the above reasons, an image recording material such as a lithographic printing plate precursor, high in sensitivity, excellent in development removability and difficult to scratch during handling is desired.

SUMMARY OF THE INVENTION

The invention has been made in view of the above circumstances and provides image recording material and novel compound.

A first aspect of the invention provides an image recording material, comprising:

on a support, a protective layer that contains a crosslinked polymer formed of a polymer (a) having at least one kind of ionically crosslinkable functional group, and a low molecular weight compound (b) having at least one kind of ionically crosslinkable functional group, on an image recording layer, the image recording layer containing a compound (A), having at least one kind of ethylenically unsaturated bond, and a polymerization initiator (B).

A second aspect of the invention provides a compound obtained by crosslinking, via an ionic bond, a modified polyvinyl alcohol having a carboxylic acid anion or a sulfonic acid anion at a side chain and/or at a main chain end; and a compound represented by formula (1):

Formula (1)

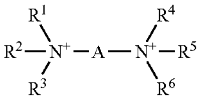

wherein in the formula (1), $R^1$ through $R^6$, respectively and independently, express a hydrogen atom, an alkyl group or an aryl group and A expresses a divalent linking group.

DETAILED DESCRIPTION

The invention intends to overcome existing problems and to achieve objects below.

That is, the present invention intends to provide an image recording material that can be written in by laser exposure and is excellent in the sensitivity, the development removability and the scratch resistance, and a novel compound that can be preferably used in the image recording material.

The present inventors, after studying hard variously to achieve the object, found that, when a crosslinked polymer (hereinafter, appropriately referred to as "specific crosslinked polymer") made of a polymer (a) having at least one kind of ionically crosslinkable group (hereinafter, appropriately referred to as "ion-crosslinkable polymer") and a low-molecular weight compound (b) having at least one kind of ionically crosslinkable group (hereinafter, appropriately referred to as "ionic crosslinking agent") is included in a layer disposed on an image recording layer, the object can be achieved and thereby the invention came to completion.

That is, the invention relates to an image recording material that has, on an image recording layer containing a compound (A) having at least one kind of ethylenically unsaturated bond and a polymerization initiator (B) on a support, a protective layer containing a crosslinked polymer formed of a polymer (a) having at least one kind of ionically crosslinkable functional group and a low molecular weight compound (b) having at least one kind of ionically crosslinkable functional group.

In the invention, an image recording layer preferably further includes a binder polymer (D) and a dye (E) having the absorption maximum in 300 to 1200 nm, in particular, a binder polymer (D) is preferably a polymer having an alkali-soluble group in a molecule.

Furthermore, in the invention, a low molecular weight compound (b) having at least one kind of ionically crosslinkable functional group is preferably an organic polyvalent onium compound and the organic polyvalent onium compound is more preferably an organic polyammonium compound.

On the other hand, in the invention, a polymer (a) having at least one kind of ionically crosslinkable functional group is preferably a modified polyvinyl alcohol and the modified polyvinyl alcohol is more preferably a modified polyvinyl alcohol having a carboxylic acid anion or a sulfonic acid anion.

Still furthermore, in the invention, a polymerization initiator (B) is preferred to be an onium salt.

It is preferred that a support is an aluminum support and, on a back surface of the support, a backcoat layer made of an organic resin is disposed.

Furthermore, an image recording material of the invention is preferably used as a negative-working lithographic printing plate precursor and the negative-working lithographic printing plate precursor allows stacking a plurality thereof in direct contact to form a stacked body.

A novel compound of the invention is a compound obtained by ionically crosslinking a modified polyvinyl alcohol having a carboxylic acid anion or a sulfonic acid anion on a side chain and/or at a main chain end and a compound represented by formula (1).

Formula (1)

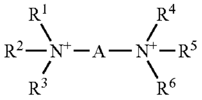

(In the formula (1), $R^1$ through $R^6$, respectively and independently, express a hydrogen atom, an alkyl group or an aryl group and A expresses a divalent linking group.)

Furthermore, a novel compound of the invention is preferred to be one that uses, among compounds represented by formula (1), a compound represented by formula (2).

Formula (2)

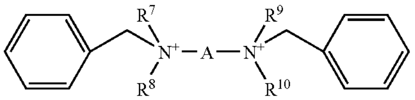

(In the formula (2), $R^7$ through $R^{10}$, respectively and independently, express a hydrogen atom, an alkyl group or an aryl group and A expresses a divalent linking group.)

The invention provides an image recording material that can be written in by laser exposure and is excellent in the sensitivity, the development removability and the scratch resistance, and provides a novel compound suitable for use in the image recording material.

The invention will be described in detail below.

An image recording material of the invention has, on an image recording layer containing a compound (A) having at least one kind of ethylenically unsaturated bond and a polymerization initiator (B) on a support, a protective layer containing a crosslinked polymer formed of a polymer (a) having at least one kind of ionically crosslinkable functional group and a low molecular weight compound (b) having at least one kind of ionically crosslinkable functional group.

A support, an image recording layer and a protective layer, which constitute an image recording material of the invention, will be described below.

<Specific Protective Layer>

A protective layer in the invention necessarily comprises a crosslinked polymer (specific crosslinked polymer) formed of a polymer (a) having at least one kind of ionically crosslinkable functional group and a low molecular weight compound (b) having at least one kind of ionically crosslinkable functional group. In the following, the protective layer, appropriately called as a "specific protective layer", will be described. The specific crosslinked polymer in the invention indicates a polymer crosslinked by an ionic bond in a polymer molecule and between polymer molecules.

The film strength of the specific protective layer increases due to inclusion of the specific crosslinked polymer and, hereby an improvement of scratch resistance is provided, maintaining high oxygen impermeability. Furthermore, it is found that the specific crosslinked polymer in the invention has high solubility to a developing solution and excellent development removability of the specific protective layer due to ionical crosslinkage.

From the mentioned above, the specific protective layer in the invention has excellent development removability, can prevent scratches during handling and can prevent the inhibition of polymerization due to high oxygen impermeability. Furthermore, when high luminance laser exposure is applied to the image recording layer, the specific protective layer, which is disposed on an image recording layer, can prevent occurrence of an ablation.

The specific crosslinked polymer in the invention will be described below.

[Ionically Crosslinkable Polymer (a)]

In the beginning, the polymer (a) having at least one kind of ionically crosslinkable group (ionically crosslinkable polymer) may be any one of an anionic polymer that has an anionic group as an ionically crosslinkable group in a molecule and a cationic polymer that has a cationic group as an ionically crosslinkable group in a molecule. The ionically crosslinkable group is preferably present on a side chain and/or at an end of a main chain of a polymer, and, in particular, a polymer having an ionically crosslinkable group on a side chain is preferred.

Examples of the anionic groups that an ionically crosslinkable polymer has include a carboxylate group ($-CO_2^-$), a sulfonate group ($-SO_3^-$), a sulfinate group ($-SO_2^-$), a phosphonate group ($-PO_3^-$), a sulfuric acid monoester group ($-OSO_3^-$) and a sulfone amidate group ($-SO_2N^-R_2$). A carboxylate group ($-CO_2^-$), a sulfonate group ($-SO_3^-$) and a sulfinate group ($-SO_2^-$) are preferred.

On the other hand, examples of cationic groups that an ionically crosslinkable polymer has include cationic onium groups derived from a nitrogen atom, a phosphorus atom, a sulfur atom and an iodine atom. Among these, non-metallic cations such as an ammonium group, a phosphonium group, a sulfonium group, an iodonium group and an oxonium group are preferred and an ammonium group is more preferred. As ammonium groups, a secondary ammonium group, a tertiary ammonium group and a quaternary ammonium group are preferably used. Furthermore, as the cationic group, groups having a tetravalent nitrogen atom as well can be preferably used. As the groups having a tetravalent nitrogen atom, other than the ammonium groups, a pyridinium group and an imidazolium group can be preferably used.

The ionically crosslinkable polymer in the invention may well have at least one of the ionically crosslinkable groups.

The ionically crosslinkable polymer may be any one of a copolymer or a homopolymer of a monomer containing an anionic group or a cationic group and a copolymer of a monomer containing an anionic group or a cationic group and a monomer that does not have an anionic group and a cationic group.

In the invention, examples of main skeletons of ionically crosslinkable polymers, without particularly restricting, include a polyvinyl system, a polyamide system, a polyester system, a polyurethane system, a polyureide system, a polycarbonate system, polysaccharides, polyethylene amine and polyethylene imine. A polyvinyl system and a polyurethane system are preferred.

The ionically crosslinkable polymer in the invention is preferred to be an aqueous polymer and in particular a modified body of polyvinyl alcohol (modified polyvinyl alcohol) is preferred.

Now, the modified body of polyvinyl alcohol in the invention is a modified polyvinyl alcohol in which an anionic group or a cationic group is introduced. The modified body of polyvinyl alcohol is not restricted in a synthesis method as far as it is resultantly polyvinyl alcohol having an anionic group or a cationic group. However, in particular, one prepared by a method of copolymerizing a copolymerization component having an anionic group or a cationic group at synthesis of polyvinyl alcohol or a method where a compound having an anionic group or a cationic group is copolymerized to a hydroxyl group of polyvinyl alcohol is preferred.

Among the modified polyvinyl alcohols, one obtained by introducing an anionic group in polyvinyl alcohol is preferred. Specific examples thereof preferably include modified polyvinyl alcohol having an itaconic acid- or maleic acid-denatured carboxylic acid anion (carboxy-modified polyvinyl alcohol) and modified polyvinyl alcohol having a sulfonic acid anion (sulfonic acid-modified polyvinyl alcohol).

Among the acid-modified polyvinyl alcohols, ones having a saponification degree of 70% by mole or more are preferred and ones having a saponification degree of 90% by mole or more are more preferred.

Specific examples of modified polyvinyl alcohols having an anionic group include KL-118, KM-618, KM-118, SK-5102, MP-102 and R-2105 (trade name, produced by Kuraray Co., Ltd.), Gohsenol CKS-50, T-HS-1, T-215, T-350, T-330 and T-330H (trade name, produced by The Nippon Synthetic Chemical Industry Co., Ltd.) and AF-17 and AT-17 (trade name, produced by JAPAN VAM & POVAL Co., Ltd.).

Furthermore, specific examples of modified polyvinyl alcohols having a cationic group include Gohsefimer K-210 (trade name, produced by The Nippon Synthetic Chemical Industry Co., Ltd.) and C-506 (trade name, produced by Kuraray Co., Ltd.).

In the invention, a molecular weight of an ionically crosslinkable polymer, though not particularly restricted, from the viewpoints of the film forming property and the developability, is preferably, by weight average molecular weight, in a range of 2000 to 5000000, more preferably in a range of 3000 to 1000000, and particularly preferably in a range of 5000 to 500000.

[Ionic Crosslinking Agent (b)]

An ionic crosslinking agent (b) in the invention forms an ionic bond through an electrostatic interaction with an ionically crosslinkable group of the ionically crosslinkable polymer (a) to form a crosslinked polymer. Accordingly, in the case of the ionically crosslinked polymer being an anionic polymer, the ionic crosslinking agent is selected from cationic compounds and in the case of the ionically crosslinked polymer being a cationic polymer the ionic crosslinking agent is selected from anionic compounds.

At least one kind of ionically crosslinkable group that the ionic crosslinking agent has is present preferably 2 to 10 in a molecule, more preferably in a range of 2 to 5 and most preferably 2.

The ionic crosslinking agent in the invention may be either one of a polyvalent metal ion compound or a compound containing a plurality of ionic non-metal atoms in a molecule (hereinafter, appropriately referred to as a polyvalent non-metal ionic compound). However, from the viewpoint of the developability, a polyvalent non-metal ionic compound is preferably used.

As a cationic compound of the polyvalent non-metal ionic compounds, an organic polyvalent onium compound is preferably used. Here, the organic polyvalent onium compound means a compound that has a plurality of onium cations in a molecule. The number of the onium cations in the organic polyvalent onium compound is preferably in a range of 2 to 10, more preferably in a range of 2 to 5 and particularly preferably 2.

Examples of the organic polyvalent onium compounds include an organic polyvalent ammonium compound, an organic polyvalent phosphonium compound, an organic pyridinium compound and an organic polyvalent sulfonium compound. Among these, an organic polyvalent ammonium compound is preferred and a quaternary ammonium salt is particularly preferred. Furthermore, among quaternary ammonium salts, a quaternary ammonium salt where a total number of carbon atoms of substitution groups bonded to one onium cation atom is 5 or more and 50 or less is preferred, one having 6 or more and 45 or less carbon atoms being more preferred and one having 7 or more and 30 or less carbon atoms being particularly preferred.

Furthermore, an organic polyvalent onium compound, in particular, a quaternary ammonium salt particularly preferably contains at least one aromatic ring (benzene ring or naphthalene ring) in a molecule.

Furthermore, as the organic polyvalent onium compound, compounds represented by a formula (1) below are preferred.

Formula (1)

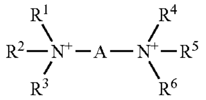

In the formula (1), $R^1$ through $R^6$, respectively and independently, express a hydrogen atom, an alkyl group or an aryl group, and A expresses a divalent linking group.

An alkyl group represented by $R^1$ through $R^6$ is preferably a straight chain, a branched chain or a cyclic alkyl group having 1 through 10 carbon atoms (such as methyl, t-butyl, cyclopentyl and cyclohexyl).

Furthermore, an aryl group represented by $R^1$ through $R^6$ is preferably an aryl group having 6 through 20 carbon atoms (such as phenyl, 1-naphtyl or 2-naphtyl).

The alkyl group and aryl group may further have a substituent group. Examples of preferable substituent groups include an alkyl group having 1 through 12 carbon atoms, an aryl group having 6 through 12 carbon atoms, an alkoxy group having 1 through 12 carbon atoms, an aryloxy group having 6 through 12 carbon atoms, an alkyl amide group having 1 through 12 carbon atoms, a arylamide group having 1 through 12 carbon atoms, a carbonyl group, a cyano group, a sulfonyl group, an thioalkyl group having 1 through 12 carbon atoms, a thioaryl group having 6 through 12 carbon atoms and —$N(R^a)(R^b)(R^c)^+$ (here, $R^a$, $R^b$ and $R^c$, respectively and independently, express an alkyl group and an alkylaryl group.).

The A expresses a divalent linking group. Examples of the divalent linking groups include an alkylene group, an arylene group, —O—, —S—, —C(═O)—, —$SO_2$— or a divalent group obtained by combining these. Among these, an alkylene group, an arylene group, —O— or a combination thereof is preferred and an alkylene group is more preferred.

In the formula (1), two of $R^1$ through $R^6$ may combine each other or these may form a ring. Examples of the rings that are formed include ones shown below.

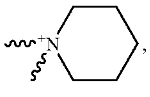
,

Pyridine ring

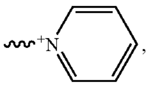
,

Pyridine ring

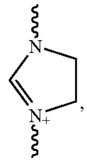
,

Imidazole ring

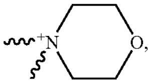

Morphorine ring

-continued

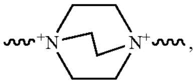
,

Diazabicyclooctane ring

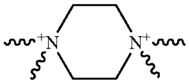

Piperazine ring

As the compounds represented by formula (1), compounds represented by formula (2) are preferred.

Formula (2)

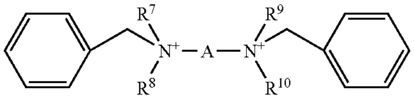

In the formula (2), $R^7$ through $R^{10}$, respectively and independently, express a hydrogen atom, an alkyl group or an aryl group and A expresses a divalent linking group.

The $R^7$ through $R^{10}$ and A in the formula (2) are same as the $R^1$ through $R^6$ and the A in the formula (1), and preferable examples as well are same.

A total number of carbon atoms of $R^7$ and $R^8$ and a total number of carbon atoms of $R^9$ and $R^{10}$ in the formula (2), respectively and independently, are preferred to be 1 or more and 43 or less, more preferred to be 2 or more and 38 or less and still more preferred to be 3 or more and 23 or less.

Furthermore, two of $R^7$ through $R^{10}$ may combine each other or these may form a ring. Rings that are formed are same as rings formed by combining two of the $R^1$ through $R^6$ each other.

On the other hand, as the anionic compound of the polyvalent nonmetal ionic compounds, generally, ones obtained by removing a proton from a polybasic organic acid or an inorganic acid are used. Specific examples thereof include phosphoric acid ion, a boric acid ion and carboxylic acid ions such as a citric acid ion, a succinic acid ion, a maleic acid ion, an oxalic acid ion and an adipic acid ion. In particular, a compound having two carboxylic acid ions is preferable for use.

[Specific Crosslinked Polymer]

The specific crosslinked polymer in the invention can be obtained by ionically crosslinking the ionically crosslinkable polymer (a) and ionic crosslinking agent (b).

More specifically, the specific crosslinked polymer of the invention can be obtained through a salt formation reaction between an anionic group or a cationic group contained in an ionically crosslinkable polymer (a) and a cationic group or an anionic group of an ionic crosslinking agent (b). For instance, the specific crosslinked polymer can be readily synthesized by use of a neutralization reaction of an ionic crosslinking polymer (a) due to an ionic crosslinking agent (b) or a salt exchange reaction due to an ionically crosslinkable polymer (a) and an ionic crosslinking agent (b).

In the invention, ionic sites of the ionically crosslinkable polymer and the ionic crosslinking agent in the specific crosslinked polymer may be used entirely or partially in ionic crosslinking. That is, in a specific crosslinked polymer, ionic sites may remain.

[Novel Compound]

Among the particular crosslinked bodies in the invention, compounds obtained by ionically crosslinking a modified polyvinyl alcohol (a') having a carboxylic acid anion or a sulfonic acid anion on a side chain and/or at a main chain end as a ionically crosslinkable polymer (a), and a compound (b') represented by the formula (1) as an ionic crosslinking agent (b) (novel compounds of the invention) are preferred. In particular, among the compounds (b') represented by the formula (1), compounds that are formed with compounds (b") represented by the (2) are preferred.

As the modified polyvinyl alcohols (b') having a carboxylic acid anion or a sulfonic acid anion on a side chain and/or at a main chain end, ones obtained by producing methods (1) through (3) shown below are preferred.

(1) Modified polyvinyl alcohols obtained by saponifying polymers between vinyl acetate and other vinyl monomer (such as acrylic acid, crotonic acid, maleic acid, fumaric acid, itaconic acid, acid anhydrides thereof and vinyl sulfonic acid), (2) modified polyvinyl alcohol obtained by reacting a hydroxyl group of polyvinyl group and a compound having the reactivity (such as acid anhydride (succinic anhydride and phthalic anhydride)), and (3) modified polyvinyl alcohol obtained by grafting a side chain made of other polymer to a main chain of polyvinyl alcohol or grafting a branch of polyvinyl acetate with other polymer as a main chain followed by saponifying.

Among these, (1) a modified polyvinyl alcohol copolymer and (2) modified polyvinyl alcohol due to a polymerization reaction are preferred.

The denaturing degree is preferred for a ratio of number of moles of vinyl alcohol units:number of moles of denatured units to be 99:1 to 0:100, more preferred to be 97:3 to 30:70 and particularly preferred to be 95:5 to 50:50.

Furthermore, a compound (b') represented by the formula (1) and a compound (b") represented by the formula (2) are preferably highly hydrophobic.

Specifically, in the case of a compound represented by the formula (1), a total number of carbon atoms of $R^1$, $R^2$ and $R^3$ and a total number of carbon atoms of $R^4$, $R^5$ and $R^6$, respectively and independently, are preferably in a range of 5 to 50, more preferably in a range of 6 to 45 and still more preferably in a range of 7 to 30.

Furthermore, in the case of a compound represented by the formula (2), a total number of carbon atoms of $R^7$ and $R^8$ and a total number of carbon atoms of $R^9$ and $R^{10}$, respectively and independently, are preferably in a range of 1 to 43, more preferably in a range of 2 to 38 and still more preferably in a range of 3 to 23.

Among these, a compound (b') represented by the formula (1) and a compound (b") represented by the formula (2) preferably have structures shown below.

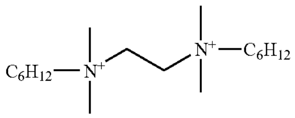

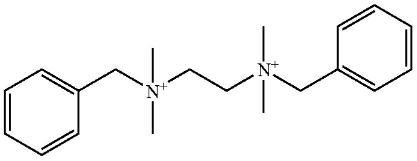

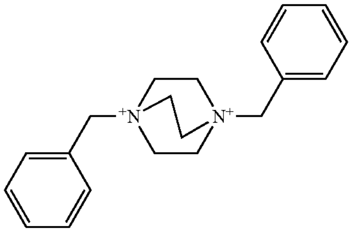

-continued

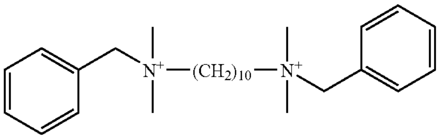

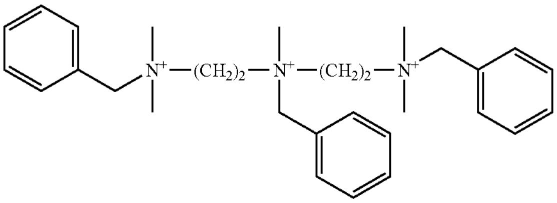

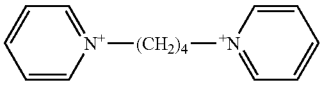

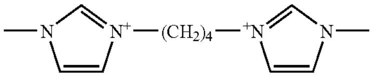

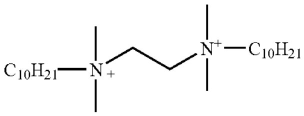

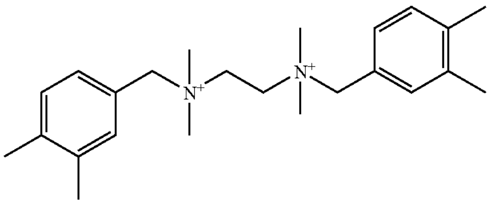

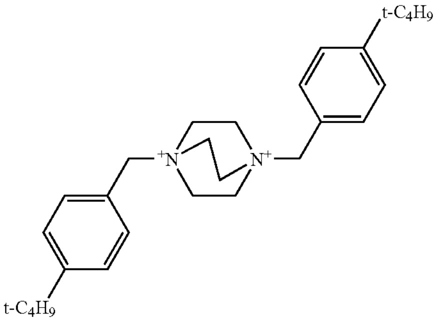

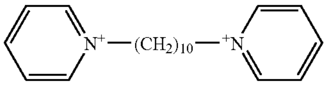

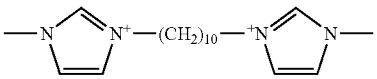

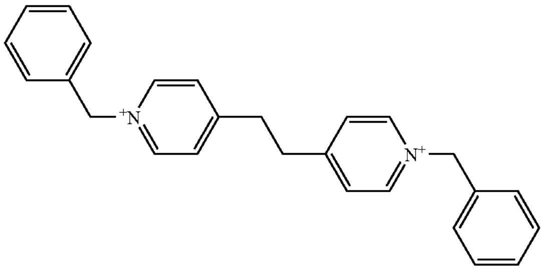

As specific examples of specific crosslinked bodies in the invention (including novel compounds of the invention), combinations of an ionically crosslinkable polymer (a) and an ionic crosslinking agent (b), which are used in the synthesis, will be shown below. However, the invention is not restricted thereto.

In specific examples below, a reaction ratio of anionic groups or cationic groups of an ionically crosslinkable polymer and anionic portions or cationic portions of an ionic crosslinking agent is 1:1 (by molar ratio).

TABLE 1

| Compound No. | Ionically crosslinlable polymer (a) (average molecular weight) | Ionic crosslinking agent (b) |
| --- | --- | --- |
| 1-1 | 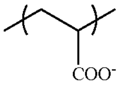 (25000) | 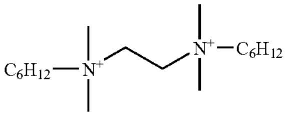 |
| 1-2 | 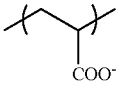 (25000) | 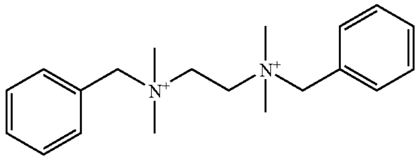 |
| 1-3 | 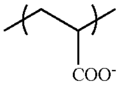 (25000) | 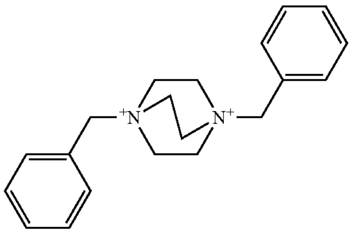 |
| 1-4 | 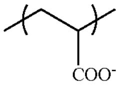 (25000) | 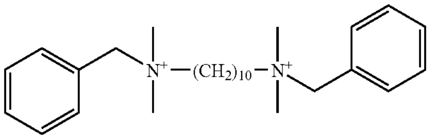 |
| 1-5 | 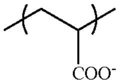 (25000) | 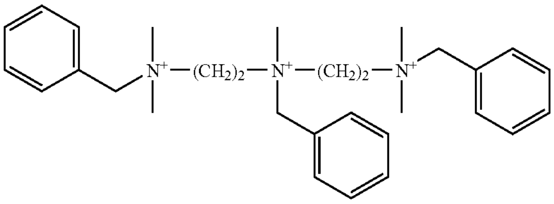 |
| 1-6 | 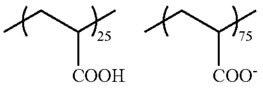 (25000) | 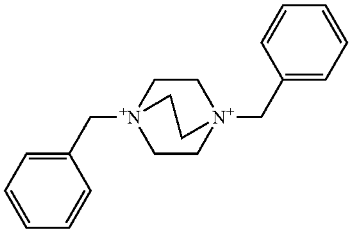 |

TABLE 2

| Compound No. | Ionically crosslinlable polymer (a) (average molecular weight) | Ionic crosslinking agent (b) |
| --- | --- | --- |
| 2-1 | Anion polymer of KL-506 (trade name, produced by Kuraray Co., Ltd.) | 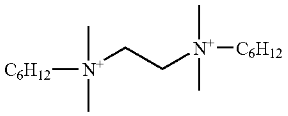 |
| 2-2 | Anion polymer of KL-506 (trade name, produced by Kuraray Co., Ltd.) | 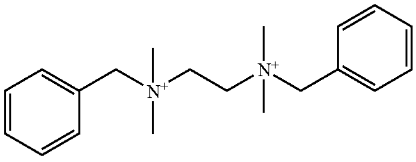 |
| 2-3 | Anion polymer of KL-506 (trade name, produced by Kuraray Co., Ltd.) | 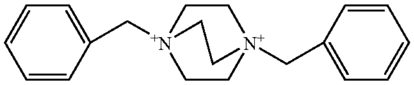 |
| 2-4 | Anion polymer of KL-506 (trade name, produced by Kuraray Co., Ltd.) | 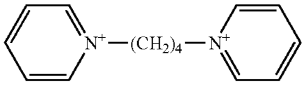 |
| 2-5 | Anion polymer of KL-506 (trade name, produced by Kuraray Co., Ltd.) | 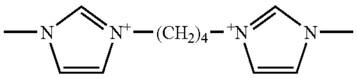 |
| 2-6 | Anion polymer of KL-506 (trade name, produced by Kuraray Co., Ltd.) | 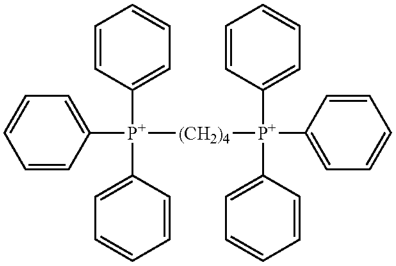 |
| 2-7 | Anion polymer of KL-118 (trade name, produced by Kuraray Co., Ltd.) | 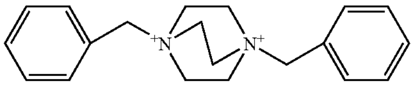 |
| 2-8 | Anion polymer of KL-118 (trade name, produced by Kuraray Co., Ltd.) | 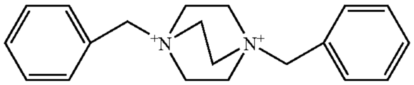 |
| 2-9 | 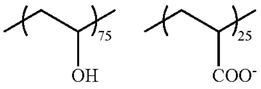 (80000) | 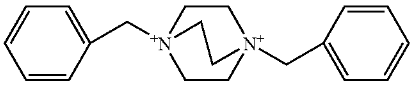 |
| 2-10 | 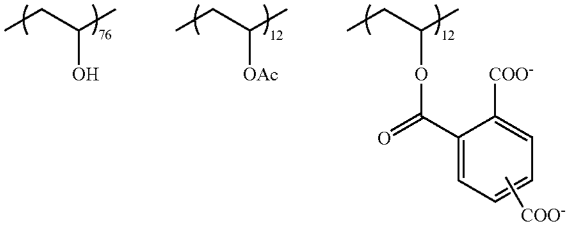 (25000) | 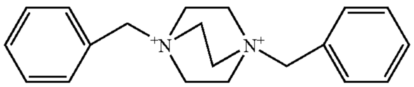 |

TABLE 2-continued
| Compound No. | Ionically crosslinlable polymer (a) (average molecular weight) | Ionic crosslinking agent (b) |
|---|---|---|
| 2-11 | 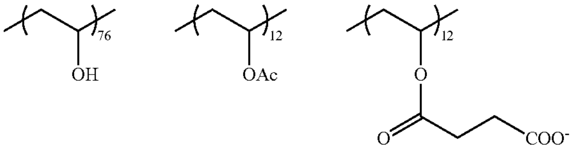 (25000) | 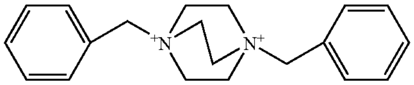 |
TABLE 3
| Compound No. | Ionically crosslinlable polymer (a) (average molecular weight) | Ionic crosslinking agent (b) |
|---|---|---|
| 3-1 | 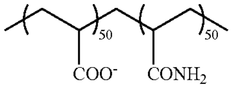 (100000) | 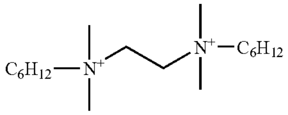 |
| 3-2 | 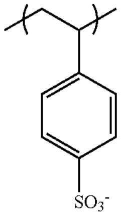 (70000) | 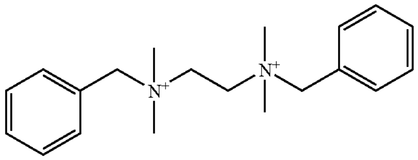 |
| 3-3 | 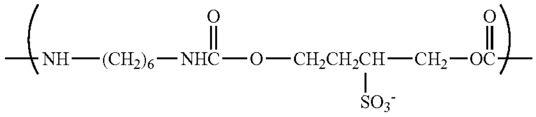 (120000) | 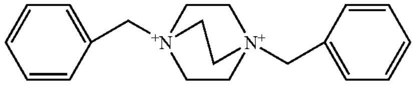 |
| 3-4 | 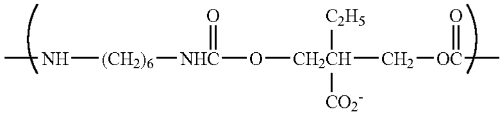 (120000) | 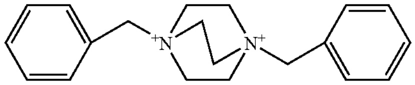 |
| 3-5 | 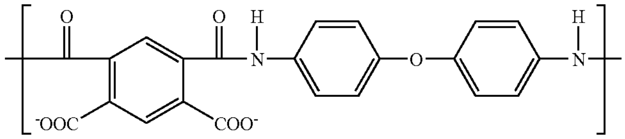 (22000) | 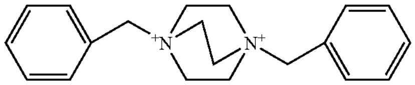 |
| 3-6 | 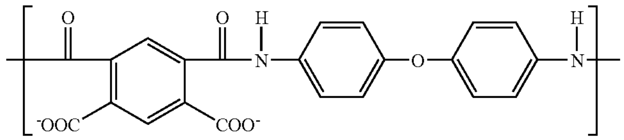 (22000) | 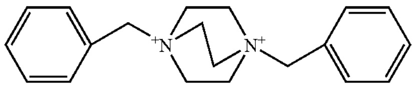 |

TABLE 4

| Compound No. | Ionically crosslinlable polymer (a) (average molecular weight) | Ionic crosslinking agent (b) |
|---|---|---|
| 4-1 | 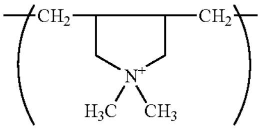 (150000) | $-(CH_2CH_2COO^-)_2$ |
| 4-2 | 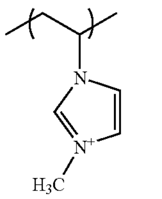 (30000) | $-(CH_2CH_2COO^-)_2$ |
| 4-3 | 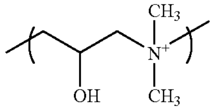 (180000) | 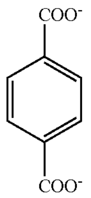 |
| 4-4 | C-506 (trade name, produced by Kuraray Co., Ltd.) (Cationic denatured PVA) | 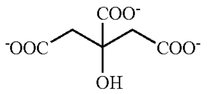 |

Synthesis Method and Synthesis Example of Specific Crosslinked Polymer (Including Novel Compound)

Synthesis Method

A specific crosslinked polymer in the invention can be readily synthesized through a neutralization reaction due to an ionic crosslinking agent (such as a base such as a salt of polyammonium hydroxide) of an ionically crosslinkable polymer such as shown below or an ion exchange reaction (salt exchange reaction) such as shown below between a salt of an ionically crosslinkable polymer and an ionic crosslinking agent.

Concerning a reaction ratio of an ionically crosslinkable polymer and an ionic crosslinking agent, to anionic groups or cationic groups (such as acid group) of an ionically crosslinkable polymer, cationic portions or anionic portions (such as onium atom portions) of an anionic crosslinking agent is preferably in a range of 1:0.5 to 1:1 (by molar ratio) and more preferably 1:1.

Neutralization reaction

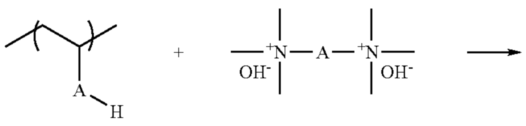

-continued

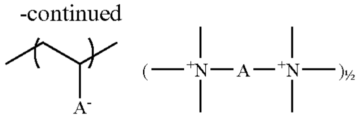

Salt exchange reaction

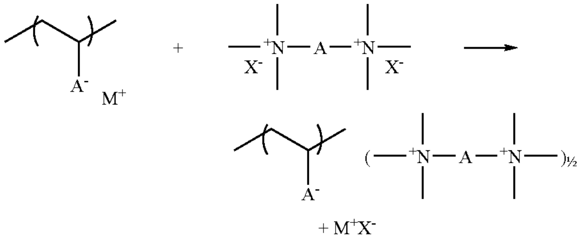

Synthesis Example 1

Synthesis of Compound 1-2

Firstly, a divalent ammonium salt 1 (7.39 g, 20.0 mmol) having a structure below was dissolved in 40 ml of water. To a solution, under ice cooling, silver oxide (I) (9.3 g, 40.0 mmol) was added, followed by agitating for 2 hr at room temperature. After the reaction, a solid content was filtered with a filter. To an obtained filtrate, an aqueous solution of 2.9 g of polyacrylic acid (molecular weight: 25000)/30 ml of water was dropped. A reaction solution was distilled under reduced pressure to remove a solvent, followed by dissolving a residue in 20 ml of methanol. A methanol solution of a polymer was dropped in 100 ml of ethyl acetate, followed by filtering a precipitate, further followed by drying, and thereby 6.5 g of a compound 1-2 was obtained.

A structure of the obtained compound 1-2 was confirmed by means of NMR. 1H NMR ($D_2O$, δ ppm): 1.35-1.75 (m, alkyl protons), 1.90-2.25 (m, alkyl protons), 3.20 (s, $N—CH_3$), 4.01 (s, $N—CH_2$), 4.65 (s, $NCH_2Ph$), 7.57-7.58 (m, Ph)

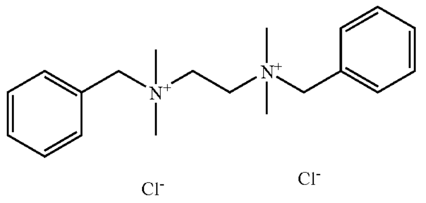

Ammonium salt 1

Synthesis Example 1

Synthesis of Compound 2-11

(Succinic Anhydride-Modified Polyvinyl Alcohol)

In 280 ml of dimethyl sulfoxide, 28 g of polyvinyl alcohol (trade name: PVA-205, produced by Kuraray Co., Ltd.) was dissolved, followed by agitating under nitrogen flow. To a solution, 45.3 ml of triethylamine and 1 g of dimethylaminopyridine were added. Thereto, 25.0 g of succinic anhydride was slowly added. The mixture was agitated at room temperature for 3 hr, followed by adding an aqueous solution of 1% hydrochloric acid. A generated precipitate was filtered, washed with water and dried. According to a neutralization titration, succinic anhydride-modified polyvinyl alcohol A having the acid value of 3.0 meq/g was obtained.

Then, a divalent ammonium salt 2 (4.54 g, 10.0 mmol) having a structure below was dissolved in 30 ml of water. To a solution, under ice cooling, silver oxide (I) (4.6 g, 20.0 mmol) was added, followed by agitating for 2 hr at room temperature. After the reaction, a solid content was filtered with a filter. To an obtained filtrate, an aqueous solution of 6.7 g of above-obtained succinic anhydride-modified polyvinyl alcohol A/60 ml of water was dropped. A reaction solution was distilled under reduced pressure to remove a solvent, followed by dissolving a residue in 20 ml of methanol. A methanol solution of a polymer was dropped in 100 ml of ethyl acetate, followed by filtering a precipitate, further followed by drying, and thereby 8.1 g of a compound 2-11 was obtained.

A structure of the obtained compound 2-11 was confirmed by means of NMR. 1H NMR (d-DMSO, δ ppm): 1.2-2.2 (m, alkyl protons), 3.3-3.89 (m, O—$CH_2$), 4.0 (s, N—$CH_2$), 4.80 (s, N—$CH_2$Ph), 7.57-7.60 (m, Ph)

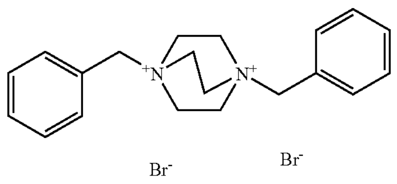

Ammonium salt 2

A content of a specific crosslinked polymer in a solid content of a specific protective layer in the invention is, from the viewpoints of the mechanical strength, the developability and the oxygen impermeability, preferably in a range of 30 to 100% by weight, more preferably in a range of 50 to 100% by weight and most preferably in a range of 70 to 100% by weight.

[Other Polymer]

In the specific protective layer in the invention, other than the specific crosslinked polymer, other water-soluble polymer may be used together. As the other water-soluble polymer, a water-soluble polymer that does not have a crosslinked structure is preferred and a water-soluble polymer relatively excellent in the crystallinity is more preferably used. Specific examples thereof preferably include non-ionic water-soluble polymers such as polyvinyl alcohol, polyvinyl pyrrolidone and polyacrylic acid. Furthermore, gelatin and gum arabic may be used as well. The water-soluble polymers may be used singularly or in a combination of at least two kinds thereof. Among these, from the viewpoints of imparting excellent results to fundamental characteristics such as the oxygen impermeability and development removability of the specific protective layer, polyvinyl alcohol can be particularly preferable for use.

As polyvinyl alcohols as other water-soluble polymer like this, commercially available ones as well are useful. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (trade name, produced by Kuraray Co., Ltd.).

The polyvinyl alcohol used in the specific protective layer in the invention, as far as it contains unsubstituted vinyl alcohol units enough for developing necessary oxygen impermeability and the water-solubility, may be used together with one partially substituted by ester, ether or acetal. Furthermore, similarly, a copolymer partially containing a repetition unit other than a vinyl alcohol unit may be used.

As a copolymer containing an unsubstituted vinyl alcohol unit and other repetition unit, 88 to 100%-hydrolyzed polyvinyl acetate chloroacetate or propionate, polyvinyl formal, polyvinyl acetal and copolymers thereof can be cited.

Furthermore, as polyvinyl alcohol preferably used in the specific protective layer, ones having the saponification degree in a range of 71 to 100% by mole and a molecular weight in a range of 200 to 2400 can be cited. From the viewpoints of having excellent oxygen impermeability and excellent film-forming property and low adhesive surface, polyvinyl alcohols having the saponification degree of 91% by mole or more can be preferably used.

Specific examples of such polyvinyl alcohols having the saponification degree of 91% by mole or more include PVA-102, PVA-103, PVA-104, PVA-105, PVA-110, PVA-117, PVA-120, PVA-124, PVA-117H, PVA-135H, PVA-HC, PVA-617, PVA-624, PVA-706, PVA-613, PVA-CS and PVA-CST (trade name, produced by Kuraray Co. Ltd.); Gohsenol NL-05, NM-11, NM-14, AL-06, P-610, C-500, A-300 and AH-17 (trade name, produced by Nippon Synthetic Chemical Industry Co., Ltd.); and JF-04, JF-05, JF-10, JF-17, JF-17L, JM-05, JM-10, JM-17, JM-17L, JT-05, JT-13 and JT-15 (trade name, produced by JAPAN VAM & POVAL Co., Ltd.).

Furthermore, from the viewpoints of the adhesive force with an image recording layer, the sensitivity and prevention of generation of unnecessary fogging, as the other water-soluble polymer used in the specific protective layer, polyvinyl alcohol and polyvinyl pyrrolidone may be used together. At this time, an addition amount ratio (by mass ratio) of 91% by mole or more hydrolyzed polyvinyl alcohol/polyvinyl pyrrolidone is preferably 3/1 or less. Furthermore, other than polyvinyl pyrrolidone, polyacrylic acid and copolymers thereof relatively excellent in the crystallinity may be used together with polyvinyl alcohol.

When the specific protective layer includes other water-soluble polymer, from the viewpoints of preventing the sensitivity decreasing of an obtained image recording material and suppressing scratches during handling, the other water-soluble polymer is preferably contained to a total polymer amount in a range of 30 to 70% by mass.

Even in the case a plurality of kinds of water-soluble polymers being used together, a total amount thereof is preferably in the above-mentioned mass range.

[Filler]

In the specific protective layer in the invention, in addition to the specific crosslinked polymer and the other polymer, filler may be preferably contained. When the filler is added, the scratchscratch resistance of a surface of the specific protective layer can be improved. As the result, when an image recording material of the invention is applied in a lithographic printing plate precursor, without interposing an interleaf between plates, a stacked body can be formed.

As the filler, any one of organic filler, inorganic filler, inorganic-organic filler and combinations of at least two kinds thereof may be used. Preferably, the organic filler and inorganic filler are used together.

A shape of the filler is appropriately selected depending on an object. Examples thereof include a fiber shape, a needle shape, a planar shape, a sphere shape, a particulate shape (here, the "particulate shape" indicates an "amorphous particle" and hereinafter in the specification it is used in the same meaning), a tetra-pot shape and a balloon shape. Among these, a planar shape, a sphere shape and a particulate shape are preferred.

As the organic filler, for instance, synthetic resin particles and natural polymer particles can be cited. Preferred examples thereof include resin particles of an acrylic resin, polyethylene, polypropylene, polyethylene oxide, polypropylene oxide, polyethylene imine, polystyrene, polyurethane, polyurea, polyester, polyamide, polyimide, carboxymethyl cellulose, gelatin, starch and xanthone. More preferably, resin particles of an acrylic resin, polyethylene, polypropylene or polystyrene are cited.

Specific examples of commercially available fillers suitable as the organic filler that is added to the specific protective layer include: Chemipearl W100, W200, W300, W308, W310, W400, W401, W4005, W410, W500, WF640, W700, W800, W900, W950 and WP100 (trade name, produced by Mitsui Chemicals, Inc.); MX-150, MX-180, MX-300, MX-500, MX-1000, MX-1500H, MX-2000, MR-2HG, MR-7HG, MR-1OHG, MR-3GSN, MR-5GSN, MR-2G, MR-7G, MR-10G, MR-20G, MR-5C, MR-7GC, SX-130H, SX-350H, SX-500H, SGP-50C and SGP-70C (trade name, produced by Soken Chemical & Engineering Co., Ltd.); and MBX-5, MBX-8, MBX-12, MBX-15, MBX-20, MB20X-5, MB30X-5, MB30X-8, MB30X-20, SBX-6, SBX-8, SBX-12 and SBX-17 (trade name, produced by Sekisui Plastics Co., Ltd.).

The particle-size distribution may be any one of monodisperse and polydisperse and is preferably monodisperse. As to the magnitude of the filler, the average particle diameter is preferably in a range of 1 to 20 μm, more preferably in a range of 2 to 15 μm, and still more preferably in a range of 3 to 10 μm. Within these ranges, advantages of the addition of the filler can be exerted more effectively.

The content of the organic filler is preferably in a range of 0.1 to 20% by mass, more preferably in a range of 1 to 15% by mass and still more preferably in a range of 2 to 10% by mass based on the total solid content of the specific protective layer.

Examples of the inorganic fillers include metals and metal compounds such as oxides, composite oxides, hydroxides, carbonates, sulfates, silicates, phosphates, nitrides, carbides and sulfides and composite compounds of at least two kinds thereof. Specific examples include mica compounds, glass, zinc oxide, alumina, zirconium oxide, tin oxide, potassium titanate, strontium titanate, aluminum borate, magnesium oxide, magnesium borate, aluminum hydroxide, magnesium hydroxide, calcium hydroxide, titanium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide, zinc sulfide and complexes of at least two kinds thereof.

Preferable examples thereof include mica compounds, glass, alumina, potassium titanate, strontium titanate, aluminum borate, magnesium oxide, calcium carbonate, magnesium carbonate, calcium silicate, magnesium silicate, calcium phosphate and calcium sulfate.

Among these, as one particularly preferable in the specific protective layer, mica compounds can be cited. Inorganic layered compounds typical in the mica compounds will be detailed below.

—Inorganic Layered Compound—

The specific protective layer according to the invention preferably contains an inorganic layered compound. When the inorganic layered compound is used together, oxygen impermeability can be further improved, the mechanical strength of the specific protective layer can be further improved to improve the scratchscratch resistance, and matting property as well can be imparted to the specific protective layer.

As the result, in addition to the improvement of the oxygen impermeability, the specific protective layer, prevented deterioration due to deformation and scratches. Furthermore, by imparting the matting property to the specific protective layer, in the case of an image recording material of the invention being applied to a lithographic printing plate precursor, even when the precursors are stacked without interposing an interleaf, a surface of the specific protective layer can be prevented from adhering to a back surface of a support of a lithographic printing plate precursor adjacent thereto.

Examples of the inorganic layered compounds include mica compounds such as a natural mica and a synthetic mica represented by, for example, a formula: $A(B, C)_2$-$5D_4O_{10}$ $(OH, F, 0)_2$ [Here, A is any one of K, Na or Ca; each of B and C, any one of Fe(II), Fe(III), Mn, Al, Mg and V; and D, Si or Al.]

Examples of natural mica compounds include white mica, paragonite, bronze mica, black mica and flaky mica. Examples of synthetic mica compounds include non-swelling mica such as fluorine bronze mica $KMg_3$ $(AlSi_3O_{10})F_2$ and potassium tetrasilicate mica $KMg_{2.5}$ $(Si_4O_{10})F_2$ and swelling mica such as Na tetrasilyric mica $NaMg_{2.5}$ $(Si_4O_{10})$ $F_2$, Na or Li teniolite (Na, Li) $Mg_2Li$ $(Si_4O_{10})F_2$, montmorillonite type Na or Li hectorite $(Na, Li)_{1/8}Ng_{2/5}Li_{1/8}(Si_4O_{10})$ $F_2$. Synthetic smectite is also useful.

Among the mica compounds described above, fluorine-based swelling mica is particularly useful. That is, the swelling synthetic mica has a layered structure made of unit crystal lattice layers having a thickness of substantially 10 to 15 Å and is remarkably larger in intra-lattice metal atom substitution than in other clay minerals. As the result, the lattice layers are deficient in positive charges and, in order to compensate the deficiency, cations such as $Na^+$, $Ca^{2+}$ or $Mg^{2+}$ are absorbed between the layers. Cations that are present between the layers are called exchangeable cations and are exchanged with various cations. In particular, when cations between the layers are $Li^+$ or $Na^+$, the ion radius thereof is small and the bonding between the layered crystal lattices is weak, thus great swelling is caused in the presence of water. When shearing force is applied in this state, the layered structure is easily cleaved to form stable sol in water. The swelling synthetic mica is strong in the tendency and useful in the embodiment; accordingly, the swelling synthetic mica is particularly preferably used.

The mica compound has a plate shape. The thickness of the compound is preferably smaller from the viewpoint of diffusion control, and the size of the plate is preferably larger as long as it does not impair the smoothness of the coated surface and permeability of active lights. Accordingly, the aspect ratio is 20 or more, preferably 100 or more, and most preferably 200 or more. The aspect ratio is a ratio of the thickness to major axis of a particle, and is measured from, for example, a microphotographic projection view of the particle. The higher the aspect ratio, the higher effect is achieved.

The particle diameter of the mica compound may be 0.3 to 20 μm, preferably 0.5 to 10 μm, in terms of the average length of the major axis. The average thickness of the particles may be 0.1 μm or less, preferably 0.05 μm or less, more preferably 0.01 μm or less. Specifically, the size of the swelling synthetic mica as a typical compound has a thickness of from 1 to 50 nm and a major axis length (plane size) of from about 1 to about 20 μm An amount of the inorganic layered compound contained in the specific protective layer is, from the viewpoints of imparting the matting property and of preventing scratches, the sensitivity decreasing due to exposure shielding and oxygen penetration, preferably in a range of 5 to 50% by mass and more preferably in a range of 10 to 40% by mass based on the total solid content of the specific protective layer. Even when a plurality of kinds of inorganic layered compounds is used together, a total amount of the inorganic layered compounds is preferably the above mass.

Similarly, an amount of inorganic filler other than the inorganic layered compound contained in the specific protective layer is preferably in a range of 5 to 50% by mass and more preferably in a range of 10 to 40% by mass based on the total solid content of the specific protective layer.

In the specific protective layer, a mixture of organic filler and inorganic filler can also be used, and a mixing ratio thereof by weight is preferably in a range of organic filler: inorganic filler=1:1 to 1:5. The content in the specific protective layer at this time is, in terms of a total amount of the inorganic filler and organic filler, relative to a total solid amount of the specific protective layer, preferably in a range of 5 to 50% by mass and more preferably in a range of 10 to 40% by mass.

Furthermore, as the filler added to the specific protective layer in the invention, inorganic-organic composite filler can also be used. As the inorganic-organic composite filler, for instance, a composite of the organic filler and inorganic filler can be cited. Examples of the inorganic fillers that can form a composite include metal powder and particles of metal compounds (such as oxides, nitrides, sulfides, carbides and composites thereof), particles of oxides and sulfides being preferably cited and particles of glass, $SiO_2$, ZnO, $Fe_2O_3$, $ZrO_2$, $SnO_2$, ZnS and CuS being more preferably cited.

A content of the inorganic-organic composite filler in the specific protective layer is preferably in a range of 5 to 50% by mass and more preferably in a range of 10 to 40% by mass based on the total solid content of the specific protective layer.

The components in the specific protective layer (such as specific crosslinked polymer, other water-soluble polymer and the filler) and a coating amount are selected in consideration of, in addition to the oxygen impermeability and the development removability, fogging, adhesiveness and scratch resistance.

In the invention, the specific protective layer is, without restricting to a single layer, disposed in a multilayer structure made of a plurality of specific protective layers having different compositions from each other. As a preferable embodiment of the multilayer specific protective layer, a mode where, on a side close to an image recording layer, a specific protective layer containing an inorganic layered compound is disposed as a lower specific protective layer, and, on a surface thereof, a specific protective layer containing a filler is sequentially stacked as an upper specific protective layer can be cited.

When a specific protective layer having such a stacked structure is disposed, while taking full advantage of the scratch resistance and anti-adhesion property attributable to the filler in the uppermost specific protective layer, in combination with excellent oxygen impermeability of the lower specific protective layer, thereby, image defect attributable to any one of flaw generation and undesired oxygen permeation can be effectively prevented.

The oxygen permeability of the specific protective layer in the invention is preferably 0.5 ml/$m^2$·day or more and 100 ml/$m^2$·day or less at 25° C. and 1 atmospheric pressure and it is preferable to control the coating amount to attain such oxygen permeability.

In the specific protective layer, a colorant (water-soluble dye) excellent in the transmittance to light used when a recording layer is exposed and capable of efficiently absorbing light of a wavelength that does not participate in exposure may be added. Thereby, safelight aptitude can be improved without lowering the sensitivity.

[Formation of Specific Protective Layer]

A method of forming a specific protective layer in the invention is not particularly restricted and can be carried out by coating a specific protective layer forming coating solution containing the components on an image recording layer detailed below. For instance, methods described in U.S. Pat. No. 3,458,311 or JP-A No. 55-49729 as well can be applied.

In a specific protective layer forming coating solution in the invention, known additives such as a surfactant for improving the coating property and a water-soluble plasticizer for improving the physical properties of an obtained film may be added. Examples of the water-soluble plasticizers include propionamide, cyclohexanediol, glycerin and sorbitol. Furthermore, water-soluble (meth)acrylic polymer can be added as well. Still furthermore, to the coating solution, in order to improve the adhesiveness with an image recording layer and the stability with time of the coating solution, known additives may be added.

In what follows, a method of forming a specific protective layer containing the specific crosslinked polymer, the filler (including the inorganic layered compound such as mica compounds) and other water-soluble polymer compound such as polyvinyl alcohol will be described in detail.

In the beginning, a dispersion liquid in which the filler is dispersed is prepared, then the dispersion liquid is mixed with the specific crosslinked polymer (or an aqueous solution in which the specific crosslinked polymer is dissolved or dispersed) and other water-soluble polymer compound such as polyvinyl alcohol (or an aqueous solution in which other water-soluble polymer is dissolved) to prepare a specific protective layer forming coating solution, and the specific protective layer forming coating solution is coated on the image recording layer to form a specific protective layer.

An example of a dispersing method when an inorganic layered compound such as a mica compound is dispersed as the filler in the specific protective layer will be described. First, 5 to 10 parts by mass of the swelling mica compound mentioned above as a preferable mica compound is added to 100 parts by mass of water, followed by sufficiently leaving to reach a stable state to swell, further followed by applying a dispersing device to disperse.

Examples of the dispersing devices used here include various kinds of mills that mechanically apply direct force to disperse, high-speed stirring dispersing devices having large shear force and dispersing devices giving high-intensity ultrasonic energy. Specific examples thereof include a ball mill, a sand grinder mill, a viscomill, a colloid mill, a homogenizer, a dissolver, a Polytron, a homomixer, a homoblender, a Keddy mill, a jet agitator, a capillary emulsifier, a liquid siren, an electromagnetic strain ultrasonic generator and an emulsifier having a Poleman whistle.

In general, 2 to 15% by mass dispersion of the mica compound dispersed by the method described above is highly viscous or gelled and extremely excellent in storage stability. When the dispersion is used to prepare a specific protective layer forming coating solution, the dispersion is diluted with water, followed by sufficiently agitating, further followed by mixing with the specific crosslinked polymer and other water-soluble polymer compound such as polyvinyl alcohol (or an aqueous solution thereof).

In the invention, from the viewpoints of the film strength and scratch resistance of the resultant specific protective layer, maintenance of image quality and maintenance of suitable oxygen permeability for imparting safelight aptitude, a coating amount of the specific protective layer is preferably in a range of 0.1 to 4.0 g/$m^2$ and more preferably in a range of 0.3 to 3.0 g/$m^2$.

Furthermore, a film thickness of the specific protective layer is preferably in a range of 0.1 to 5 μm and particularly preferably in a range of 0.2 to 2 μm.

In the specific protective layer, the adhesiveness with an image portion of an image recording layer and the uniformity of the film as well are very important characteristics. That is, when a hydrophilic specific protective layer containing the specific crosslinked polymer is stacked on a lipophilic image recording layer, the film peeling due to insufficient adhesiveness tends to occur and the peeled portion causes defects such as the film curing defect of the film due to polymerization hindrance of oxygen. Concerning this, various proposals have been submitted to improve the adhesiveness between the two layers. For instance, U.S. Pat. Application Nos. 292,501 and 44,563 disclose that when, in a hydrophilic polymer mainly made of polyvinyl alcohol, 20 to 60% by mass of acrylic emulsion or a water-insoluble vinyl pyrrolidone-vinyl acetate copolymer is mixed, followed by laminating on an image recording layer, sufficient adhesiveness can be obtained. All known technologies that can improve the adhesiveness between the image recording layer and a hydrophilic layer such as the specific protective layer can be applied when an image recording material of the invention or a lithographic printing plate precursor obtained by applying the image recording material is prepared.

An image recording material of the invention may have, other than the specific protective layer, a protective layer that does not contain the specific crosslinked polymer. As the protective layer that does not contain the specific crosslinked polymer, a protective layer that contains other water-soluble polymer and filler such as described above and has the oxygen impermeability is preferred.

<Image Recording Layer>

An image recording material of the invention has an image recording layer containing a compound (A) having at least one ethylenically unsaturated bond and a polymerization initiator (B) on a support and, on a surface thereof, directly or through an appropriate adhesiveness improvement layer, the specific protective layer is formed.

The image recording layer preferably further contains, from the viewpoint of film-forming property, a binder polymer (C) and, from the viewpoint of the sensitivity, a dye (D) having the absorption maxima in a range of 300 to 1200 nm.

In the image recording layer, due to energy of light, heat or both thereof, the (B) polymerization initiator generates an initiating species such as a radical, and, due to the initiating species, a coexisting compound (A) having at least one ethylenically unsaturated bond polymerizes to cure only a region thereto energy is imparted. Thereafter, owing to subsequent alkali development, an image recording layer in an un-cured region is speedily developed and removed to form an image.

In what follows, respective constituents of an image recording layer will be described.

[Compound (A) Having at Least One Ethylenically Unsaturated Bond]

An image recording layer in an image recording material of the invention contains a compound (A) having at least one ethylenically unsaturated bond (hereinafter, appropriately referred to as a polymerizable compound).

A polymerizable compound used in the invention is preferably a compound having a terminal ethylenically unsaturated bond and more preferably a compound having at least two terminal ethylenically unsaturated bonds. Such a compound group is widely known in the industrial field and, in the invention, the compounds may be used without particular restriction. These include ones having chemical forms such as a monomer, a prepolymer, namely, a dimmer, a trimer and an oligomer, or a mixture thereof as well as a copolymer thereof.

Examples of monomers and copolymers thereof include unsaturated carboxylic acids (such as acrylic acid, methacrylic acid, itaconic acid, crotonic acid, isocrotonic acid and maleic acid), esters and amides thereof, esters between an unsaturated carboxylic acid and an aliphatic polyhydric alcohol compound and amides between an unsaturated carboxylic acid and an aliphatic polyvalent amine compound being preferably used. Addition reaction products of an unsaturated carboxylic acid ester or amide having a nucleophilic substituent group such as a hydroxy group, an amino group or a mercapto group with a monofunctional or polyfunctional isocyanate or epoxy, or dehydration condensation reaction products of the unsaturated carboxylic acid ester or amide with a monofunctional or polyfunctional carboxylic acid as well are preferably used.

Also preferably used among these compounds are unsaturated carboxylic esters having an electrophilic substituent such as an isocyanate group or an epoxy group, addition-reaction products of amides with monofunctional or multifunctional alcohols, amines or thiols, unsaturated carboxylic esters having an eliminating substituent such as a halogen group and a tosyloxy group, and substitution-reaction products of amides with monofunctional or multifunctional alcohols, amines or thiols. Compounds obtained by replacing the above-described carboxylic acids with unsaturated phosphonic acids, styrene, vinyl ethers etc.

Examples of the ester monomers between aliphatic polyvalent alcohols and unsaturated carboxylic acids include:

acrylic esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethyl methane, and bis[p-(methacryloxyethoxy)phenyl]dimethyl methane;

itaconic esters such as ethylene glycol diitaconate, propylene glycol diitaconate, 1,3-butane diol diitaconate, 1,4-butane diol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of preferable esters include aliphatic alcohol-based esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613.

In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Preferable examples of other amide-containing monomers include those having a cyclohexylene structure described in JP-B No. 54-21726.

Urethane-containing addition-polymerizable compounds produced by addition reaction between isocyanates and hydroxyl groups are also preferable, and examples thereof include a vinyl urethane compound containing two or more polymerizable vinyl groups in one molecule which is prepared by adding a vinyl monomer containing a hydroxyl group shown in the formula below to a polyisocyanate compound having two or more isocyanate groups in one molecule as described in JP-B No. 48-41708.

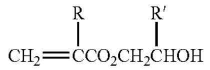

In the above formula, R and R' each independently represent H or $CH_3$.

Urethane acrylates described in JP-A No. 51-37193, JP-B No. 2-32293 and JP-B No. 2-16765 and urethane compounds having an ethylene oxide-based skeleton described in JP-B No. 58-49860, JP-B No. 56-17654, JP-B No. 62-39417 and JP-B No. 62-39418 are also preferable.

Addition-polymerizable compounds having an amino structure or sulfide structure in the molecule as described in JP-A No. 63-277653, JP-A No. 63-260909 and JP-A No. 1-105238 can be used to prepare heat-sensitive compositions excellent in curing speed.

As other examples, multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490, can be mentioned. Specific unsaturated compounds described in JP-B No. 46-43946, JP-B No. 1-40337 and JP-B No. 1-40336 and vinyl phosphonic acid-based compounds described in JP-A No. 2-25493 can also be mentioned. In some cases, a structure containing a perfluoroalkyl group described in JP-A No. 61-22048 is preferably used. Photosetting monomers and oligomers described in the Journal of Japanese Adhesive Society, vol. 20, No. 7, pp. 300-308 (1984) can also be used.

Details of the use of the polymerizable compounds—what structure is used, whether they are used singly or in combination, and the addition amount—can be arbitrarily determined in accordance with the performance and design of the final photosensitive material. For example, they are selected from the following viewpoints. In respect of photo response speed, their structure preferably has a high unsaturated group content per one molecule, and in many cases, they are preferably bifunctional or higher-functional. To increase the strength of an image portion i.e. the cured layer, they are preferably trifunctional or higher-functional. It is also effective to use a method of regulating both photosensitivity and strength by combined use of compounds (e.g. acrylic esters, methacrylic esters, styrene-containing compounds, and vinyl ether-containing compounds) having different functionalities and different polymerizable groups. Compounds having a higher molecular weight or compounds with higher hydrophobicity, though being excellent in photoresponse speed and layer strength, may be undesirable in some cases in respect of developing speed and precipitation in the developer.

A higher content of the polymerizable compound (A) is advantageous in respect of sensitivity. However, when the content is excessively high, there may be problems in undesirable phase separation, troubles in production process caused by the adhesiveness of the composition (e.g., defects in production process caused by transfer and adhesion of components in the photosensitive component), and separation from the developer when used in a planographic printing plate precursor.

From these viewpoints, the content of the polymerizable compound (A) in the polymerizable composition according to the invention or in the recording layer of the planographic printing plate precursor is preferably in a range of 20 to 70% by weight, more preferably 25 to 50% by weight, based on the total solid content.

In an embodiment, only one polymerizable compound (B) is used. In another embodiment, two or more polymerizable compounds (B) are used.

[Polymerization Initiator (B)]

As a polymerization initiator (B) used in the invention, a compound that generates a radical due to light, heat or both thereof is preferred, and, specifically, known radical generators can be cited. As a radical generator that can be used in the invention, known thermal polymerization initiators, compounds having a bond small in the bond dissociation energy and photopolymerization initiators can be used. A compound that generates a radical and can be preferably used in the invention indicates a compound that generates a radical owing to heat energy to start and accelerate a polymerization reaction of a compound having polymerizable unsaturated groups.

Polymerization initiators that generate a radical owing to energy impartment may be used singularly or in a combination of at least two kids thereof in an image recording layer.

Examples of the radical generator include organic halogenated compounds (a), carbonyl compounds (b), organic peroxide compounds (c), azo-based polymerization initiators (d), azido compounds (e), metallocene compounds (f), hexaarylbiimidazol compounds (g), organic boric acid compounds (h), disulfon compounds (i), oxime ester compounds (j), and onium salt compounds (k).

These compounds will be described below.

Specific examples of the organic halogenated compounds (a) include the compounds described in, for example, Wakabayashi et al. "Bull Chem. Soc Japan" 42, 2924 (1969), U.S. Pat. No. 3,905,815, Japanese Patent Application Publication (JP-B) No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, and JP-A No. 63-298339, M. P. Hutt "Journal of Heterocyclic Chemistry" 1 (No. 3), (1970)", and particularly trihalomethyl group-substituted oxazole compounds and S-triazine compounds.

The organic halogenated compound is more preferably an s-triazine derivative wherein at least one mono, di or trihalogen-substituted methyl group is bonded to an s-triazine ring, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, etc.

Examples of the carbonyl compound (b) include benzophenone, benzophenone derivatives such as Michler's ketone, 2-methyl benzophenone, 3-methyl benzophenone, 4-methyl benzophenone, 2-chlorobenzophenone, 4-bromobenzophenone, 2-carboxybenzophenone, etc., acetophenone derivatives such as 2,2-dimethoxy-2-phenyl acetophenone, 2,2-diethoxy acetophenone, 1-hydroxycyclohexylphenyl ketone, α-hydroxy-2-methyl phenyl propane, 1-hydroxy-1-methylethyl-(p-isopropylphenyl) ketone, 1-hydroxy-1-(p-dodecylphenyl) ketone, 2-methyl-(4'-(methylthio) phenyl)-2-morpholino-1-propanone, 1,1,1-trichloromethyl-(p-butylphenyl) ketone, etc., thioxanthone, thioxanthone derivatives such as 2-ethyl thioxanthone, 2-isopropyl thioxanthone, 2-chlorothioxanthone, 2,4-dimethyl thioxanthone, 2,4-diethyl thioxanthone, 2,4-diisopropyl thioxanthone, etc., and benzoate esters such as ethyl p-dimethylaminobenzoate, ethyl p-diethylaminobenzoate, etc.

Examples of the organic peroxide compounds (c) include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy) butane, tert-butylhydroperoxide, cumenehydroperoxide, diisopropylbenzenehydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2,5-di(tert-butylperoxy)hexane, 2,5-oxanoylperoxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxyneodecanoate, tert-butylperoxy octanoate, tert-butylperoxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyldi(t-butylperoxydihydrogen diphthalate), and carbonyldi(t-hexylperoxydihydrogen diphthalate).

Example of the azo-based polymerization initiators (d) include azo compounds described in JP-A No. 8-108621.

As an azide (e) compound, a compound such as 2,6-bis(4-azidebenzilidene)-4-methylcyclohexanone can be cited.

Examples of metallocene compounds (f) include various kinds of titanocene compounds described in JP-A Nos. 59-152396, 61-151197, 63-41484, 2-249, 2-4705 and 5-83588 such as di-cyclopentadienyl-Ti-bis-phenyl, di-cyclopentadienyl-Ti-bis-2,6-difluorophenyl-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl and iron arene complexes described in JP-A Nos. 1-304453 and 1-152109.

Examples of the hexaarylbiimidazol compounds (g) include various compounds described in JP-B No. 6-29285, U.S. Pat. No. 3,479,185, U.S. Pat. No. 4,311,783, and U.S. Pat. No. 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methyl phenyl)-4,4',5,5'-tetraphenylbiimidazole, and 2,2'-bis (o-trifluorophenyl)-4,4',5,5'-tetraphenyl biimidazole.

Specific examples of the (h) organic boric aid compounds include organic borates described in, for example, JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, Japanese Patent Application No. 2000-310808, and Kunz, Martin 'Rad Tech' 98. Proceeding Apr. 19-22, 1998, Chicago", organic boron sulfonium complexes or organic boron oxosulfonium complexes described in JP-A No. 6-157623, JP-A No. 6-175564, and JP-A No. 6-175561, organic boron iodonium complexes described in JP-A No. 6-175554 and JP-A No. 6-175553, organic boron phosphonium complexes described in JP-A No. 9-188710, and organic boron transition metal coordination complexes described in JP-A No. 6-348011, JP-A No. 7-128785, JP-A No. 7-140589, JP-A No. 7-306527, and JP-A No. 7-292014.

Examples of the disulfone compounds (i) include compounds described in JP-A No. 61-166544, and Japanese Patent Application No. 2001-132318.

Examples of the oxime ester compounds (j) include compounds described in J. C. S. Perkin II, pp. 1653-1660 (1979), J. C. S. Perkin II, pp. 156-162 (1979), Journal of Photopolymer Science and Technology, pp. 202-232 (1995) and JP-A No. 2000-66385, and compounds described in JP-A No. 2000-80068, and specific examples thereof include the following compounds.

(i) Examples of disulfone compounds include compounds described in JP-A No. 61-166544 and Japanese Patent Application No. 2001-132318.

(j) Examples of oxime ester compounds include compounds described in J. C. S. Perkin II, 1653-1660 (1979), J. C. S. Perkin II, 156-162 (1979), Journal of Photopolymer Science and Technology, 202-232 (1995) and JP-A No. 2000-66385 and compounds described in JP-A No. 2000-80068. Specific examples thereof include compounds described below.
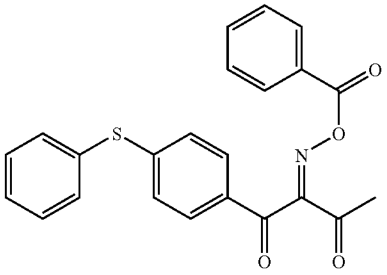
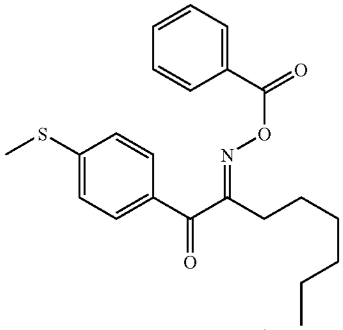
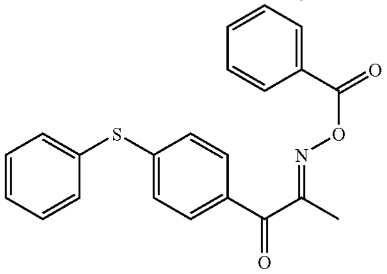
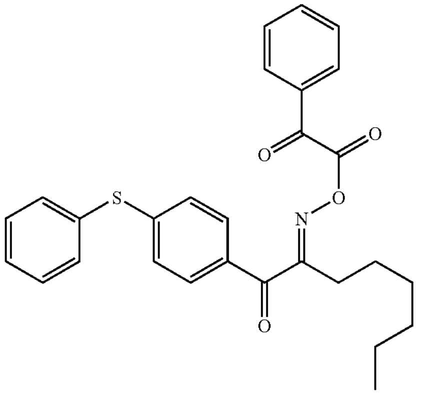
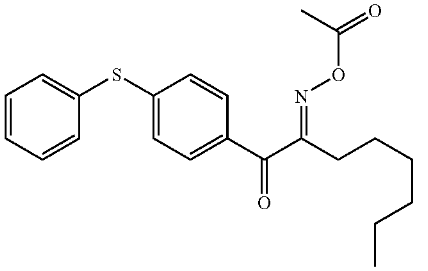
-continued
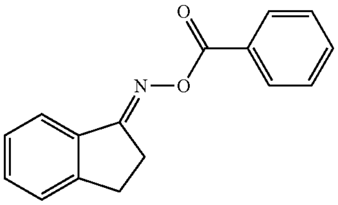
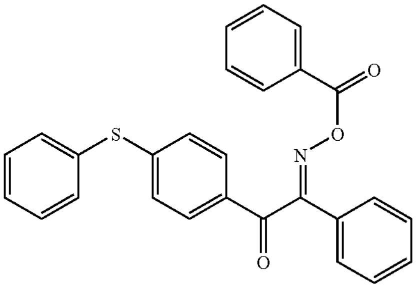
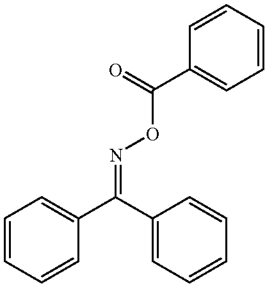
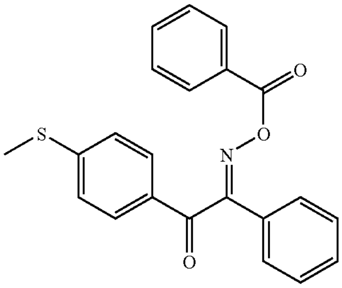
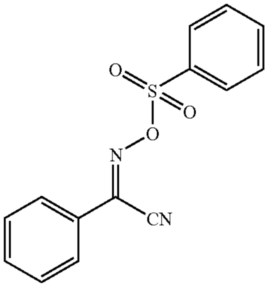
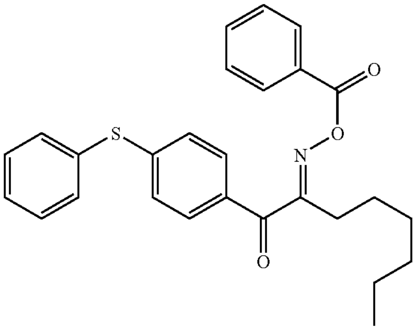

-continued

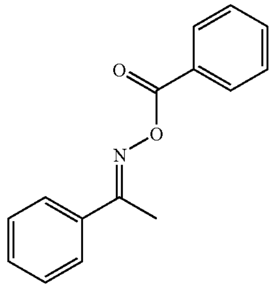

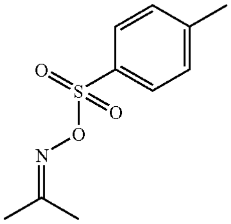

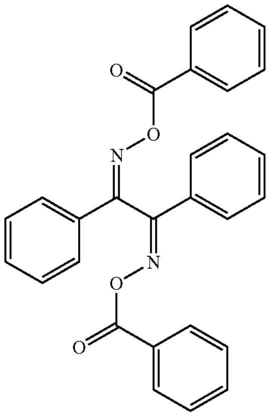

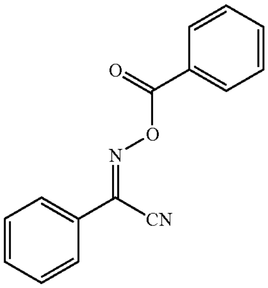

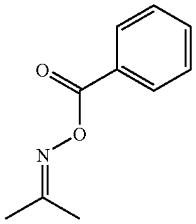

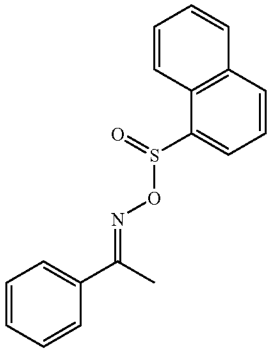

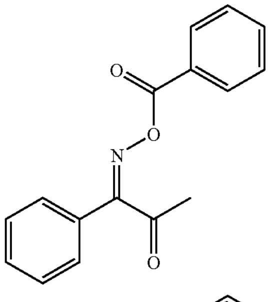

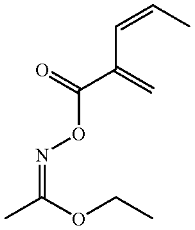

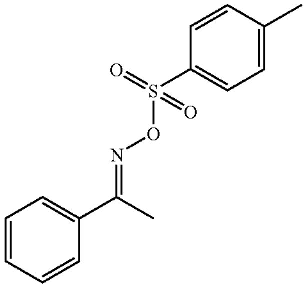

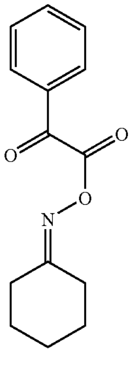

-continued

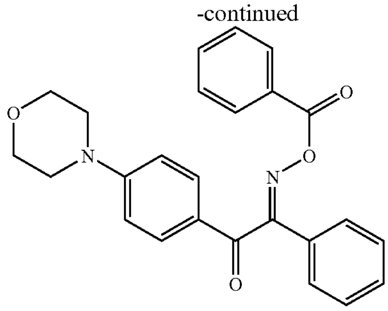

Examples of onium salt compounds (k) include onium salts such as diazonium salts described in S. I. Schlesinger, Photogr. Sci. Eng., 18, 387 (1974) and T. S. Bal et al., Polymer, 21, 423 (1980), ammonium salts described in U.S. Pat. No. 4,069,055 and JP-A No. 4-365049, phosphonium salts described in U.S. Pat. Nos. 4,069,055 and 4,069,056, iodonium salts described in European Patent 104,143, U.S. Pat. Nos. 339,049 and 410,201, and JP-A No. 2-150848 and 2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581, selenonium salts described in J. V. Crivello et al., Macromolecules, 10 (6), 1307 (1977) and J. V. Crivello et al., J. Polymer Sci., Polymer Chem. Ed., 17, 1047 (1979), and arsonium salts described in C. S. Wen et al., Teh. Proc. Conf. Rad. Curing ASIA, p. 478, Tokyo, October (1988).

In the invention, particularly from the reactivity and stability, the oxime ester compounds or diazonium salts, iodonium salts and sulfonium salts, which are detailed below, can be cited as preferable polymerization initiators. In the invention, the onium salts function not as an acid generating agent but as an ionic radical polymerization initiator.

Examples of onium salts preferably used in the invention include onium salts represented by formulas (RI-I) to (RI-III).

Formula (RI-I)

$$Ar^{11}—N^{+}\equiv N \quad Z_{11}^{-}$$

Formula (RI-II)

$$Ar^{21}—I^{+}—Ar^{22} \quad Z_{21}^{-}$$

Formula (RI-III)

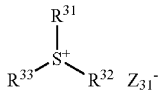

In the formula (RI-I), Ar11 represents an aryl group containing 20 or less carbon atoms, which may have 1 to 6 substituents, and the substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms.

Subsequently, $Z_{11}^-$ represents a monovalent anion. Specific examples of the monovalent anions include a halogen ion, a perchlorate ion, a hexafluorophosphate ion, a tetrafluoroborate ion, a sulfonate ion, a sulfinate ion, a thiosulfonate ion and a sulfate ion. Among these, a perchlorate ion, a hexafluorophosphate ion, a tetrafluoroborate ion, a sulfonate ion and a sulfinate ion are preferred in view of the stability.

In the formula (RI-II), Ar21 and Ar22 each independently represent an aryl group containing 20 or less carbon atoms, which may have 1 to 6 substituents, and the substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms. Z21— represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. Z21—preferably represents a perchlorate ion, a hexafluorophosphate ion, a tetrafluoroborate ion, a sulfonate ion, or a sulfinate ion from the viewpoint of stability.

In the formula (RI-III), $R^{31}$, $R^{32}$ and $R^{33}$ each independently represent an aryl group, alkyl group, alkenyl group or alkynyl group containing 20 or less carbon atoms which may have 1 to 6 substituents, and is preferably an aryl group in respect of reactivity and safety. The substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms.

Subsequently, $Z_{31}^-$ represents a monovalent anion. Specific examples of the monovalent anions include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among these, a perchlorate ion, a hexafluorophosphate ion, a tetrafluoroborate ion, a sulfonate ion, a sulfinate ion and a carboxylate ion are preferred in view of the stability and the reactivity. In particular, a carboxylate ion described in JP-A No. 2000-160323 is preferred and a carboxylate ion described in JP-A No. 2001-177150 and 2000-266797 is more preferred.

Specific examples of the onium salt compounds that are preferably used as the polymerization initiator in the invention are cited below without restricting the invention thereto.

(N-1)

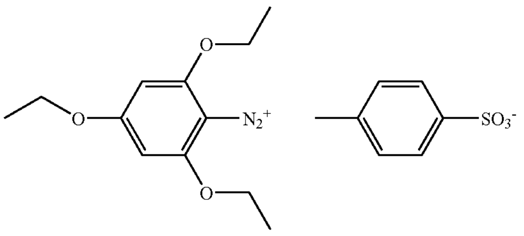

(N-2)

$PF_6^-$ (N-3)

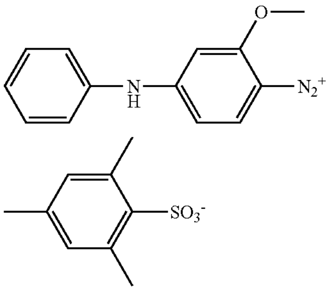

(N-4)

$ClO_4^-$ (N-5)

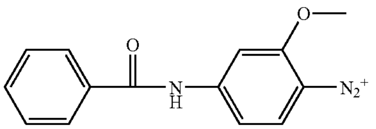

$CF_3SO_3^-$ (N-6

$BF_4^-$ (N-7)

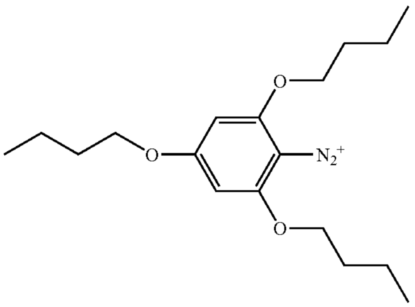

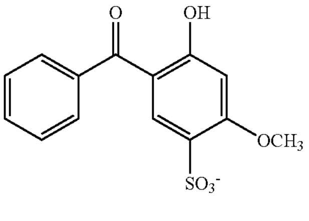

(N-8)

$ClO_4^-$ (N-9)

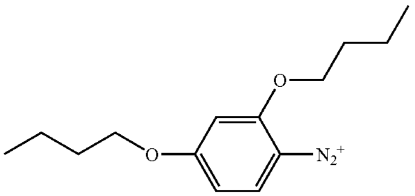

-continued
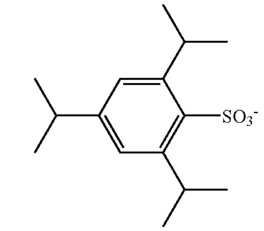
(N-10)
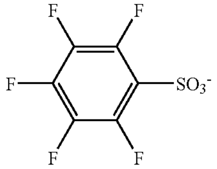
(N-11)
$PF_6^-$
(N-12)
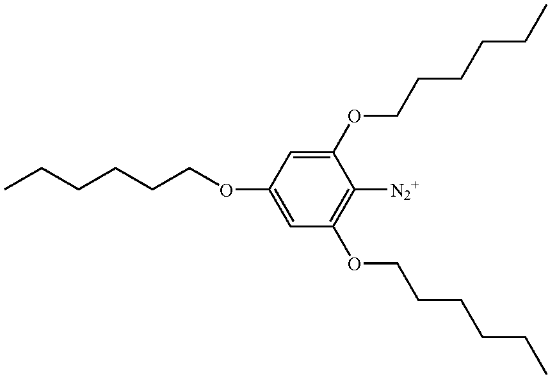
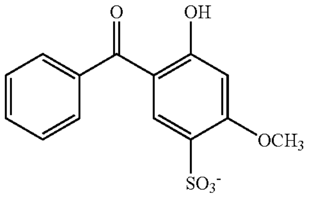
(N-13)
$ClO_4^-$
(N-14)
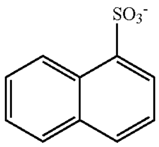
(I-1)
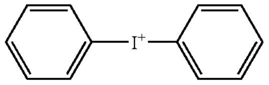
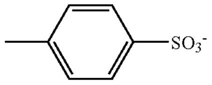
(I-2)
$PF_6^-$
(I-3)
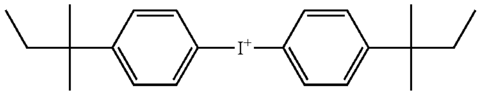
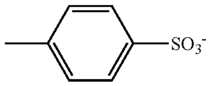
(I-4)
$ClO_4^-$
-continued
(I-5)
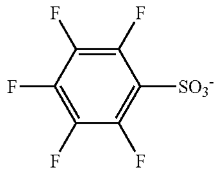
(I-6)
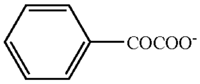
(I-7)
$CF_3SO_3^-$
(I-8)
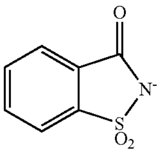
(I-9)
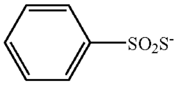
(I-10)
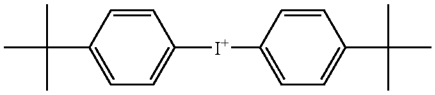
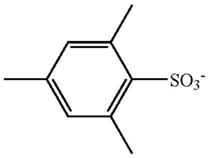
(I-11)
$ClO_4^-$
(I-12)
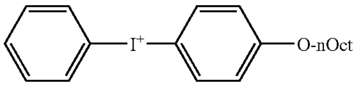
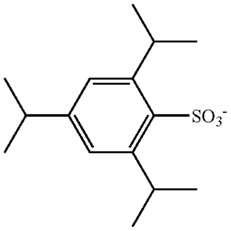
(I-13)
$CF_3COO^-$
(I-14)
$CF_3SO_3^-$
(I-15)
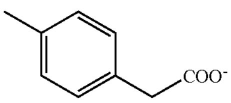
(I-16)
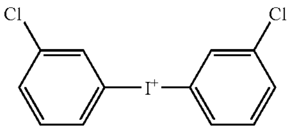
$BF_4^-$
(I-17)
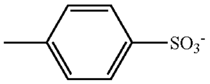

-continued
(I-18)
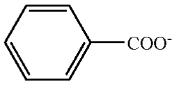
(I-19)
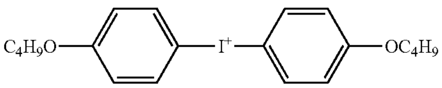
$C_4F_9SO_3^-$
(I-20)
$PF_6^-$
(I-21)
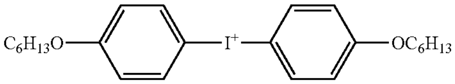
$CF_3SO_3^-$
(I-22)
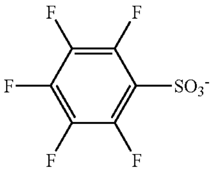
(I-23)
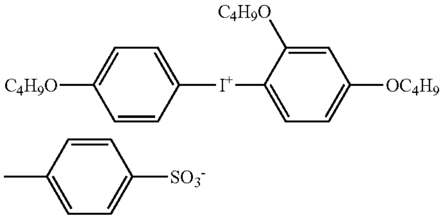
(I-24)
$PF_6^-$
(I-25)
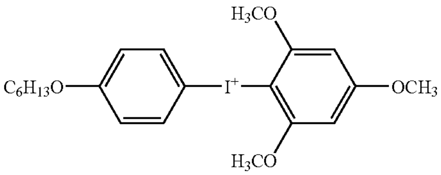
$PF_6^-$
(I-26)
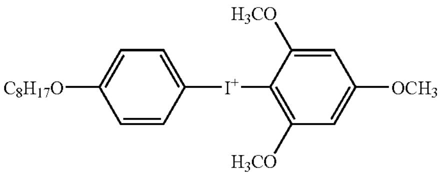
$PF_6^-$
(I-27)
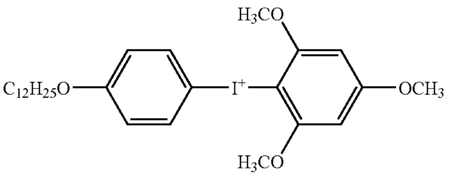
$C_4F_9SO_3^-$
-continued
(S-1)
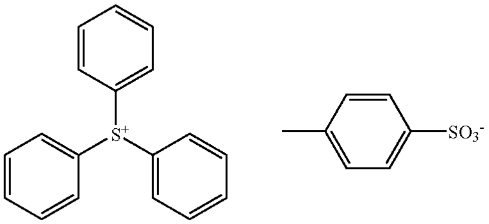
(S-2)
$PF_6^-$
(S-3)
$ClO_4^-$
(S-4)
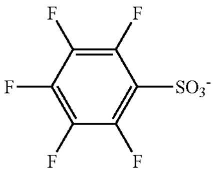
(S-5)
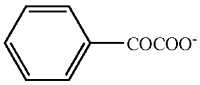
(S-6)
$CF_3SO_3^-$
(S-7)
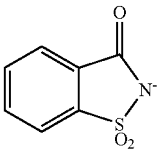
(S-8)
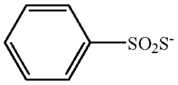
(S-9)
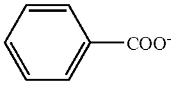
(S-10)
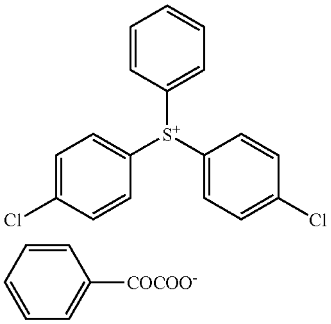
(S-11)
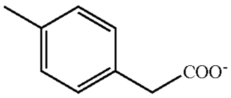

-continued (S-12)

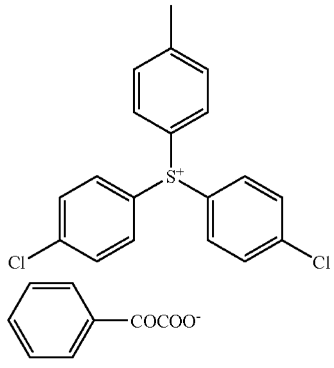

(S-13)

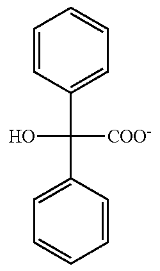

(S-14)

$BF_4^-$ (S-15)

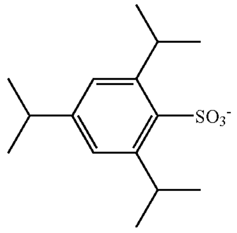

(S-16)

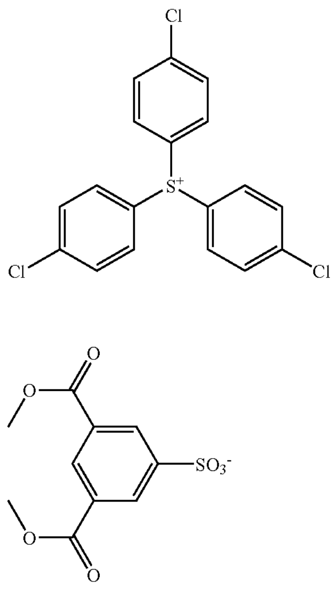

-continued (S-17)

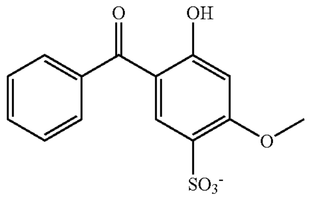

A particularly preferable polymerization initiator of the invention is, from the viewpoint of a balance between the reactivity and stability, an iodonium salt having an electron releasing group or a sulfonium salt having an electron withdrawing group. Among these, an iodonium salt having at least two alkoxy groups in a skeleton having a cationic portion is preferred and an iodonium salt having at least three alkoxy groups is most preferable.

The polymerization initiator (B) is added, based on a total solid content constituting an image recording layer, at a ratio in a range of 0.1 to 50% by mass, preferably in a range of 0.5 to 30% by mass and particularly preferably in a range of 1 to 20% by mass. When the polymerization initiator is added in a range, excellent sensitivity and excellent stain resistance in the non-image portion at the time of printing are achieved.

Furthermore, the polymerization initiator may be added together with other components to one layer or may be added to a different layer separately provided.

[Binder Polymer (C)]

In an image recording material of the invention, in order to improve the film characteristics of a recording layer formed, as needs arise, a binder polymer (C) can be used. The binder polymer is preferred to be a linear organic polymer. As such a "linear organic polymer", known ones can be arbitrarily used. In order to realize aqueous development or weak alkali development, a linear organic polymer that is dissolved or swollen in water or weak alkali water is preferably selected. The linear organic polymer is selected and used corresponding to applications not only as a film forming agent of an image recording material but also as an aqueous, weak alkali water or organic solvent developing agent.

In the invention, in order to make the alkali developability excellent, a polymer having an alkali-soluble group in a molecule is preferably used.

For instance, when a water-soluble organic polymer is used, the aqueous development can be realized. Examples of such linear organic polymers include radical polymers having carboxylic acid groups at side chains such as described in JP-A No. 59-44615, JP-B Nos. 54-34327, 58-12577 and 54-25957, JP-A Nos. 54-92723, 59-53836 and 59-71048, that is, resins obtained by homopolymerizing or copolymerizing a monomer having a carboxyl group; resins obtained by hydrolyzing or half-esterifying or making half-amide acid anhydride units obtained by homopolymerizing or copolymerizing a monomer having an acid anhydride; and epoxy methacrylates obtained by modifying an epoxy resin with unsaturated monocarboxylic acid or acid anhydride. Examples of monomers having a carboxyl group include acrylic acid, methacrylic acid, itaconic acid, crotonic acid, maleic acid, fumaric acid and 4-carboxyl styrene and examples of monomers having an acid anhydride include maleic anhydride.

Furthermore, similarly, there are acidic cellulose derivatives having a carboxylate group at a side chain. Other than these, ones obtained by adding a cyclic acid anhydride to a polymer having a hydroxyl group are useful.

When an alkali-soluble resin is copolymerized to use as a copolymer, as a compound that is copolymerized, monomers other than ones cited above may be used. Examples of other monomers include compounds according to (1) through (12) below.

(1) Acrylic esters and methacrylic esters having an aliphatic hydroxyl group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propagyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-chloroethyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate.

(4) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide;

(5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters such as vinyl acetate, vinyl chloroacetate, vinyl butylate, and vinyl benzoate;

(7) styrenes such as styrene, α-methylstyrene, methylstyrene, chloromethylstyrene, and p-acetoxystyrene;

(8) vinyl ketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, acrylonitrile, methacrylonitrile, and the like;

(11) unsaturated imides such as maleimide, N-acryloylacrylamide, N-acetylmethacrylamide, N-propionylmethacrylamide, and N-(p-chlorobenzoyl)methacrylamide; and

(12) methacrylate monomers having a hetero atom in the α position, examples thereof include compounds described in Japanese Patent Application No. 2001-115595 and Japanese Patent Application No. 2001-115598.

Among them, preferable are (meth)acrylic resins having in the side chain thereof an allyl group or a vinyl ester group and a carboxyl group, alkali soluble resins having in the side chain thereof a double bond described in JP-A No. 2000-187322 and JP-A No. 2002-62698, and alkali soluble resins having in the side chain thereof an amide group described in JP-A No. 2001-242612, from the viewpoints of excellent balance between the film strength, sensitivity, and developability.

Urethane-containing binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741 and JP-A No. 10-116232 and urethane-containing binder polymers containing an acid group and a double bond as described in JP-A No. 2002-107918 are very excellent in strength and thus advantageous in respect of printing durability and low-exposure suitability.

Acetal-modified polyvinyl alcohol-containing binder polymers having an acid group as described in EP993966, EP1204000, and JP-A No. 2001-318463 are preferable because they are excellent in the balance between film strength and developability.

Urethane-containing binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741 and JP-A No. 10-116232 and urethane-containing binder polymers containing an acid group and a double bond as described in JP-A No. 2002-107918 are very excellent in strength and thus advantageous in respect of printing durability and low-exposure suitability.

Acetal-modified polyvinyl alcohol-containing binder polymers having an acid group as described in EP993966, EP1204000, and JP-A No. 2001-318463 are preferable because they are excellent in the balance between film strength and developability.

As other water-soluble linear organic compounds, polyvinyl pyrrolidone and polyethylene oxide are useful. To increase the strength of the cured film, alcohol-soluble nylon, polyethers of 2,2-bis-(4-hydroxyphenyl)-propane and epichlorohydrin, etc. are also useful.

The weight-average molecular weight of the polymer used in the invention is preferably from 5000 or more, more preferably in a range of from 10,000 to 300,000, and the number-average molecular weight thereof is preferably 1,000 or more, more preferably in a range of from 2,000 to 250,000. Polydispersity (weight-average molecular weight/number-average molecular weight) is preferably 1 or more, more preferably in a range of from 1.1 to 10.

The polymer may be a random polymer, a block polymer or a graft polymer.

The polymer used in the invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. Only one solvent may be used, or a mixture of two or more solvents may be used.

As the radical polymerization initiator used for synthesizing the polymer used in the invention, known compounds such as an azo initiator or a peroxide initiator can be used.

Among the binders described above, binder polymers having a repeating unit represented by the following formula (I) shown in Japanese Patent Application No. 2002-287920, such as 2-methacryloyloxyethylsuccinic acid polymer and 2-methacryloyloxyethylhexahydrophthalic acid copolymer, are preferable from the viewpoint of preventing damage caused by a developer.

(I)

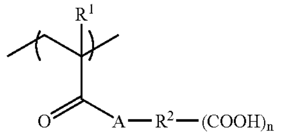

In formula (I), $R^1$ represents a hydrogen atom or a methyl group; $R^2$ is a linking group composed of two or more atoms selected from the group consisting of carbon atoms, hydrogen atoms, oxygen atoms, nitrogen atoms and sulfur atoms wherein the number of atoms in the linking group is 2 to 82; A represents an oxygen atom or —$NR^3$— wherein $R^3$ represents a hydrogen atom or a $C_1$-$C_{10}$ monovalent hydrocarbon group; and n is an integer of 1 to 5.

In the formula (I) above, the number of atoms in the main skeleton of the linking group represented by $R^2$ is preferably 1 to 30. $R^2$ preferably has an alkylene structure or a structure including alkylene structures linked via ester linkages.

Hereinafter, the repeating units represented by the formula (I) will be described in detail.

$R^1$ in the formula (I) represents a hydrogen atom or a methyl group, preferably a methyl group.

The linking group represented by $R^2$ in the formula (I) is a linking group composed of two or more atoms selected from the group consisting of carbon atoms, hydrogen atoms, oxygen atoms, nitrogen atoms and sulfur atoms wherein the number of atoms in the linking group is 2 to 82, preferably 2 to 50, more preferably 2 to 30. When the linking group has substituent(s), the number of atoms refers to the number of atoms including the atoms in the substituent(s) on the linking group.

Specifically, the number of atoms in the main skeleton of the linking group represented by $R^2$ is preferably 1 to 30, more preferably 3 to 25, still more preferably 4 to 20, most preferably 5 to 10. The "main skeleton of the linking group" in the invention refers to an atom or an atomic group serving to link A to the terminal COOH in the formula (I). When plural linking routes are present, the main skeleton refers to the atom or atomic group constituting the linking route having the smallest number of atoms. Accordingly, when the linking group has a cyclic structure, the number of atoms to be used for calculation varies depending on the linking site (for example, o-, m-, p- etc.).

The structure of the specific binder polymer according to the invention, and the number of atoms constituting the main skeleton of the linking group represented by $R^2$ in the structure and the method of calculating the number of atoms, are both shown below.

Number of atoms constituting the main chain of the linkage group

| | | Number of atoms constituting the main chain of the linkage group |
|---|---|---|
| (1) | 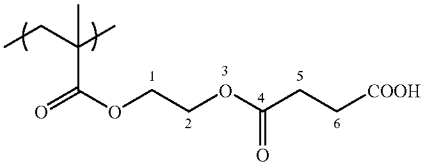 | :6 |

-continued

| | | Number of atoms constituting the main chain of the linkage group |
|---|---|---|
| (2) | 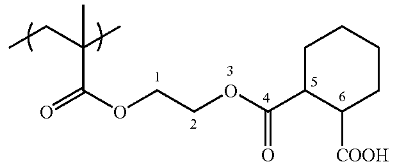 | :6 |
| (3) | 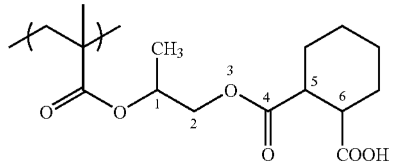 | :6 |
| (4) | 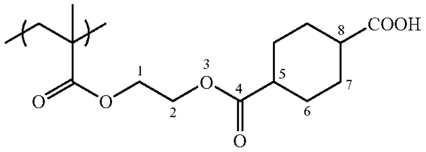 | :8 |
| (5) | 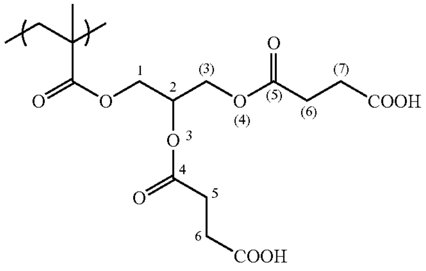 | :6 |
| (6) | 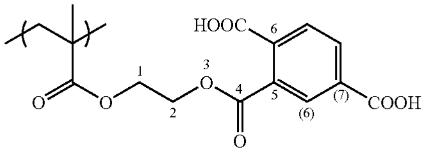 | :6 |
| (7) | 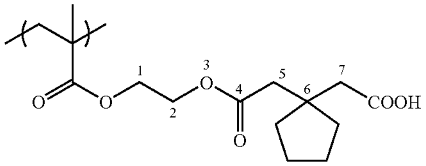 | :7 |
| (8) | 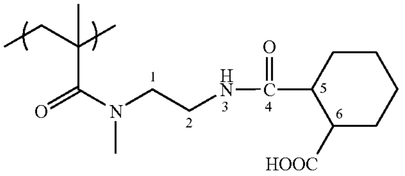 | :6 |

The linking group represented by $R^2$ in the formula (I) is more specifically an alkylene, a substituted alkylene, an arylene, a substituted arylene, or a group in which plural divalent groups, such as those described above, are linked via amide or ester linkages.

A linking group in the chain structure may be ethylene, propylene etc. A structure including such alkylene groups linked via ester linkages is also preferable.

The linking group represented by $R^2$ in the formula (I) is preferably a (n+1)-valent hydrocarbon group having a $C_3$-$C_{30}$ alicyclic structure. Examples thereof include (n+1)-valent hydrocarbon groups obtained by removing (n+1) hydrogen atoms on one or more arbitrary carbon atoms constituting a compound having an alicyclic structure such as cyclopropane, cyclopentane, cyclohexane, cycloheptane, cyclooctane, cyclodecane, dicyclohexyl, tertiary cyclohexyl or norbornane which may be substituted by one or more arbitrary substituents. $R^2$ preferably has 3 to 30 carbon atoms including the carbon atoms in the substituent(s) if any.

One or more arbitrary carbon atoms in the compound having an alicyclic structure may be substituted by one or more heteroatoms selected from the group consisting of nitrogen atoms, oxygen atoms and sulfur atoms. In respect of printing durability, $R^2$ is preferably a (n+1)-valent hydrocarbon group having an alicyclic structure which may have a substituent and which includes two or more rings and has 5 to 30 carbon atoms, such as a condensed polycyclic aliphatic hydrocarbon, a crosslinked alicyclic hydrocarbon, a spiroaliphatic hydrocarbon, and a combination of aliphatic hydrocarbon rings (a structure in which rings are combined by bonds or via linking groups). The number of carbon atoms refers to the number of carbon atoms including the carbon atoms in the substituent(s) if any.

Regarding linking groups represented by $R^2$, the number of atoms is further preferably 5 to 10. Linking groups having a chain structure in which includes an ester bond or a cyclic structure are preferable.

A substituent which can be introduced into the linking group represented by $R^2$ may be a monovalent non-metal atomic group excluding hydrogen, and examples thereof include a halogen atom (—F, —Br, —Cl, —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxycarbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—SO3H) and its conjugate base group, an alkoxy sulfonyl group, an aryloxy sulfonyl group, a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group, a N-acyl sulfamoyl group and its conjugate base group, a N-alkyl sulfonyl sulfamoyl group (—$SO_2NHSO_2$(alkyl)) and its conjugate base group, a N-aryl sulfonyl sulfamoyl group (—$SO_2NHSO_2$(allyl)) and its conjugate base group, a N-alkyl sulfonyl carbamoyl group (—$CONHSO_2$(alkyl)) and its conjugate base group, a N-aryl sulfonyl carbamoyl group (—$CONHSO_2$(aryl)) and its conjugate base group, an alkoxy silyl group (—Si(O-alkyl)$_3$), an aryloxy silyl group (—Si(O-aryl)$_3$), a hydroxysilyl group (—Si(OH)$_3$) and its conjugate base group, a phosphono group (—$PO_3H_2$) and is conjugate base group, a dialkyl phosphono group (—$PO_3$ (alkyl)$_2$), a diaryl phosphono group (—$PO_3$(aryl)$_2$), an alkyl aryl phosphono group (—$PO_3$(alkyl)(aryl)), a monoalkyl phosphono group (—$PO_3H$(alkyl)) and its conjugate base group, a monoaryl phosphono group (—$PO_3H$(aryl)) and its conjugate base group, a phosphonoxy group (—$OPO_3H_2$) and its conjugate base group, a dialkyl phosphonoxy group (—$OPO_3$(alkyl)$_2$), a diaryl phosphonoxy group (—$OPO_3$ (aryl)$_2$), an alkyl aryl phosphonoxy group (—$OPO_3$(alkyl) (aryl)), a monoalkyl phosphonoxy group (—$OPO_3H$(alkyl)) and its conjugate base group, a monoaryl phosphonoxy group (—OPO3H(aryl)) and its conjugate base group, a cyano group, a nitro group, a dialkyl boryl group (—B(alkyl)$_2$), a diaryl boryl group (—B(aryl)$_2$), an alkyl aryl boryl group (—B(alkyl)(aryl)), a dihydroxy boryl group (—B(OH)$_2$) and its conjugate base group, an alkyl hydroxy boryl group (—B (alkyl)(OH)) and its conjugate base group, an aryl hydroxy boryl group (—B(aryl)(OH)) and its conjugate base group, an aryl group, an alkenyl group and an alkynyl group.

According to the design of the recording layer, a substituent having a hydrogen atom capable of hydrogen bonding, particularly a substituent having acidity whose acid dissociation constant (pKa) is lower than that of carboxylic acid, may not be preferable because it tends to lower printing durability. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such hydrophobic substituents. If possible, these substituents may be bound to one another or to a substituted hydrocarbon group to form a ring. The substituents may themselves be substituted.

In the formula (I), when A is $NR^3$—, $R^3$ represents a hydrogen atom or monovalent hydrocarbon group having 1 to 10 carbon atoms. Examples of the monovalent hydrocarbon group having 1 to 10 carbon atoms represented by $R^3$ include linear, branched, or cyclic alkyl groups having 1 to 10 carbon atoms such as an alkyl group, an aryl group, an alkenyl group, and an alkynyl group.

Specific examples of the alkyl group include a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, and a 2-norbornyl group.

Specific examples of the aryl group include aryl groups having 1 to 10 carbon atoms such as a phenyl group, a naphthyl group, and an indenyl group, heteroaryl groups having 1 to 10 carbon atoms and containing a heteroatom selected from the group consisting of a nitrogen atom, an oxygen atom, and a sulfur atom, for example, a furyl group, a thienyl group, a pyrrolyl group, a pyridyl group, and a quinolyl group.

Specific examples of the alkenyl group include linear, branched, or cyclic alkenyl groups having 1 to 10 carbon atoms such as a vinyl group, a 1-propenyl group, a 1-butenyl group, a 1-methyl-1-propenyl group, a 1-cyclopentenyl group, and a 1-cyclohexenyl group.

Specific examples of the alkynyl group include alkynyl groups having 1 to 10 carbon atoms such as an ethynyl group, a 1-propynyl group, a 1-butynyl group, and a 1-octynyl group. Examples of the substituent which may be introduced into $R^3$ are the same as those listed as the substituent which may be introduced into $R^2$. However, $R^3$ has 1 to 10 carbon atoms including the carbon atoms in the substituent.

In the formula (I), A is preferably an oxygen atom or —NH— from the viewpoint of easiness of synthesis.

In the formula (I), n denotes an integer of 1 to 5, and is preferably 1 from the viewpoint of printing durability.

Specific examples of the repeating unit represented by the formula (I) composing the binder polymer particularly suitable for the invention are listed below, however are not limited to them.

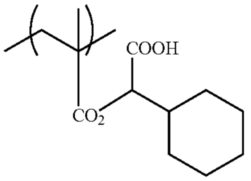

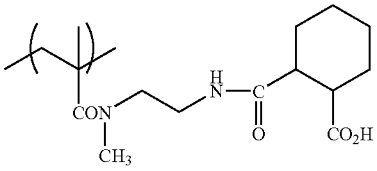

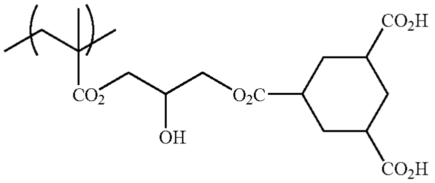

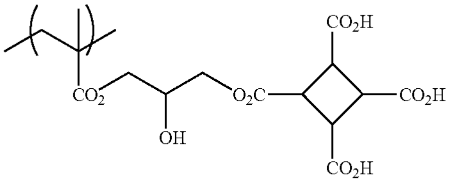

-continued

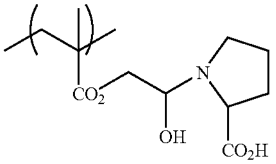

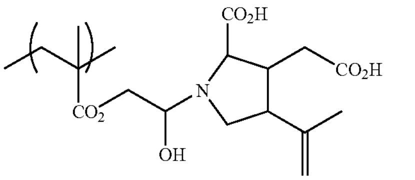

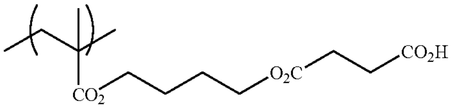

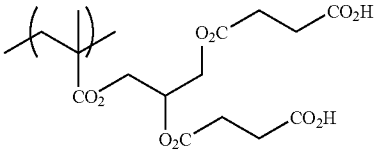

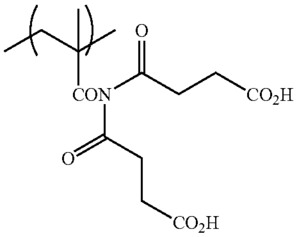

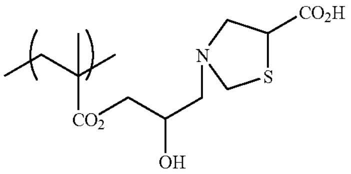

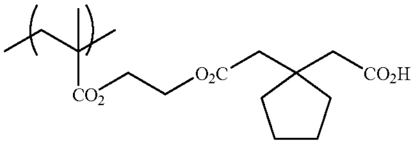

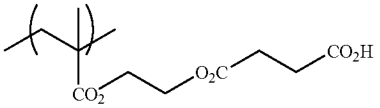

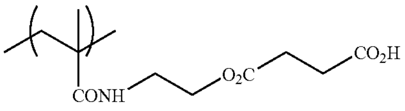

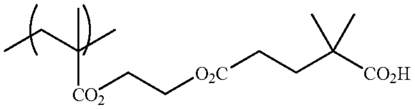

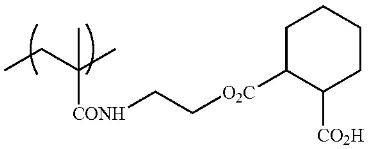

-continued

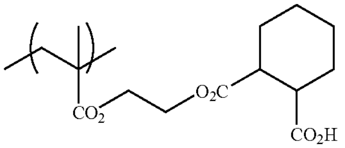

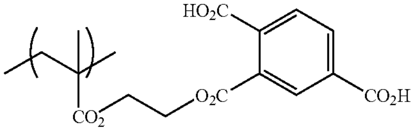

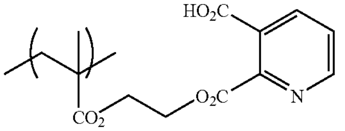

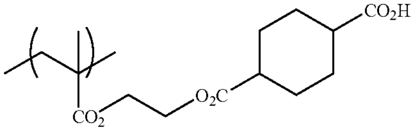

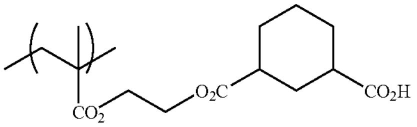

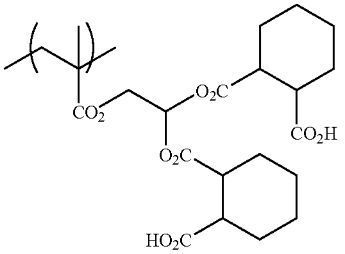

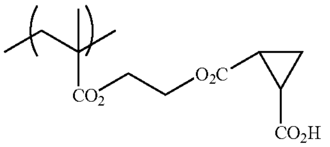

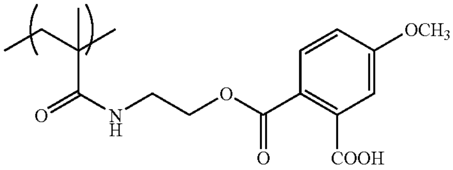

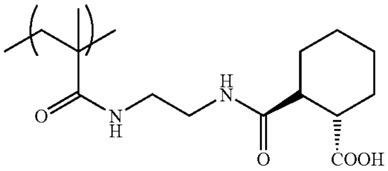

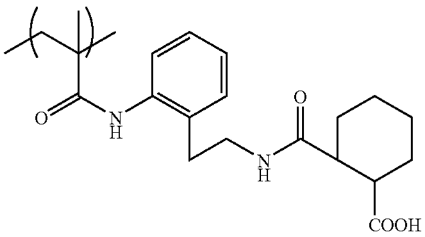

-continued

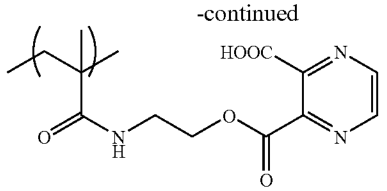

In an embodiment, one kind of repeating unit represented by formula (I) is included in the binder polymer. In another embodiment, two or more kinds of repeating unit represented by the formula (I) are contained in the binder polymer. The binder polymer preferred in the invention may be a polymer composed exclusively of the repeating unit represented by the formula (I), but is generally used as a copolymer containing one or more other copolymerizable components. The total content of the repeating unit represented by the formula (I) in the copolymer is determined suitably depending on the structure of the copolymer, the design of the polymerizable composition, etc., but is preferably from 1 to 99 mol-%, more preferably from 5 to 40 mol-%, still more preferably from 5 to 20 mol-%, based on the total molar amount of the polymer components.

Copolymer components used as a copolymer may be selected from radical polymerizable monomers known in the art without particular limitation. Specific examples include monomers described in Polymer Data Handbook—Fundamental Version—(in Japanese) compiled by the Society of Polymer Science, Japan and published by Baifukan, 1986. Such additional copolymerizable components may include only one copolymerization component, or a combination of two or more compolymerization components.

Among the above-described binder polymers, [allyl(meth) acrylate/(meth)acrylic acid/optionally together with other addition polymerizable vinyl monomer] copolymers, and polymers containing an acryl group, a methacryl group, and an allyl group as described in JP-A No. 2000-131837, JP-A No. 2002-62648, JP-A No. 2000-187322, and Japanese Patent Application No. 2002-287920 are particularly preferable from the viewpoint of the excellent balance between the film strength, sensitivity, and developability.

In particular, polymers having a repeating unit represented by the formula (1) and a radical polymerizable group (carbon-carbon double bond) represented by any one of the formulae (II) to (IV) structure are most preferable.

Formula (II)

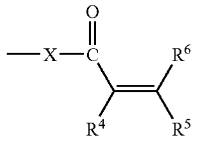

Formula (III)

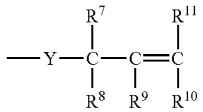

Formula (IV)

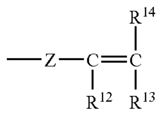

In the formulae (II) to (IV), $R^4$ to $R^{14}$ each independently represent a hydrogen atom or a monovalent substituent; X and Y each independently represent an oxygen atom, a sulfur atom or N—$R^{15}$; Z represents an oxygen atom, a sulfur atom, —N—$R^{15}$ or a phenylene group wherein $R^{15}$ represents a hydrogen atom or a monovalent organic group.

In the formula (II) above, $R^4$ to $R^6$ each independently represent a hydrogen atom or a monovalent substituent. R4 may be a hydrogen atom or an optionally substituted organic group such as an alkyl group. In particular, specifically, a hydrogen atom, a methyl group, a methylalkoxy group or a methyl ester group is preferable. $R^5$ and $R^6$ each independently represent a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include a methoxycarbonyl group, an ethoxycarbonyl group, an isopropioxycarbonyl group, a methyl group, an ethyl group, and a phenyl group.

X represents an oxygen atom, a sulfur atom or —N—$R^{15}$ wherein $R^{15}$ includes an optionally substituted alkyl group etc.

In the formula (III), $R^7$ to $R^{11}$ each independently represents a hydrogen atom or monovalent substituent. Specific examples of $R^7$ to $R^{11}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group. Among them, a hydrogen atom, a carboxyl group, an alkoxycarbonyl group, an optionally substituted alkyl group, and an optionally substituted aryl group are preferable.

Examples of the substituent which may be introduced into these groups include those listed as the substituent which may be introduced into the formula (II).

Y represents an oxygen atom, a sulfur atom, or —N—$R^{15}$. Examples of $R^{15}$ include the same groups those listed for the formula (II).

In the formula (IV), $R^{12}$ to $R^{14}$ each independently represent a hydrogen atom or monovalent substituent. Specific examples thereof include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group. Among them, a hydrogen atom, a carboxyl group, an alkoxycarbonyl group, an optionally substituted alkyl group, and an optionally substituted aryl group are preferable.

Examples of the substituent which may be introduced into these groups include those listed as the substituent which may be introduced into the formula (II).

Z represents an oxygen atom, a sulfur atom, —$NR^{15}$ or a phenylene group. Examples of —NR15 include those listed for the formula (II).

Among these radical polymerizable groups, radical-polymerizable groups having a structure represented by the formula (II) or (III) are preferable.

The molecular weight of the binder polymer (C) in the invention can be suitably determined from the viewpoint of image-forming property and printing durability. Usually the molecular weight is preferably in a range of 2,000 to 1,000,000, more preferably 5,000 to 500,000, still more preferably 10,000 to 200,000.

The binder polymer (C) preferably used in the invention is a polymer substantially insoluble in water but soluble in an aqueous alkali solution. It follows that as the developer, an environmentally undesirable organic solvent is not used, or the amount of such an organic solvent can be limited to a very small amount.

The acid value (i.e. acid content per g of the polymer, expressed in terms of chemical equivalence) and molecular weight of the binder polymer (C) are suitably selected from the viewpoints of image strength and developability. The acid value is preferably in a range of 0.4 to 3.0 meq/g, and the molecular weight is preferably 2,000 to 500,000, and more preferably, the acid value is in a range of 0.6 to 2.0, and the molecular weight is in a range of 10,000 to 300,000.

Such the respective binder polymers may be used singularly or in a combination of at least two kinds thereof.

A content of the (C) binder polymer in an image recording layer of the invention is, though determined appropriately, from the viewpoints of the film strength of an image portion and the developability, based on a total mass of a total solid content of the image recording layer, usually in a range of 10 to 90% by mass, preferably in a range of 20 to 80% by mass and more preferably in a range of 30 to 70% by mass.

[Dye (D) Having the Absorption Maximum at the Wavelength from 300 to 1200 nm]

The image recording layer in the invention may contain a dye having the absorption maximum at the wavelength from 300 to 1200 nm. The dye functions as a sensitizing dye, and preferably has the absorption maximum at the wavelength from 750 to 900 nm from the viewpoint of improving the performance such as image quality. Examples of the sensitizing dye include spectral sensitizing dyes, or dyes or pigments as listed below which absorb light from a light source to interact with a photopolymerization initiator.

Preferable examples of the spectral sensitizing dyes include polynuclear aromatics (e.g. pyrene, perylene, and triphenylene), xanthenes (e.g. fluorescein, eosin, erythrosine, rhodamine B, and rose bengal), cyanines (e.g. thiacarbocyanine, and oxacarbocyanine), melocyanines (e.g. melocyanine and carbomelocyanine), thiazines (e.g. thioene, methylene blue, and toluidine blue), acridines (e.g. acridine orange, chloroflavine, and acriflavine), phthalocyanines (e.g. phthalocyanine and metallophthalocyanine), porphyrins (e.g. tetraphenyl porphyrin, center metal substituted porphyrin), chlorophylls (e.g. chlorophyll, chlorophyllin, and center metal substituted chlorophyll), metal complexes, anthraquinones (e.g. anthraquinone), and squaryliums (e.g. squarylium).

More preferable examples of the spectral sensitizing dyes include styryl-based dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine-based dyes described in JP-A No. 1-287105, xanthene-based dyes described in JP-A No. 62-31844, JP-A No. 62-31848, and JP-A No. 62-143043, aminostyryl ketones described in JP-B No. 59-28325, melocyanine dyes described in JP-B No. 61-9621, dyes described in JP-A No. 2-179643, melocyanine dyes described in JP-A No. 2-244050, melocyanine dyes described in JP-B No. 59-28326, melocyanine dyes described in JP-A No. 59-89803, melocyanine dyes described in JP-A No. 8-129257, and benzopyran-based dyes described in JP-A No. 8-334897.

The sensitizing dye used in the invention is more preferably represented by the following formula (12).

Formula (12)

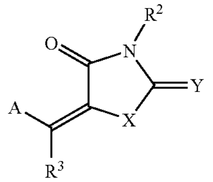

In the formula (12), A represents an optionally substituted aromatic ring or heterocycle, X represents an oxygen atom, a sulfur atom, or —N($R^1$)—, and Y represents an oxygen atom or —N($R^1$)—. $R^1$, $R^2$, and $R^3$ each independently represents a hydrogen atom or a monovalent group of nonmetal atoms. A, $R^1$, $R^2$, and $R^3$ may be combined with each other to form an aliphatic or aromatic ring.

When $R^1$, $R^2$, and $R^3$ each represents a monovalent group of nonmetal atoms, and preferably represents a substituted or unsubstituted alkyl group or aryl group.

Specific preferable examples of $R^1$, $R^2$, and $R^3$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecy group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of nonmetal atoms excluding hydrogen atoms is used, preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, an ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group (—$SO_3H$) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—$PO_3H_2$) and conjugate base groups thereof (hereinafter, referred to as a phosphonate group), a dialkylphosphono group (—$PO_3$(alkyl)$_2$), diarylphosphono group (—$PO_3$(aryl)$_2$), an alkylarylphosphono group (—$PO_3$(alkyl)(aryl)), a monoalkylphosphono group (—$PO_3$H(alkyl)) and conjugate base groups thereof (hereinafter, referred to as an alkylphosphonate group), a monoarylphosphono group (—$PO_3$H(aryl)) and conjugate base groups thereof (hereinafter, referred to as an arylphosphonate group), phosphonooxy group (—$OPO_3H_2$) and conjugate base groups thereof (hereinafter, referred to as a phosphonateoxy group), a dialkyl phosphonooxy group (—$OPO_3$(alkyl)$_2$), diarylphosphonooxy group (—$OPO_3$(aryl)$_2$), alkylarylphosphonooxy group (—$OPO_3$(alkyl) (aryl)), monoalkylphosphonooxy group (—$OPO_3$H(alkyl)) and conjugate base groups thereof (hereinafter, referred to as an alkylphosphonateoxy group), monoarylphosphonooxy group (—$OPO_3$H(aryl)) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring containing at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, prine, quinolizine, isoquinoline, phthalazine, naphthyridine, quinazoline, cinnoline, pteridine, carbazole, carboline, phenanthroline, acridine, perimidine, phenanthroline, phthalazine, phenarsazine, phenoxazine, and furazan, which may be further benzo-condensed ring, or may be substituted.

Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. Examples of G1 in the acyl group (G1CO—) include a hydrogen atom, and the above-described alkyl group and aryl group. Among these substituents, more preferable examples include a halogen atom (—F, —Br, —Cl, and —I), an alkoxy group, an aryloxy group, an alkylthio group, an arylthio group, a N-alkylamino group, a N,N-dialkylamino group, an acyloxy group, a N-alkylcarbamoyloxy group, a N-arylcarbamoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as $R^1$, $R^2$, or $R^3$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl)carbamoylethyl group, a N-methyl-N-(sulfophenyl)carbamoylmethyl group, a sulfobutyl group, a sulfonatepropyl group, a sulfonatebutyl group, a sulfamoylbutyl group, a N-ethylsulfamoylmethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an a-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^1$, $R^2$, or $R^3$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^1$, $R^2$, or $R^3$ include a the above-described aryl group having a monovalent group of nonmetal atoms (excluding hydrogen atoms) as a substituent on the carbon atom forming the ring. Preferable examples of the substituent include the above-described alkyl group, substituted alkyl group, and examples of the substituents in the alkyl group. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl)carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^2$ and $R^3$ include a substituted or unsubstituted alkyl group. More preferable examples of $R^1$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

In the next place, A in the formula (12) is further described. A represents an optionally substituted aromatic ring or heterocycle, and specific examples of the optionally substituted aromatic ring or heterocycle include the same examples as those listed in the above-described description of $R^1$, $R^2$, or $R^3$ in the formula (12).

Among them, preferable examples of A include an aryl group having an alkoxy group, a thioalkyl group, or an amino group, and particularly preferable examples of A include an aryl group having an amino group.

In the next place, Y in the formula (12) is further described. Y represents a group of nonmetal atoms necessary for forming a heterocycle together with the above-described A and the adjacent carbon atom. Examples of the heterocycle include a 5-, 6-, or 7-membered nitrogen-containing or sulfur-containing heterocycle which may have a condensed ring. Among them, a 5- or 6-membered heterocycle is preferable.

Preferable examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein. Specific examples thereof include, thiazoles (e.g. thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (e.g. benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (e.g. naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, and 7-methoxynaphtho[1,2]thiazole), thianaphtheno-7',6',4,5-thiazoles (e.g. 4'-methoxythianaphtheno-7',6',4,5-thiazole), oxazoles (e.g. 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (e.g. benzoxazole, 5-chlorobenzoxazole, 5-methyl benzoxazole, 5-phenylbenzooxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (e.g. naphtho[1,2]oxazole and naphtho[2,1]oxazole), selenazoles (e.g. 4-methylselenazole and 4-phenylselenazole), benzoselenazoles (e.g. benzoselenazole, 5-chlorobenzoselenazole, 5-methoxybenzoselenazole, 5-hydroxybenzoselenazole, and tetrahydrobenzoselenazole), naphthoselenazoles (e.g. naphtho[1,2]selenazole, and naphtho[2,1]selenazole), thiazolines (e.g. thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (e.g. quinoline, 3-methylquinoline, 5-methylquinoline, 7-methylquinoline, 8-methylquinoline, 6-chloro quinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (e.g. isoquinoline and 3,4-dihydroisoquinoline), 3-isoquinolines (e.g. isoquinoline), benzimidazoles (e.g. 1,3-dimethylbenzimidazole, 1,3-diethylbenzimidazole, and 1-ethyl-3-phenylbenzimidazole), 3,3-dialkylindolenines (e.g. 3,3-dimethylindolenine, 3,3,5-trimethylindolenine, and 3,3,7-trimethylindolenine), 2-pyridines (e.g. pyridine and 5-methylpyridine), and 4-pyridine (e.g. pyridine). These ring substituents may be combined with each other to form a ring.

Examples of the sulfur-containing heterocycle include dithiol partial structures in dyes described in JP-A No. 3-296759.

Specific examples thereof include benzodithiols (e.g. benzodithiol, 5-t-butylbenzodithiol, and 5-methylbenzodithiol), naphthodithiols (e.g. naphtho[1,2]dithiol and naphtho[2,1]dithiol), dithiols (e.g. 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyano dithiol, 4-methoxycarbonylmethyldithiol, and 4-carboxymethyldithiol).

In the formula (12), among the examples of nitrogen-containing or sulfur-containing heterocycles formed by Y together with the above-described A and adjacent carbon atom, the dye having a structure represented by the partial structural formula of the following formula (13) is particularly preferable because it offers a photosensitive composition having high sensitizing capacity and very excellent storage stability.

Formula (13)

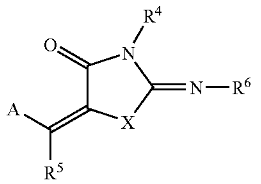

In the formula (13), A represents an optionally substituted aromatic ring or heterocycle, and X represents an oxygen atom, a sulfur atom, or —N($R^1$)—. $R^1$, $R^4$, $R^5$, and $R^6$ each independently represents a hydrogen atom or a monovalent group of nonmetal atoms, and A, $R^1$, $R^4$, $R^5$, and $R^6$ may be combined with each other to form an aliphatic or aromatic ring. In the formula (13), A and $R^1$ are each equivalent to those in the formula (12), $R^4$ is equivalent to $R^2$ in the formula (12), $R^5$ is equivalent to $R^3$ in the formula (12), and $R^6$ is equivalent to $R^1$ in the formula (12).

The compound represented by the formula (12) is further preferably a compound represented by the following formula (14).

Formula (14)

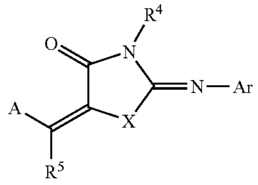

In the formula (14), A represents an optionally substituted aromatic ring or heterocycle, and X represents an oxygen atom, a sulfur atom, or —N($R^1$)—. $R^1$, $R^4$, and $R^5$ are each independently a hydrogen atom or a monovalent group of nonmetal atoms, and A, $R^1$, $R^4$, and $R^5$ may be combined with each other to form an aliphatic or aromatic ring. Ar represents a substituted aromatic ring or heterocycle. The sum total of the Hammett's values of the substituents on the Ar skeleton must be greater than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In the formula (14), A and $R^1$ are equivalent to those in the formula (12), $R^4$ is equivalent to $R^2$ in the formula (12), and $R^5$ is equivalent to R3 in the formula (12). Ar represents a substituted aromatic ring or heterocycle, and specific examples thereof include the same specific examples of the substituted aromatic ring or heterocycle as those listed for A in the description of the formula (12). The total sum of the Hammett's values of the substituents to be introduced into Ar in the formula (14) must be 0 or more. Examples of the substituents include a trifluoromethyl group, a carbonyl group, an ester group, a halogen atom, a nitro group, a cyano group, a sulfoxide group, an amide group, and a carboxyl group. The Hammett's value of these substituents are as follows: trifluoromethyl group (—$CF_3$, m: 0.43, p: 0.54); carbonyl group (e.g. —COH, m: 0.36, p: 0.43); ester group (—$COOCH_3$, m: 0.37, p: 0.45); halogen atom (e.g. Cl, m: 0.37, p: 0.23); cyano group (—CN, m: 0.56, p: 0.66); sulfoxide group (e.g. —$SOCH_3$, m: 0.52, p: 0.45); amide group (e.g. —$NHCOCH_3$, m: 0.21, p: 0.00); and carboxyl group (—COOH, m: 0.37, p: 0.45). The site of the substituent in the aryl skeleton and the Hammett's value of the substituent are listed inside the parentheses, and (m: 0.50) means that the Hammett's value of the substituent upon introduction into the meta position is 0.50. Preferable examples of Ar include a substituted phenyl group, and preferable examples of the substituent on the Ar skeleton include an ester group and a cyano group. The substituent is particularly preferably located in the ortho position on the Ar skeleton.

Preferable specific examples of the sensitizing dye represented by the formula (12) (exemplary compounds D1 to D57) are shown below, however the invention is not limited to them. Among them, exemplary compounds D2, D6, D10, D18, D21, D28, D31, D33, D35, D38, D41, and D45 to D57 correspond to the compound represented by the formula (13).

(D1)

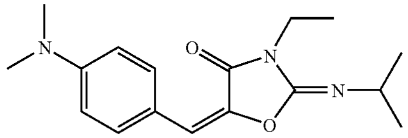

(D2)

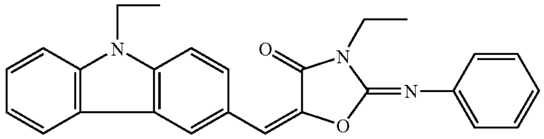

(D3)

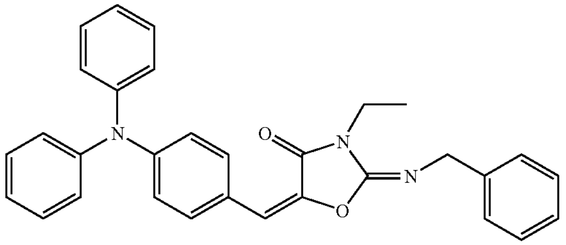

(D4)

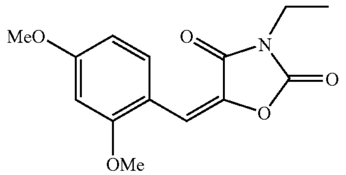

(D5)

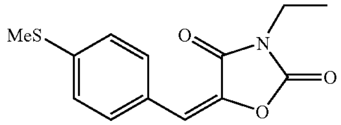

(D6)

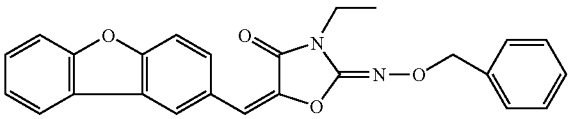

(D7)

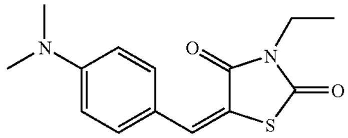

(D8)

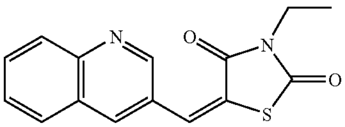

(D9)

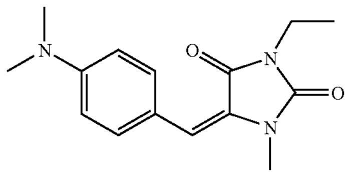

-continued
(D10)
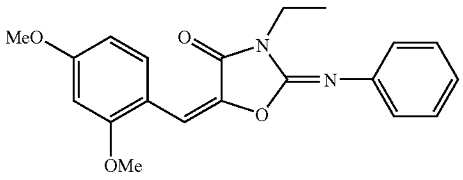
(D11)
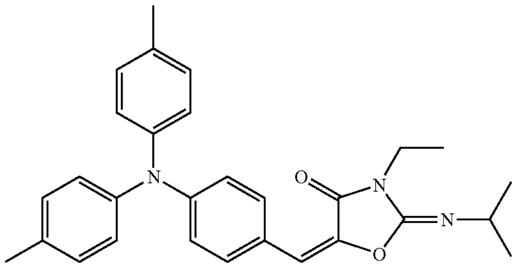
(D12)
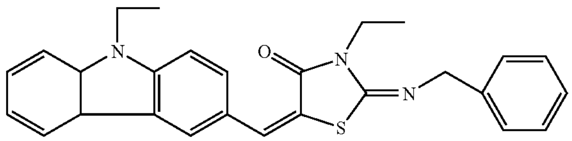
(D13)
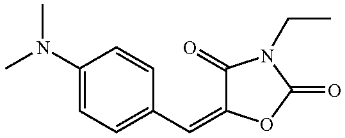
(D14)
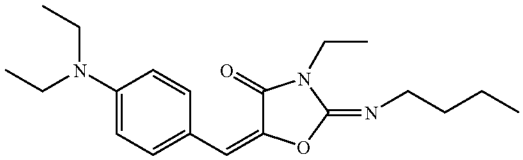
(D15)
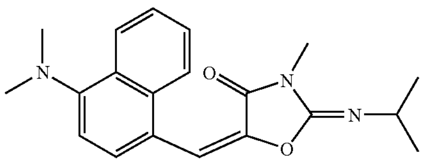
(D16)
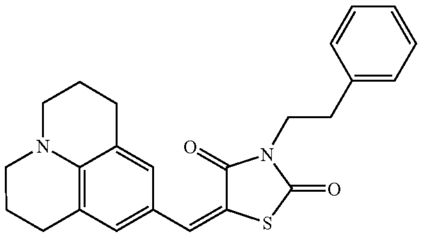
-continued
(D17)
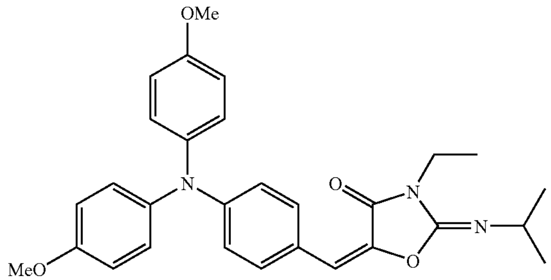
(D11)
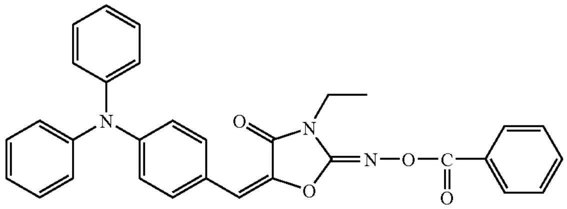
(D19)
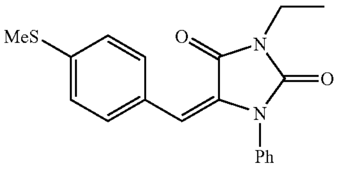
(D20)
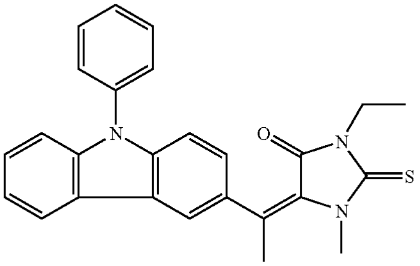
(D21)
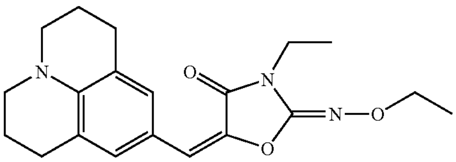
(D22)
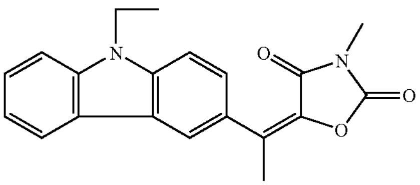
(D23)
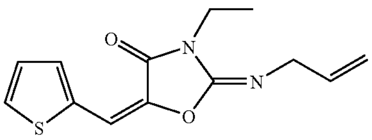

-continued
(D24)
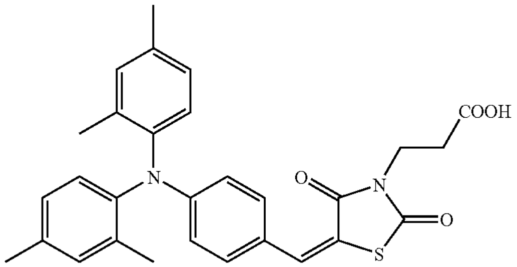
(D25)
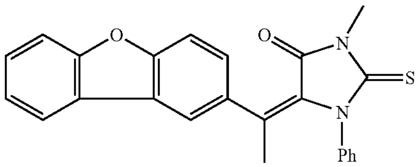
(D26)
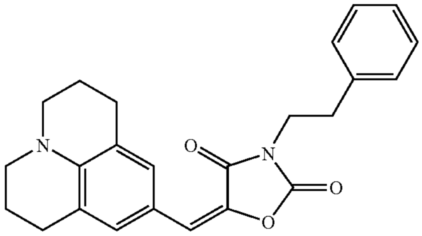
(D27)
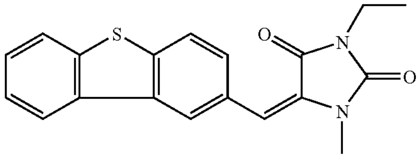
(D28)
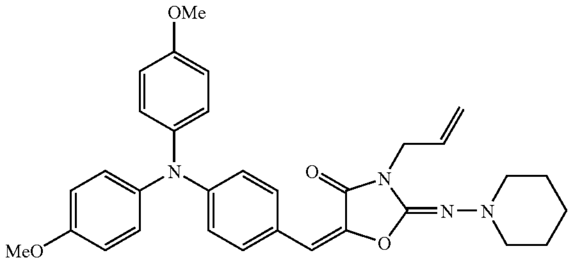
(D29)
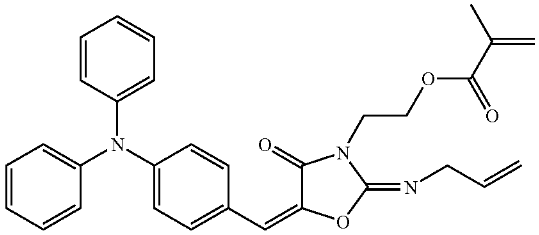
(D30)
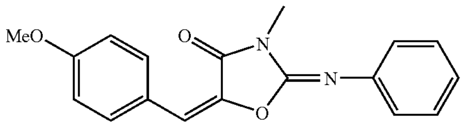
-continued
(D31)
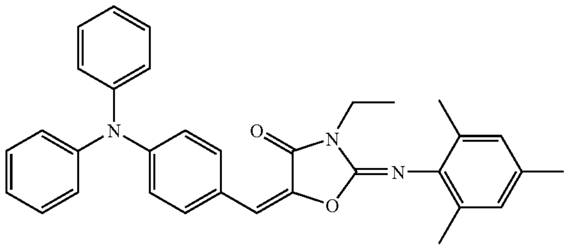
(D32)
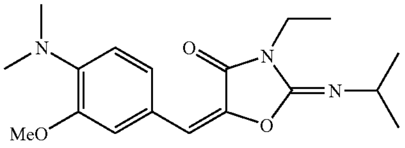
(D33)
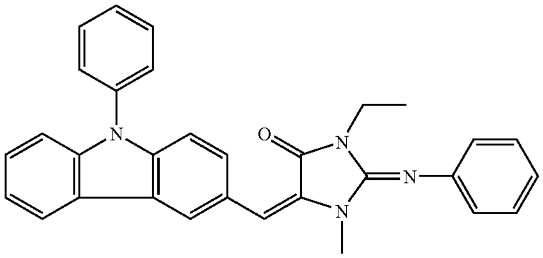
(D34)
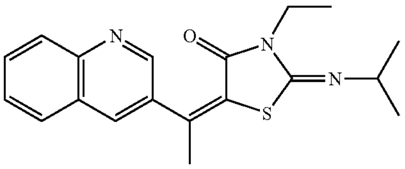
(D35)
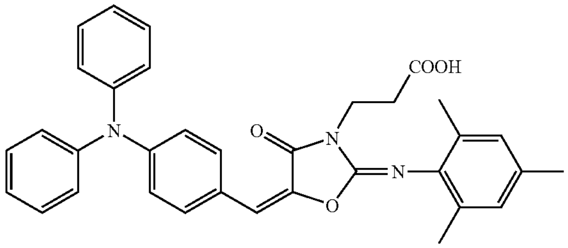
(D36)
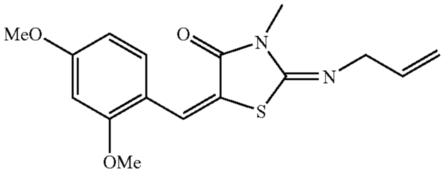
(D37)
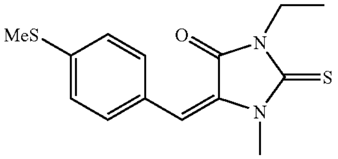

-continued
(D38)
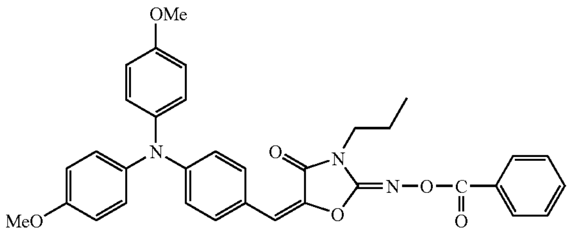
(D39)
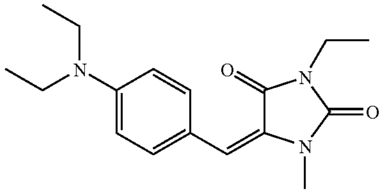
(D40)
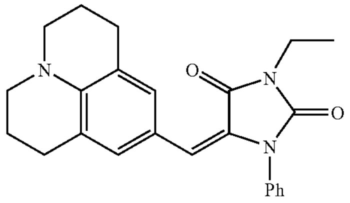
(D41)
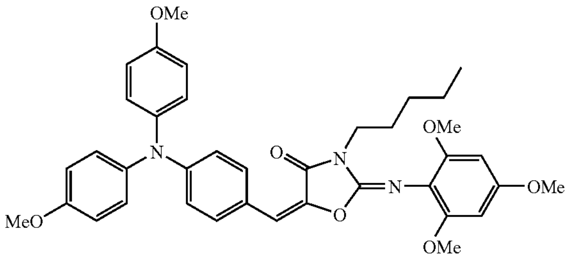
(D42)
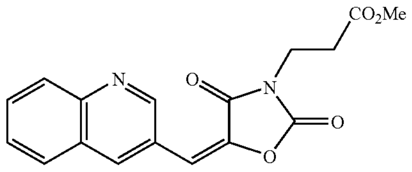
(D43)
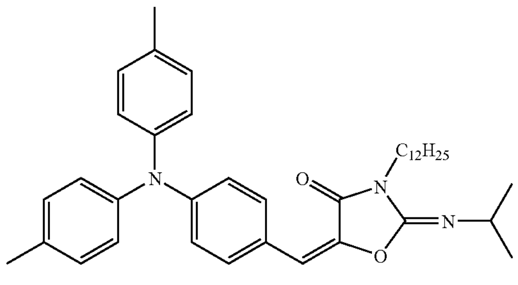
-continued
(D44)
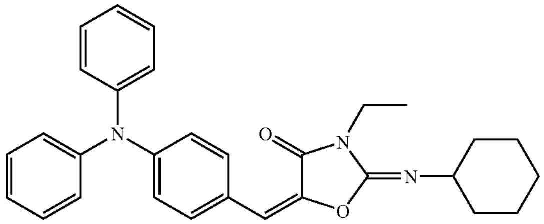
(D45)
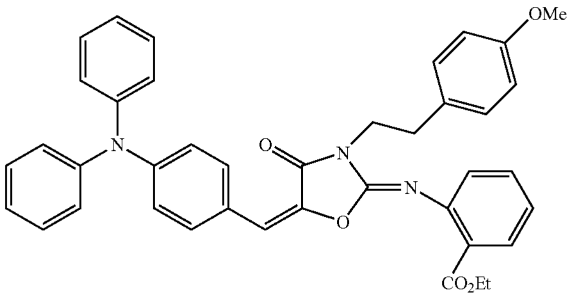
(D46)
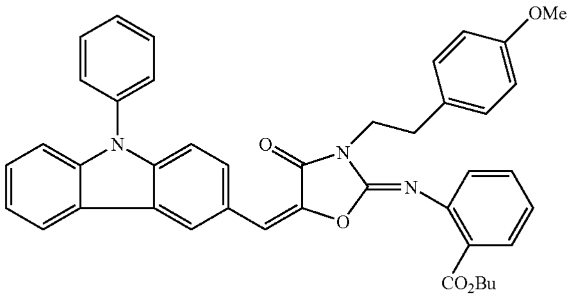
(D47)
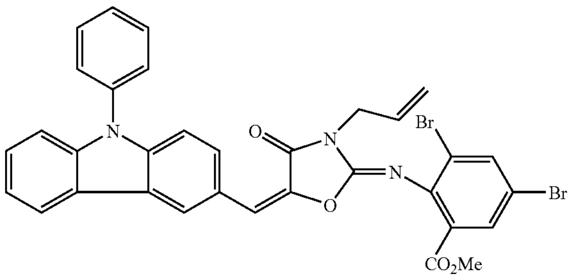
(D48)
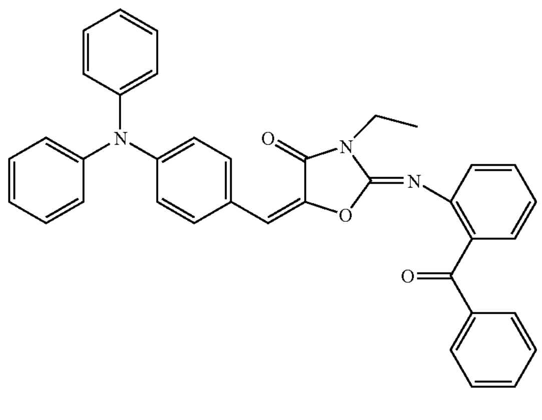

-continued (D49)

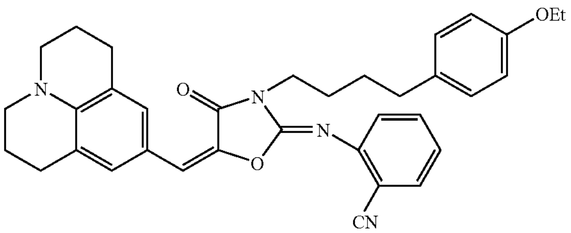

(D50)

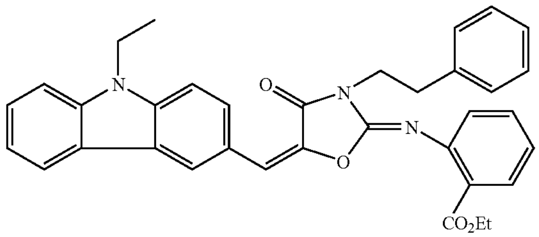

(D51)

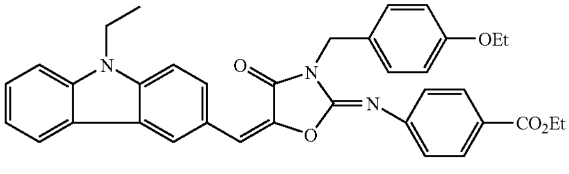

(D52)

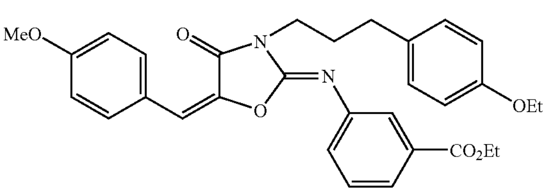

(D53)

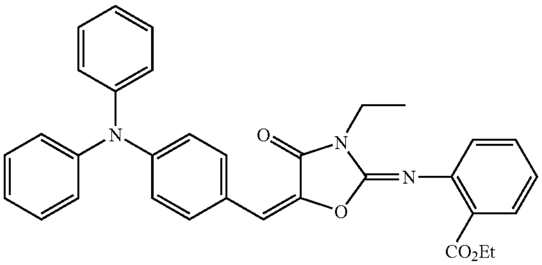

(D54)

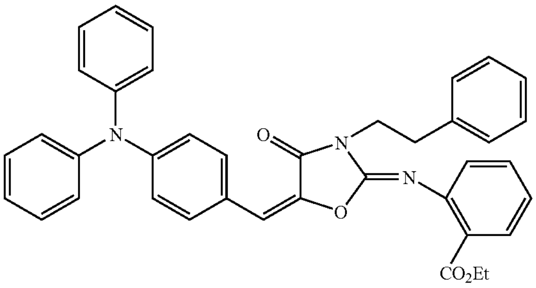

-continued (D55)

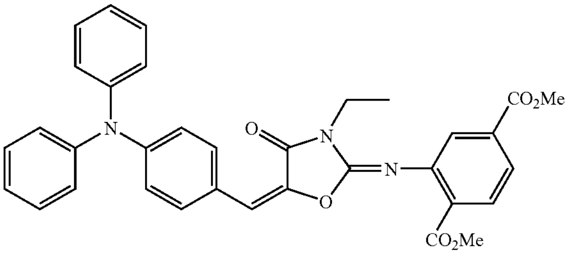

(D56)

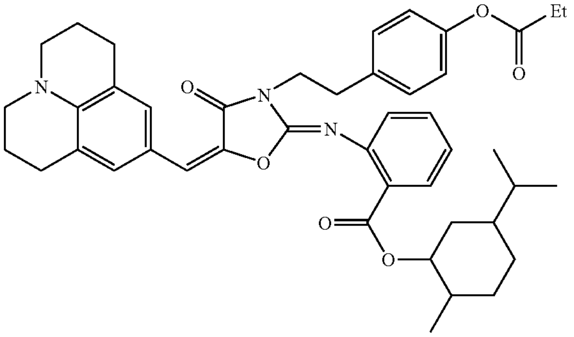

(D57)

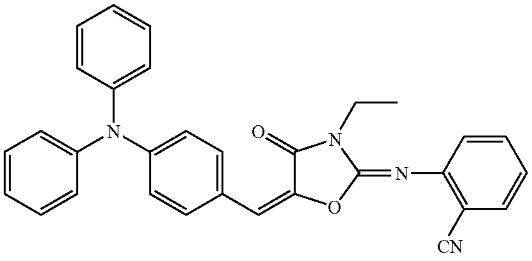

The method for synthesizing the compound represented by the formula (12) is described below.

The compound represented by the formula (12) is usually prepared by condensation reaction between an acidic nucleus having an active methylene group and a substituted or non-substituted aromatic ring or heterocycle, which can be synthesized with respect to JP-B No. 59-28329. Examples of the reaction method include condensation reaction between an acidic nuclear compound and a basic nuclear material having an aldehyde group or a carbonyl group on the heterocycle, as shown in the following reaction formula (1). The condensation reaction is conducted, as necessary, in the presence of a base. The base may be freely selected from generally used bases such as amines, pyridines (e.g. trialkylamine, dimethylamino pyridine, and diazabicycloundecene DBU), metal amides (e.g. lithium diisopropylamide), metal alkoxides (e.g. sodium methoxide and potassium-t-butoxide), and metal hydrides (e.g. sodium hydride and potassium hydride).

(1)

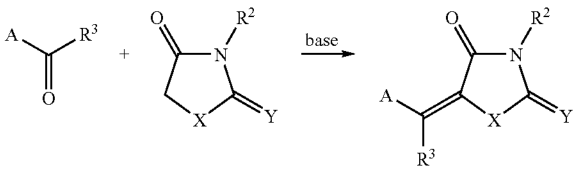

Examples of the other preferable synthesis method include a method according to the following reaction formula (2). More specifically, an acidic nuclear compound in which Y is a sulfur atom is used as the starting material in the reaction formula (1), and condensed with a basic nuclear material having an aldehyde group or a carbonyl group on the heterocycle to form a dye precursor in the same manner as the reaction formula (1), thereafter the dye precursor is further reacted with a metal salt, which chemically interacts with a sulfur atom to form a metal sulfide, and water or a primary amine compound (R—$NH_2$, wherein R represents a monovalent group of nonmetal atoms).

Among them, the reaction represented by the reaction formula (2) provides a high yield in each reaction, and particularly preferable from the viewpoint of synthesis efficiency. In particular, the reaction represented by the reaction formula (2) is useful for the synthesis of the compound represented by the formula (13).

(2)

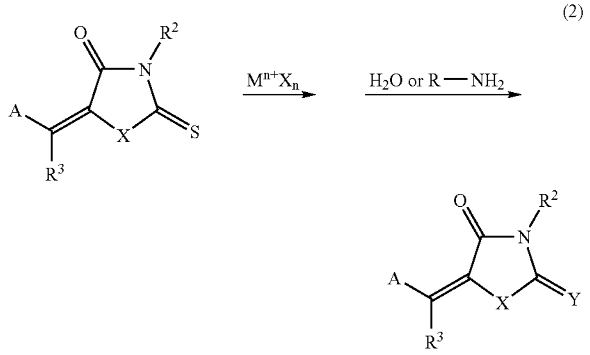

In the reaction formula (2), $M^n$+$X^n$ represents a metal salt which chemically interacts with a sulfur atom in the thiocarbonyl group to form a metal sulfide. Specific examples of the compound include AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_3)_2$, $Hg(NO_2)_2$, $HgBr_2$, $HgSO_4$, $Hg_2I_2$, $Hg_2SO_4$, $Hg(CH_3CO_2)_2$, AuBr, $AuBr_3$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$, in which M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, or the like, and X is F, Cl, Br, I, $NO_3$, $SO_4$, $NO_2$, $PO_4$, $CH_3CO_2$, or the like. Among them, a silver salt is a most preferable metal salt because it readily interacts with a sulfur atom.

The sensitizing dye represented by the formula (12) can be subjected to various chemical modification to improve the property of the image recording layer. For example, the sensitizing dye may be combined with an addition polymerizable compound structure (e.g. an acryloyl group or a methacryloyl group) through a covalent bond, an ionic bond, a hydrogen bond, or the like to increase the strength of the light-exposed film and suppress the unnecessary deposition of dyes from the light-exposed film.

Further, photosensitivity can be remarkably enhanced under particularly low concentration of an optical initiation system, by bonding the sensitizing dye with the above-described radical generating partial structure in the initiator compound (e.g. reduction decomposable sites such as alkyl halide, onium, peroxide, and biimidazole, and oxidation disintegrating sites such as borate, amine, trimethylsilylmethyl, carboxymethyl, carbonyl, and imine).

Further, in the case where the image recording material of the invention is used as a negative-working-working planographic printing plate precursor which is a preferable aspect of the invention, it is effective to introduce a hydrophilic site (acid groups or polar groups such as a carboxyl group and esters thereof, a sulfonic group and esters thereof, and an ethylene oxide group). Particularly, an ester type hydrophilic group exhibits excellent compatibility in the photosensitive layer due to its relatively hydrophobic structure, and generates an acid group upon hydrolysis to increase its hydrophilicity in a developer.

Additionally, for example, a substituent may be introduced as appropriate to improve compatibility in the photosensitive layer and to suppress crystal deposition. For example, in a certain kind of photosensitive system, an unsaturated bond such as an aryl group or an allyl group may be considerably effective at improving the compatibility. Besides, crystal deposition is remarkably suppressed by introducing steric hindrance between the π planes of the dye through introduction of a branched alkyl structure or other method. Further, adhesiveness of a metal, metal oxide and the like to an inorganic substance is improved by introducing a phosphonate group, an epoxy group, a trialkoxysilyl group, or the like. Alternatively, polymerization of the sensitizing dye or other methods may be used according to the intended use.

The sensitizing dye used the invention preferably includes at least one sensitizing dye represented by the formula (12). Within a range represented by the formula (12), details of the use-what structure is used (e.g. the above-described modification), whether they are used alone or in combination of two or more of them, and the addition amount-can be determined as appropriate in accordance with the performance and design of the final photosensitive material. For example, the combination of two or more kinds of sensitizing dyes improves the compatibility with the image recording layer.

The selection of the sensitizing dye largely depends on its photosensitivity and molar extinction coefficient at the luminescence wavelength of the light source to be used. The use of a dye having a large molar extinction coefficient can relatively decrease the addition amount of the dye, which is economical and beneficial to the physical property of the image recording layer.

In the invention, other general-purpose sensitizing dyes except for the sensitizing dye represented by the formula (12) may be used within a range which does not impair the effect of the invention.

(Infrared Ray Absorbing Agent)

When the imaging material of the presentinvention invention is made to responsive to a laser light source emitting infrared rays having wavelengths of from 760 to 1,200 nm, an infrared ray absorbing agent having the absorption maximum in the wavelength range is usually used as a sensitizing dye. The infrared ray absorbing agent is capable of absorbing infrared rays and converting them into heat. A radical generator (polymerization initiator) is heat-decomposed by the heat generated upon light exposure, and generates radicals. The infrared ray absorbing agent used in the invention is a dye or pigment having an absorption maximum at wavelengths of from 750 nm to 850 nm.

The dye may be a commercially available dye or a known dye as described in reference documents such as "Senryo Binran (Dye Handbook) (edited by The Society of Synthetic Organic Chemistry, Japan 1970). Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salt, and metal thiolate complex dyes.

Preferable examples of dyes include cyanine dyes described in JP-A No. 58-125246, JP-A No. 59-84356, JP-A No. 59-202829, and JP-A No. 60-78787, methine dyes described in JP-A No. 58-173696, JP-A No. 58-181690, and JP-A No. 58-194595, naphthoquinone dyes described in JP-A No. 58-112793, JP-A No. 58-224793, JP-A No. 59-48187, JP-A No. 59-73996, JP-A No. 60-52940, and JP-A No. 60-63744, squarylium dyes described in JP-A No. 58-112792, and cyanine dyes described in U.K. Patent No. 434,875.

Near-infrared absorbing sensitizers described in U.S. Pat. No. 5,156,938 are also preferably used. A substituted arylbenzo(thio)pyrylium salt described in U.S. Pat. No. 3,881,924, a trimethinethiapyrylium salt described in JP-A No. 57-142645 (U.S. Pat. No. 4,327,169), pyrylium type compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts and the like described in U.S. Pat. No. 4,283,475 and pyrylium compounds disclosed in JP-B Nos. 5-13514 and 5-19702 are also preferably used.

Other preferable examples of the infrared absorbing dye may include near-infrared absorbing dyes described as formulae (I) and (II) in U.S. Pat. No. 4,756,993.

Other preferable examples of the infrared radiation absorption dye in the invention include specific indolenine cyanine dyes described in Japanese Patent Application No. 2001-6326, and Japanese Patent Application No. 2001-237840, which are shown below.

Particularly preferable among these dyes are cyanine colorants, phthalocyanine dyes, oxonol dyes, squarylium colorants, pyrylium salts, thiopyrylium dyes, and nickel thiolate complexes. From the viewpoint of sensitivity, preferable among these dyes are those represented by formulae (a) to (e) below, and cyanine colorants represented by formula (a) below are most preferable because they give high polymerization activity and are excellent in stability and economical efficiency when used in the recording layer in the invention.

Formula (a)

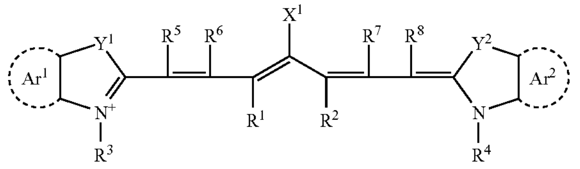

In the formula (a), $X^1$ represents a hydrogen atom, halogen atom, —$NAr^x_2$, $X^2$-$L^1$ or the group shown below. $Ar^x$ represents a $C_6$ to $C_{14}$ aromatic hydrocarbon group which may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. $X^2$ represents an oxygen atom, a sulfur atom

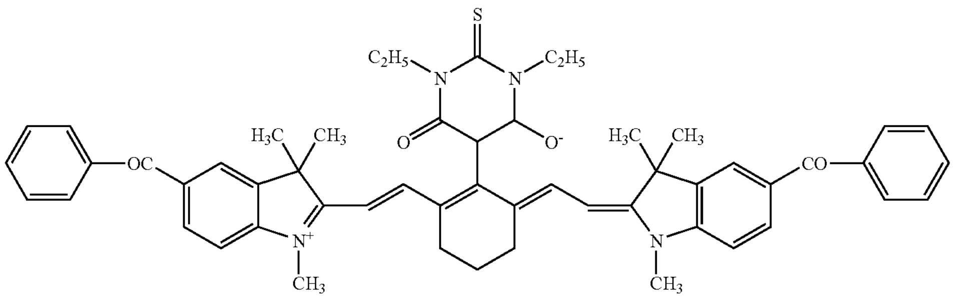

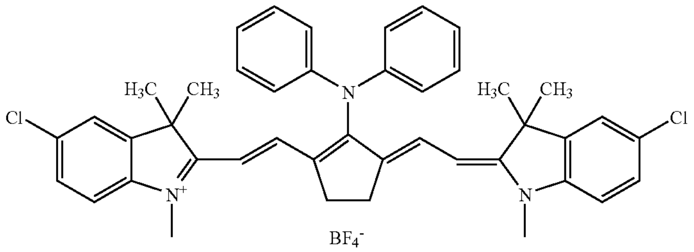

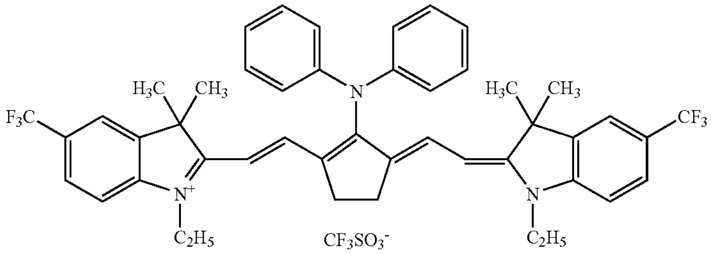

or —N($R^x$)— wherein $R^x$ represents a hydrogen atom or a $C_1$ to $C_{10}$ hydrocarbon group. $L^1$ represents a $C_1$ to $C_{12}$ hydrocarbon group, an aromatic ring having a heteroatom, or a $C_1$ to $C_{12}$ hydrocarbon group containing a heteroatom. The term "heteroatom" used herein refers to an atom selected from N, S, O, a halogen atom or Se.

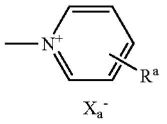

In the above formula, $X_a^-$ has the same definition as that of $Z_a^-$ defined later, and $R^a$ represents a hydrogen atom or a substituent selected from an alkyl group, an aryl group, a substituted or unsubstituted amino group, or a halogen atom.

$R^1$ and $R^2$ each independently represent a $C_{1-12}$ hydrocarbon group. For the storage stability of the recording layer coating liquid, each of $R^1$ and $R^2$ is preferably a hydrocarbon group containing two or more carbon atoms, and more preferably $R^1$ and $R^2$ are bound to each other to form a 5- or 6-membered ring.

$Ar^1$ and $Ar^2$ may be the same or different, and each independently represent an aromatic hydrocarbon group which may have a substituent. The aromatic hydrocarbon group is preferably a benzene ring or a naphthalene ring. The substituent is preferably a hydrocarbon group containing 12 or less carbon atoms, a halogen atom or an alkoxy group containing 12 or less carbon atoms. $Y^1$ and $Y^2$ may be the same or different, and each independently represent a sulfur atom or a dialkyl methylene group containing 12 or less carbon atoms. $R^3$ and $R^4$ may be the same or different, and each independently represent a hydrocarbon group containing 20 or less carbon atoms which may have a substituent. The substituent is preferably an alkoxy group containing 12 or less carbon atoms, a carboxyl group or a sulfo group. $R^5$, $R^6$, $R^7$ and $R^8$ may be the same or different, and each independently represent a hydrogen atom or a hydrocarbon group containing 12 or less carbon atoms. Each of $R^5$, $R^6$, $R^7$ and $R^8$ is preferably a hydrogen atom because the starting material is easily available. $Z_a^-$ represents a counter anion. However, when the cyanine colorant represented by the formula (A) has an anionic substituent in its structure and does not necessitate neutralization of the charge, $Z_a^-$ is not necessary. Because of the storage stability of the recording layer coating liquid, $Z_a^-$ is preferably a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Specific examples of the cyanine colorants represented by the formula (a), which can be used preferably in the invention, include not only those illustrated below, but also those described in paragraph numbers (0017) to (0019) in JP-A No. 2001-133969, paragraph numbers (0012) to (0038) in JP-A No. 2002-40638, and paragraph numbers (0012) to (0023) in JP-A No. 2002-23360.

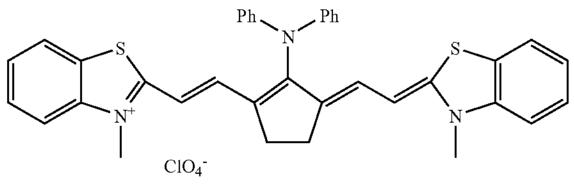

-continued

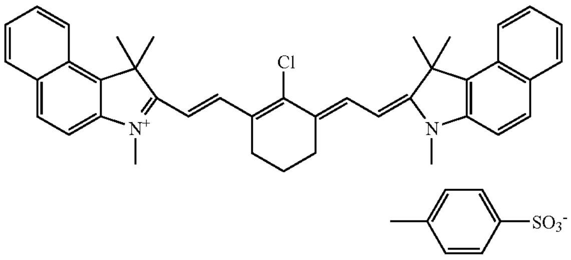

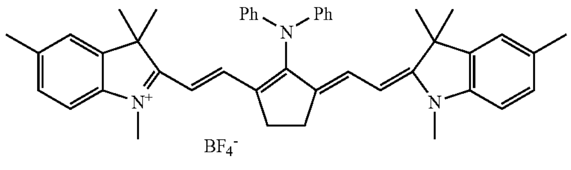

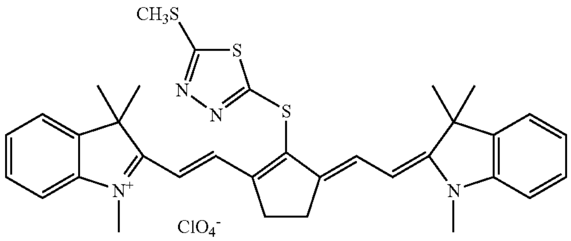

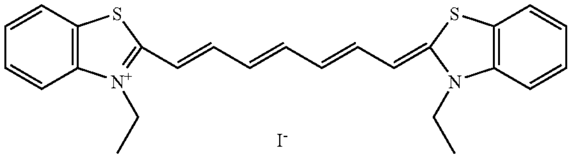

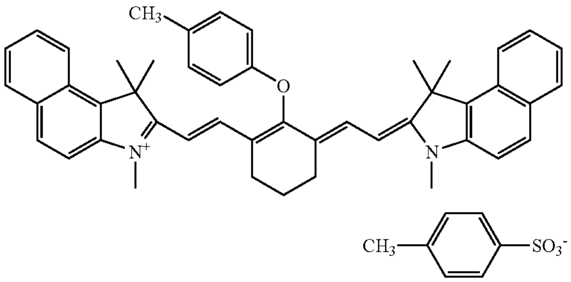

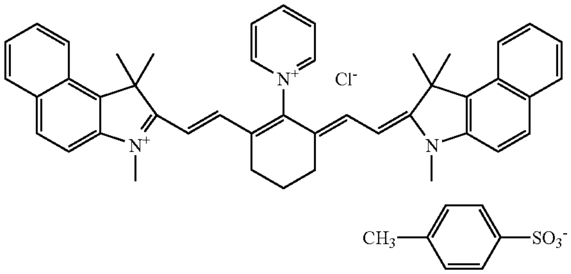

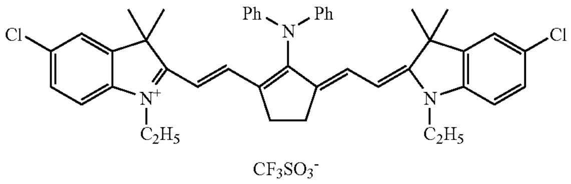

-continued

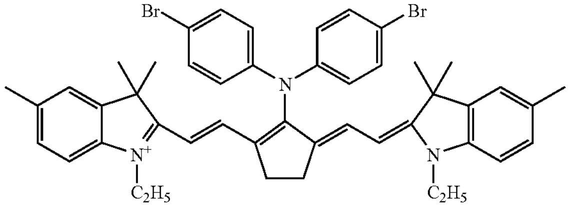

$ClO_4^-$

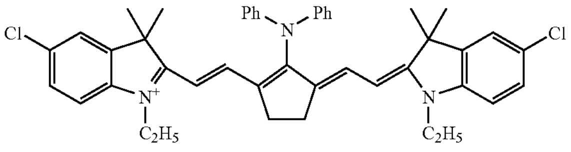

$BF_4^-$

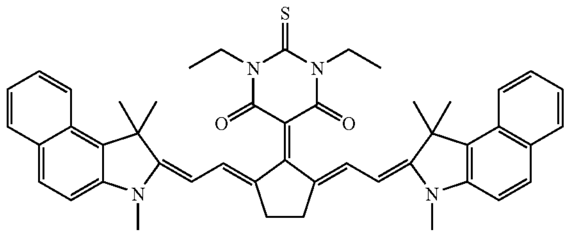

Formula (b)

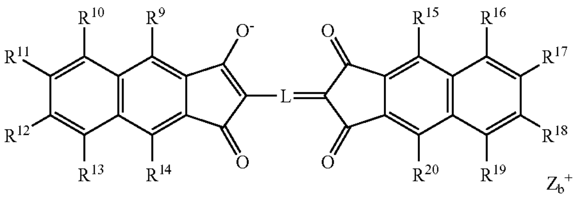

In the formula (b), L represents a methine chain containing 7 or more conjugated carbon atoms, and the methine chain may have a substituent, and the substituents may be bound to each other to form a ring structure. $Z_b^+$ represents a counter cation. The counter cation is preferably ammonium, iodonium, sulfonium, phosphonium, pyridinium or an alkali metal cation ($Ni^+$, $K^+$, $Li^+$). $R^9$ to $R^{14}$ and $R^{15}$ to $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group or an amino group, or a substituent composed of a combination of two or three such substituents which may be bound to each other to form a ring structure. Among the compounds of the formula (B), those having a methine chain containing 7 conjugated carbon atoms as L, and those in which each of $R^9$ to $R^{14}$ and $R^{15}$ to $R^{20}$ represents a hydrogen atom, are preferable from the viewpoint of easy availability and effects.

Examples of the dyes represented by the formula (b), which can be used preferably in the invention, include those illustrated below:

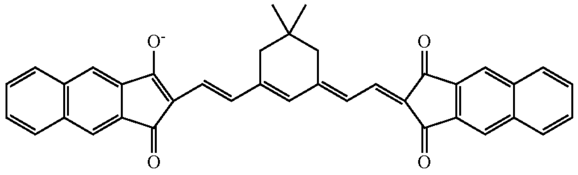

$n\text{-}Bu_4N^+$

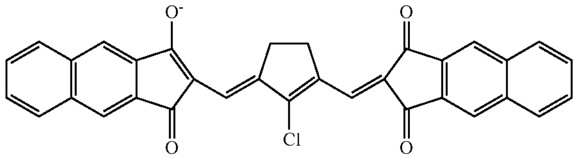

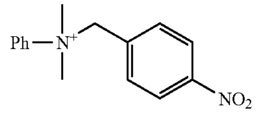

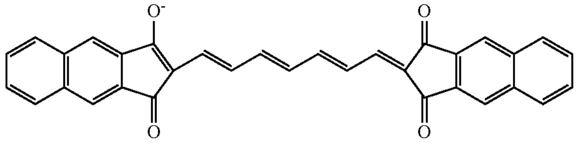

$Me_4N^+$

Formula (c)

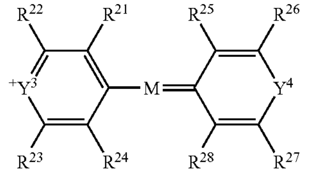

$Z_a^-$

In the formula (c), $Y^3$ and $Y^4$ each independently represent an oxygen atom, a sulfur atom, a selenium atom or a tellurium atom; M represents a methine chain containing 5 or more conjugated carbon atoms; $R^{21}$ to $R^{24}$ and $R^{25}$ to $R^{28}$ may be the same as or different from one another, and each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; and $Z_a^-$ represents a counter anion and has the same definition as that of $Z_a^-$ in the formula (a) above.

Examples of the dyes represented by the formula (c), which can be used preferably in the invention, include those illustrated below:

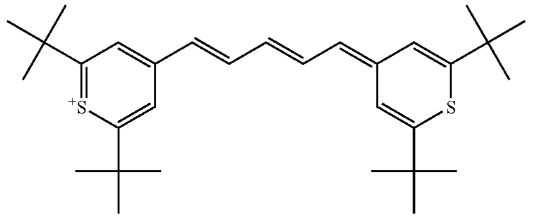

$BF_4^-$

-continued

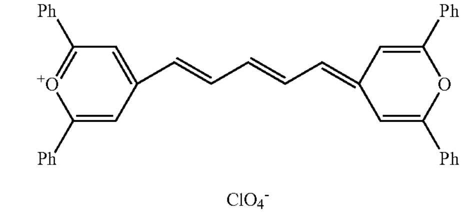

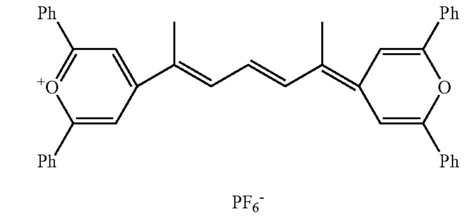

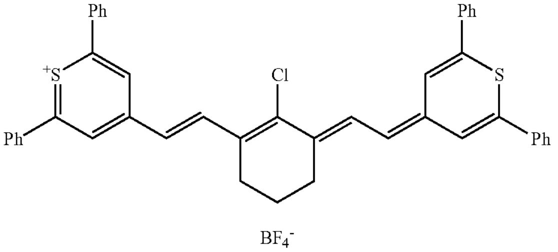

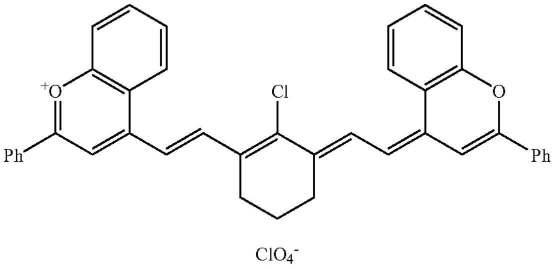

Formula (d)

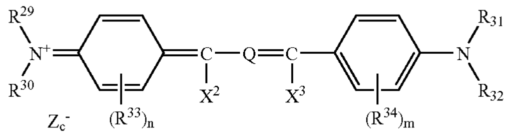

In the formula (d), $R^{29}$ to $R^{31}$ each independently represent a hydrogen atom, an alkyl group or an aryl group; $R^{33}$ and $R^{34}$ each independently represent an alkyl group, a substituted oxy group or a halogen atom; n and m each independently represent an integer of 0 to 4; $R^{29}$ and $R^{30}$, or $R^{31}$ and $R^{32}$, may be bound to each other to form a ring; $R^{29}$ and/or $R^{30}$ may be bound to $R^{33}$ to form a ring; $R^{31}$ and/or $R^{32}$ may be bound to $R^{34}$ to form a ring; when plural $R^{33}$s are present, some of $R^{33}$s may be mutually bound to form a ring; when plural $R^{34}$s are present, some of $R^{34}$s may be mutually bound to form a ring; $X^2$ and $X^3$ each independently represent a hydrogen atom, an alkyl group or an aryl group, and at least one of $X^2$ and $X^3$ represents a hydrogen atom or an alkyl group; Q is an optionally substituted trimethine group or pentamethine group which may form a ring structure with a divalent organic group; and $Zc^-$ represents a counter anion and has the same definition as that of $Z_a^-$ in the formula (A) above.

Examples of the dyes represented by the formula (d), which can be used preferably in the invention, include those illustrated below:

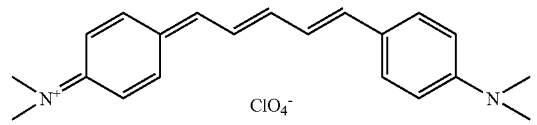

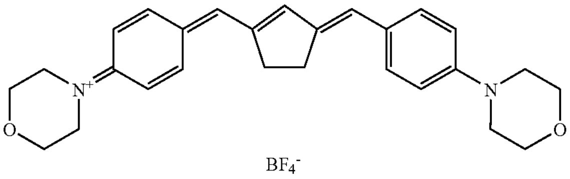

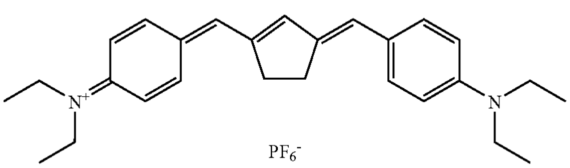

Formula (e)

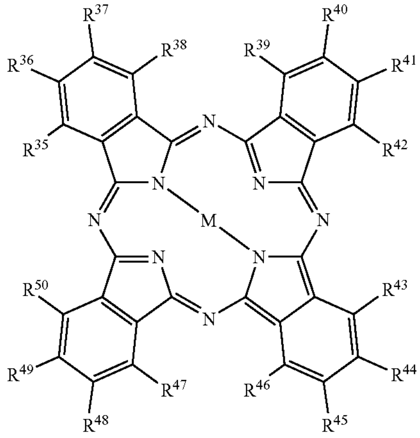

In the formula (e), $R^{35}$ to $R^{50}$ each independently represent a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent; and M represents two hydrogen atoms, a metal atom, a halometal group or an oxymetal group, and examples of the metal atom contained therein include the groups IA, IIA, IIIB and IVB atoms in the periodic table, the transition metals in the first, second and third periods, and lanthanoid elements, among which copper, magnesium, iron, zinc, cobalt, aluminum, titanium and vanadium are preferable.

Examples of the dyes represented by the formula (e), which can be used preferably in the invention, include those illustrated below:

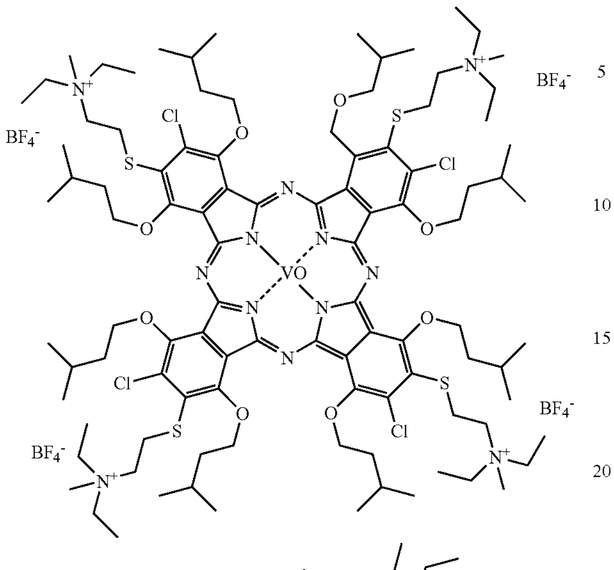

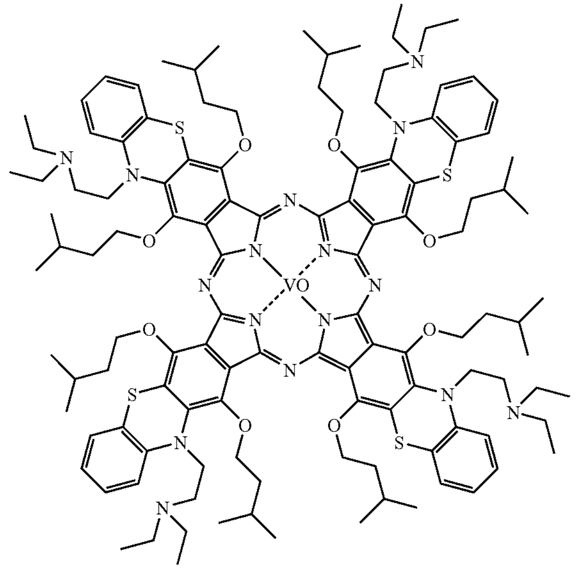

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

The particle diameter of the pigment is preferably in a range of from 0.01 to 10 μm, more preferably from 0.05 to 1 μm, still more preferably from 0.1 to 1 μm. A pigment particle diameter of less than 0.01 μm is not preferable in respect of the stability of a pigment dispersion in the image recording layer coating liquid, whereas a particle diameter of more than 10 μm is not preferable in respect of the uniformity of the image recording layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryho Oyo Gijyutsu" (Newest Pigment Applied Technology) (published in 1986 by CMC Shuppan).

The sensitizer (D) in the invention is preferably a cyanine dye.

From the viewpoint of sensitivity, the sensitizer (D) is more preferably a cyanine dye represented by the formula (A). Among colorants represented by the formula (A), cyanine dye in which $X^1$ is a diarylamino group or $X^2$-$L^1$ is preferable, and those having a diaryl amino group are more preferable.

A cyanine dye having an electron-withdrawing group or a heavy atom-containing substituent at each of indolenine sites at both terminals is also preferable, and for example, the one described in Japanese Patent Application No. 2001-6323 is preferably used. A cyanine dye which has an electron-withdrawing group at each of indolenine sites at both terminals, and which has a diarylamino group as $X^1$ is most preferable.

In the invention, an addition amount of a sensitizing dye (D), since the photosensitivity, resolution power and film characteristics of an image recording layer are largely affected by the absorbance at an wavelength of a light source, is appropriately selected by considering these.

For instance, when an image recording material of the invention is used in a lithographic printing plate precursor having an image recording layer having a relatively thin film thickness, an addition amount of the sensitizing dye is set so that the absorbance of the image recording layer may be set in a range of 0.1 to 1.5 and preferably in a range of 0.25 to 1.

Furthermore, when an infrared absorbing agent is used as a sensitizing dye, from the viewpoint of the sensitivity, the optical density at the absorption maximum in a range of wavelength from 760 to 1200 nm of the image recording layer is preferably in a range of 0.1 to 3.0.

Since the optical density is determined by an addition amount of the sensitizing dye and a thickness of the image recording layer, predetermined optical density can be obtained by controlling conditions thereof. The absorbance of the image recording layer can be measured according to a standard method. As a measurement method, for instance, a method where, on a transparent or white support, an image recording layer having a thickness where a dry coated amount is appropriately determined in a range necessary as a lithographic printing plate is formed, followed by measuring by use of transmission type optical densitometer, and a method where a recording layer is formed on a reflective support such as aluminum and the reflection density is measured can be cited.

An addition amount of the sensitizing dye to an image recording layer is, based on a total solid content in the image recording layer, in a range of 0.5 to 30% by mass, preferably in a range of 0.1 to 20% by mass and more preferably in a range of 0.2 to 10% by mass. The addition amount in a range is preferred because the sensitivity of characteristics variation due to exposure is high to be able to obtain high sensitivity and there is no care in that the uniformity and strength of the film are adversely affected.

The sensitizing dyes (D) in the invention may be used singularly or in a combination of at least two kinds thereof.

When the image recording material of the invention is applied as a negative-working lithographic printing plate precursor, the sensitizing dyes (D) such as the infrared absorbing agents added to improve the sensitivity of the image recording layer and to promote curing thereof may be added to an image recording layer or to a separate layer such as a top coat layer or a undercoat layer separately disposed.

An image recording layer containing the respective above-described components can be produced by preparing an image recording layer forming coating solution containing the respective components, followed by coating on an appropriate support.

Examples of solvents that are used in the image recording layer forming coating solution include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butylolactone, methyl lactate and ethyl lactate. These solvents can be used singularly or in a combination of at least two kinds thereof. A concentration of a solid content in the coating solution is adequate to be in a range of 2 to 50% by mass.

A coating amount of the image recording layer forming coating solution on a support is desirably appropriately selected depending on usage considering effects on the sensitivity and the developability of an image recording layer and the mechanical strength and press life of an exposed film.

More specifically, in general, a coating amount is preferred to be substantially in a range of 0.1 to 10 $g/m^2$ based on dry mass and more preferred to be in a range of 0.5 to 5 $g/m^2$.

<Support>

A support used in an image recording material of the invention, as far as it has a function of holding an image recording layer and a specific protective layer, without restricting particularly to paper, plastics or metals, depending on usage of the image recording material, can be appropriately selected.

A support that is used when an image recording material of the invention is applied to a negative-working lithographic printing plate precursor will be described below.

An image recording material of the invention can be obtained when, on a support, an image recording layer containing the respective components is formed, and, further on the image recording layer, the specific protective layer is formed.

Such an image recording material of the invention, in all modes where an image recording material is exposed to cure and an unexposed portion is alkali-developed and removed to form an image, can be applied to various kinds of fields such as a lithographic printing plate precursor, resist and coating. Particularly, since an image can be formed at high sensitivity, the alkali developability is excellent and the scratch resistance is excellent, the image recording material of the invention is preferred to use as a negative-working lithographic printing plate precursor.

In what follows, a case where the image recording material of the invention is applied to a negative-working lithographic printing plate precursor that is a preferable mode of the invention is described as an example. However, applications of the image recording material of the invention are not restricted thereto.

[Layer Configuration of Negative-working Lithographic Printing Plate Precursor]

In what follows, a layer configuration when an image recording material of the invention is applied to a negative-working lithographic printing plate precursor will be described.

The negative-working lithographic printing plate precursor includes, on a support, at least a photosensitive layer that contains the respective components of a polymerizable compound (A) and a polymerization initiator (B), as needs arise, a binder polymer (C) and a sensitizing dye (D), and the specific protective layer in this order, and, as needs arise, may be provided with other layers such as an intermediate layer, an undercoat layer and a back coat layer.

(Photosensitive Layer)

A photosensitive layer having an image forming function in a negative-working lithographic printing plate precursor involving the invention will be described.

A photosensitive layer of a negative-working lithographic printing plate precursor in the invention preferably includes a polymerizable compound (A), a polymerization initiator (B), a binder polymer (C) and a sensitizing dye (D).

In the photosensitive layer, the polymerization initiator (B) works in particular as a polymerization initiator that starts and promotes polymerizing the polymerizable compound (A).

Furthermore, the polymerizable compound (A) that is used in the photosensitive layer is a compound as detailed in the description of the polymerization initiator (B). However, what kind of a compound is used is appropriately selected in association with, other than the above-described requirements, a support described below or the above-described specific protective layer. For instance, in order to improve the adhesiveness with a support or a specific protective layer, a compound having a particular structure may be selected and used.

Other than the above, in the usage of the polymerizable compound (A), from the viewpoints such as a degree of polymerization hindrance to oxygen, the resolution power, the fogging, the refractive index change and the surface tackiness, appropriate structure, composition and addition amount may be arbitrarily selected. Furthermore, as needs arise, a layer structure and a coating method such as undercoat or top coat may be carried out.

(E) Other Components

When the image recording material of the invention is applied to a negative-working lithographic printing plate precursor, in a photosensitive layer or a photosensitive layer forming coating solution, other components suitable for the usage and a production method thereof may be further appropriately added.

In what follows, preferable additives will be described.

(E-1) Cosensitizing Agent

A photosensitive layer of a negative-working lithographic printing plate precursor may include a cosensitizing agent to further improve the sensitivity. An action mechanism of a cosensitizing agent, though not clear, is considered to base mainly on a following chemical process. That is, it is assumed that various intermediate active species (radicals and cations) generated in the course of a photoreaction initiated by a thermal polymerization initiator and a subsequent addition polymerization reaction and a cosensitizing agent react to newly generate active radicals. These are largely categorized into (i) one that is reduced to generate an active radical, (ii) one that is oxidized to generate an active radical and (iii) one that reacts with a radical low in the activity to convert into a more active radical or to work as a chain transfer agent. However, as to whether individual compounds belong to which category or not, in many cases, there is no commonly accepted theory.

(i) Compounds that generates an active radical by reduction are shown below.

Compounds having a carbon-halogen bond: it is considered that a carbon-halogen bond is reductively cleaved to generate an active radical. Specifically, for instance, trihalomethyl-s-triazines and trihalomethyloxadiazoles can be preferably used.

Compounds having a nitrogen-nitrogen bond: it is considered that a nitrogen-nitrogen bond is reductively cleaved to generate an active radical. Specifically, hexaarylbiimidazoles can be preferably used.

Compounds having an oxygen-oxygen bond: it is considered that an oxygen-oxygen bond is reductively cleaved to generate an active radical. Specifically, for instance, organic peroxides can be preferably used.

Onium compounds: it is considered that a carbon-hetero atom bond or an oxygen-nitrogen bond is reductively cleaved to generate an active radical. Specifically, for instance, diaryliodonium salts, triarylsulfonium salts and N-alkoxypyridinium (azinium) salts can be preferably used.

Ferrocene and iron arene complexes: these can reductively generate an active radical.

(ii) Compounds generating an active radical by oxidation are shown below.

Alkylate complexes: it is considered that a carbon-hetero atom bond is oxidatively cleaved to generate an active radical. Specifically, for instance, triarylalkyl borates can be preferably used.

Alkylamine compounds: it is considered that a C—X bond on a carbon atom adjacent to a nitrogen atom is oxidatively cleaved to generate an active radical. X is preferably a hydrogen atom, a carboxyl group, a trimethylsilyl group or a benzyl group. Specific examples thereof include ethanolamines, N-phenylglycines, N-phenyliminodiacetic acid and a derivative thereof and N-trimethylsilylmethylanilines.

Sulfur- or tin-containing compounds: the amines described above with its nitrogen atom replaced with a sulfur atom or tin atom can generate an active radical similarly. In addition, S—S bond-containing compounds are also known to cause sensitization by S—S cleavage.

α-Substituted methyl carbonyl compounds: Capable of forming active radicals through the cleavage of the carbonyl-α carbon bond upon oxidation. Further, compounds obtained by replacing the carbonyl in such a compound with an oxime ether exhibit the same action. Specifically, examples include 2-alkyl-1-[4-(alkylthio) phenyl]-2-morpholinopronone-1 and derivatives thereof, as well as oxime ethers prepared by reacting such compounds with hydroxy amines and then etherifying N—OH.

Sulfinates: Capable of forming active radicals reductively. Specifically, sodium aryl sulfinates can be mentioned.

(iii) Compounds converted into highly active radicals through reaction with radicals, or compounds acting as chain transfer agents: For example, compounds having SH, PH, SiH or GeH in the molecule are usable. These compounds can form radials by donating hydrogen to radicals having low-activity or by undergoing oxidization and subsequent deprotonation. Specifically, for example, 2-mercaptobenzimidazoles can be mentioned.

In a preferable embodiment, a polycarboxylic acid compound containing an aromatic ring or heterocyclic aromatic ring structure to which at least two carboxyl groups are bonded directly or via a divalent linking group is contained for the purpose of improving sensitivity and/or developability. Specific examples of the polycarboxylic acid compound include (p-acetamidophenylimido) diacetic acid, 3-(bis(carboxymethyl)amino) benzoic acid, 4-(bis(carboxymethyl) amino) benzoic acid, 2-[(carboxymethyl)phenylamino]benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl) glycine, N,N'-1,3-phenylene-bis-glycine, N,N'-1,3-phenylenebis[N-(carboxymethyl)]glycine, N,N'-1,2-phenylenebis[N-(carboxymethyl)]glycine, N-(carboxymethyl)-N-(4-methoxyphenyl) glycine, N-(carboxymethyl)-N-(3-methoxyphenyl) glycine, N-(carboxymethyl)-N-(3-hydroxyphenyl) glycine, N-(carboxymethyl)-N-(3-chlorophenyl) glycine, N-(carboxymethyl)-N-(4-bromophenyl) glycine, N-(carboxymethyl)-N-(4-chlorophenyl) glycine, N-(carboxymethyl)-N-(2-chlorophenyl) glycine, N-(carboxymethyl)-N-(4-ethylphenyl) glycine, N-(carboxymethyl)-N-(2,3-dimethylphenyl) glycine, N-(carboxymethyl)-N-(3,4-dimethylphenyl) glycine, N-(carboxymethyl)-N-(3,5-dimethylphenyl) glycine, N-(carboxymethyl)-N-(2,4-dimethylphenyl) glycine, N-(carboxymethyl)-N-(2,6-dimethylphenyl) glycine, N-(carboxymethyl)-N-(4-formylphenyl) glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl) glycine, o-dianisidine-N,N,N',N'-tetraacetic acid, N,N'-[1,2-ethanediylbis (oxy-2,1-phenylene)]bis[N-(carboxymethyl) glycine], 4-carboxyphenoxy acetic acid, cathecol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy) diacetic acid, 2-(carboxymethylthio) benzoic acid, 5-amino-2-(carboxymethylthio) benzoic acid, and 3-[(carboxymethyl)thio]-2-naphthalene carboxylic acid.

In particular, N-arylpolycarboxylic acids represented by the following formula (V) or compounds represented by the following formula (VI) are preferable.

(V)

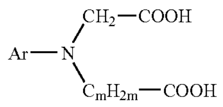

In formula (V), Ar represents a monosubstituted, polysubstituted or unsubstituted aryl group, and m is an integer from 1 to 5.

Examples of a substituent which can be introduced into the aryl group include a $C_1$ to $C_3$ alkyl group, a $C_1$ to $C_3$ alkoxy group, a $C_1$ to $C_3$ thioalkyl group and a halogen atom. This aryl group preferably has 1 to 3 identical or different substituents. m is preferably 1, and Ar preferably represents a phenyl group.

(VI)

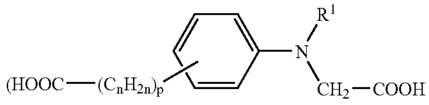

In formula (VI), $R^1$ represents a hydrogen atom or a $C_1$ to $C_6$ alkyl group, and each of n and p is an integer from 1 to 5. n is preferably 1, and $R^1$ is preferably a hydrogen atom. The most preferable polycarboxylic acid is anilinodiacetic acid.

Another compound preferable for improving sensitivity and/or developability is a compound having two or more groups selected from carboxylic acid groups and sulfonic acid groups, and specific examples thereof include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. The above compound can be further substituted by an alkyl group, an alkenyl group, an alkynyl group, a cyano group, a halogen atom, a hydroxyl group, a carboxyl group, a carbonyl group, an alkoxy group, an amino group, an amide group, a thiol group, a thioalkoxy group, or a sulfonyl group.

Among those described above, the most preferable compound is a compound represented by the formula (V) or (VI).

The amount of such poly(carboxylic acid/sulfonic acid) compound to be added is preferably 0.5 to 15 mass %, more preferably 1 to 10 mass %, still more preferably 3 to 8 mass %, based on the solid content of the polymerizable composition.

A large number of more specific examples of these co-sensitizers are described, for example, in JP-A No. 9-236913 as additives for improving sensitivity, and such compounds can also be used in the invention.

Only one co-sensitizer, or a combination of two or more co-sensitizers, may be used. The amount of the co-sensitizer to be used may be in a range of 0.05 to 100 parts by mass, preferably 1 to 80 parts by mass, more preferably 3 to 50 parts by mass, relative to 100 parts by mass of the polymerizable compound (A).

(E-2) Polymerization Inhibitor

In the invention, in addition to the basic components described above, a small amount of a heat-polymerization inhibitor is preferably added so as to prevent unnecessary heat polymerization of the polymerizable compound during production or storage of the composition used in the recording layer. Suitable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitrosophenyl hydroxylamine primary cerium salts. The amount of the heat-polymerization inhibitor to be added is preferably about 0.01 mass % to about 5 mass % relative to the mass of the entire composition. To prevent the polymerization inhibition by oxygen, a higher fatty acid derivative such as behenic acid or behenic amide may be added as necessary so that the higher fatty acid derivative localizes on the surface of the recording layer in the drying process after application onto a support etc. during the production process of the planographic printing plate precursor. The amount of the higher fatty acid derivative to be added is preferably about 0.5 mass % to about 10 mass % based on the entire composition.

(E-3) Colorant Etc.

A dye or pigment may be added to the planographic printing plate precursor according to the invention, for the purpose of coloring its recording layer. The plate-checking property of the printing plate, such as visibility after plate-making and compatibility with an image densitometer, can thereby be improved. The colorant is preferably a pigment since many dyes lower the sensitivity of the photopolymerizable recording layer. Examples of the colorant include pigments such as phthalocyanine pigments, azo pigments, carbon black and titanium oxide, and dyes such as Ethyl Violet, Crystal Violet, azo dyes, anthraquinone dyes and cyanine dyes. The amount of the dyes and pigments to be added is preferably about 0.5 mass % to about 5 mass % based on the entire composition.

(E-4) Other Additives

The planographic printing plate precursor of the invention may further contain other known additives such as an inorganic filler in order to improve the physical property of the cured film, a plasticizer, and an oil-sensitizing agent for improving the ink settlement on the surface of the recording layer.

Examples of the plasticizer include dioctyl phthalate, didodecyl phthalate, triethyleneglycol dicaprylate, dimethylglycol phthalate, tricresyl phosphate, dioxtyl adipate, dibutyl sebacate, and triacetylglycerol. In the case where a binder is used, the plasticizer may be added in an amount of 10% by mass or lower with respect to the total mass of a compound having an ethylenically unsaturated bond and the binder.

Further, the below-described additives such as a UV initiator and a heat crosslinking agent may be added for enhancing the effect of heating and light exposure after development to improve the film strength (printing durability).

In addition, other additives or an intermediate layer may be used to improve the adhesiveness between the recording layer and support, and enhance the development removability of the light-unexposed recording layer. For example, the adhesiveness and printing durability can be improved by adding or undercoating with a compound which relatively strongly interacts with a substrate, such as a compound having a diazonium structure or a phosphonate compound, and the developability in the non-image region and stain resistance can be improved by adding or undercoating with a hydrophilic polymer such as polyacrylic acid or polysulfone acid.

<Substrate (Support)>

The support used in the invention may be paper, a polyester film or an aluminum plate, among which an aluminum plate is particularly preferable because it is excellent in dimensional stability, is relatively inexpensive, can provide a surface excellent in hydrophilicity and strength by performing surface treatment as necessary. A composite sheet having an aluminum sheet bonded to a polyethylene terephthalate film, as described in JP-B No. 48-18327, is also preferable.

The aluminum plate as used herein is a dimensionally stable metal plate including aluminum as a major component, and the scope of the aluminum plate includes not only a pure aluminum plate but also an alloy plate including aluminum as a major component and a very small amount of hetero elements, and a plastic film or paper having aluminum (alloy) laminated or vapor-deposited thereon. In the following description, supports made of aluminum or aluminum alloys are referred to collectively as aluminum supports. Examples of the hetero elements contained in the aluminum alloy include silicon, iron, manganese, copper, magnesium, chromium, zinc, bismuth, nickel, and titanium. The content of the hetero elements in the alloy is 10 mass % or less. A pure aluminum plate is particularly preferable, but because production of completely pure aluminum is difficult from the viewpoint of refining techniques, aluminum may contain a very small amount of hetero elements. The composition of the aluminum plate is not limited, and any aluminum plates made of known and conventionally used aluminum materials such as JIS A 1050, JIS A 1100, JIS A 3103 and JIS A 3005 can be used as necessary.

The thickness of the aluminum support is from about 0.1 to about 0.6 mm. This thickness can be suitably changed depending on the size of a printing machine, the size of a printing plate, and user's requests.

The aluminum support may be subjected to the following surface treatment to make it hydrophilic.

(Surface Roughening Treatment)

Examples of the surface roughening treatment include mechanical roughening, chemical etching and electrolytic grain as disclosed in JP-A No. 56-28893. Other examples include an electrochemical surface roughening method of electrochemically roughening the surface in a hydrochloric acid or nitric acid electrolytic solution, and mechanical surface roughening methods such as a wire brush grain method of scratching an aluminum surface with a metallic wire, a pole grain method of graining an aluminum surface with abrasive grains and an abrasive, or a brush grain method of roughening the surface with a nylon brush and an abrasive. Only one of these surface roughening methods may be used, or a combination of two or more of these surface roughening methods may be used. Among these methods, the electrochemical method of roughening the surface chemically in a hydrochloric acid or nitric acid electrolytic solution is particularly useful in surface roughening. The anode time electricity is preferably in a range of 50 to 400 $C/dm^2$. Specifically, it is preferable to conduct alternating current and/or direct current electrolysis at a temperature of 20 to 80° C., for 1 second to 30 minutes with a current density of 100 to 400 $C/dm^2$ in an electrolytic solution containing 0.1 to 50% hydrochloric acid or nitric acid.

The aluminum support thus surface-roughened may be etched chemically with acid or alkali. Preferable examples of the etching agent to be used include sodium hydroxide, sodium carbonate, sodium aluminate, sodium metasilicate, sodium phosphate, potassium hydroxide, lithium hydroxide etc., and the concentration and temperature are preferably in a range of from 1 to 50% and from 20 to 100° C., respectively. After etching, washing with acid may be carried out to remove blemish (smuts) remaining on the surface. Examples of the acid to be used include nitric acid, sulfuric acid, phosphoric acid, chromic acid, fluoric acid and hydrofluoboric acid. The method of removing smuts after electrochemical surface roughening treatment is preferably a method of contacting with from 15 to 65% by mass sulfuric acid at a temperature of from 50 to 90° C. as described in JP-A No. 53-12739 or a method of alkali etching as described in JP-B No. 48-28123. The method and conditions are not particularly limited as long as the surface roughness Ra of the treated surface is about 0.2 to 0.5 μm after the treatment.

(Anodizing Treatment)

The thus treated aluminum support having an oxide layer formed thereon is then subjected to anodizing treatment.

In the anodizing treatment, an aqueous solution of sulfuric acid, phosphoric acid, oxalic acid or boric acid-sodium borate, or an aqueous solution of a combination of two or more of such substances, can be used as the major component in an electrolytic bath. In this case, the electrolytic solution may naturally contain at least components usually contained in the Al alloy plate, the electrodes, tap water and underground water. Second and third components may also be contained. The range of the second and third components include, for example, cations of metals such as Na, K, Mg, Li, Ca, Ti, Al, V, Cr, Mn, Fe, Co, Ni, Cu and Zn, ammonium ions, and anions such as nitrate ion, carbonate ion, chlorine ion, phosphate ion, fluorine ion, sulfite ion, titanate ion, silicate ion and borate ion, and the concentration thereof may be from about 0 to 10000 ppm. Although the conditions for the anodizing treatment are not particularly limited, the plate is preferably treated with 30 to 500 g/L solution at a temperature of 10 to 70° C. by direct current or alternating current electrolysis in a range of a current density of 0.1 to 40 $A/m^2$. The thickness of the anodized layer formed may be in a range of 0.5 to 1.5 μm. Preferably, the thickness is in a range of 0.5 to 1.0 μm. The treatment conditions are preferably selected such that the pore diameter of micropores present in the anodized layer formed on the support by the treatment described above is 5 to 10 nm and such that the pore density is $8\times10^{15}$ to $2\times10^{16}$ pores/$m^2$.

The treatment for imparting hydrophilicity to the surface of the support may be selected from various known methods. The treatment is particularly preferably hydrophilicity-imparting treatment with a silicate, polyvinylphosphonic acid, or the like. The obtained layer may have a Si or P element content of 2 to 40 $mg/m^2$, preferably 4 to 30 $mg/m^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) containing an alkali metal silicate or polyvinylphosphonic acid in an amount of 1 to 30 mass %, more preferably 2 to 15 mass %, for example at 15 to 80° C. for 0.5 to 120 seconds.

As the alkali metal silicate used in the treatment for imparting hydrophilicity, sodium silicate, potassium silicate, lithium silicate, or the like is used. The hydroxide used for raising the pH value of the aqueous alkali metal silicate solution may be sodium hydroxide, potassium hydroxide, lithium hydroxide, or the like. Alkaline earth metal salts or the group IVB metal salts may be incorporated into the treating solution described above. Examples of the alkaline earth metal salts include nitrates such as calcium nitrate, strontium nitrate, magnesium nitrate and barium nitrate, and water-soluble salts such as sulfate, hydrochloride, phosphate, acetate, oxalate and borate. Examples of the group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride.

In an embodiment, only one selected from alkaline earth metal salts and group IVB metal salts is used. In another embodiment, a combination of two or more selected from alkaline earth metal salts and group IVB metal salts is used. The amount of these metal salts is preferably in a range of from 0.01 to 10% by mass, more preferably from 0.05 to 5.0% by mass. Electrodeposition with silicate as described in U.S. Pat. No. 3,658,662 is also effective. A surface treatment which is a combination of a support which has been subjected to electrolytic graining as disclosed in JP-B No. 46-27481, JP-A No. 52-58602 and JP-A No. 52-30503, and the anodizing treatment and the hydrophilicity-imparting treatment described above, is also useful.

[Production of the Negative-working Planographic Printing Plate Precursor]

The planographic printing plate precursor according to the invention may have the recording layer and the specific protective layer described above on this order on a support and may be provided if necessary with an intermediate layer (undercoat layer) etc. Such a negative-working planographic printing plate precursor can be produced by applying coating liquids containing the respective components sequentially onto a support.

When the recording layer is formed by coating, the recording layer components are dissolved in an organic solvent, which may be selected from various organic solvents, to form a recording layer coating liquid. The recording layer coating liquid is then applied onto the support or the undercoat layer.

Examples of the solvent to be used for the recording layer coating liquid include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. The solvent to be used may include only one of these solvents or a mixture of two or more of these solvents. A suitable solids content of the recording layer coating liquid is from 2 to 50 mass %.

The coating amount of the recording layer can mainly influence the sensitivity of the recording layer, the strength of the light-exposed layer, developability, and the printing durability of the resultant printing plate, and is desirably selected in accordance with the application. In the case of the planographic printing plate precursor for scanning exposure, the coating amount in terms of the mass of the recording layer after drying is preferably in a range of from about 0.1 $g/m^2$ to about 10 $g/m^2$, more preferably from 0.5 to 5 $g/m^2$.

(Resin Intermediate Layer)

In the negative-working lithographic printing plate precursor to which an image recording material of the invention is applied, as needs arise, a resin intermediate layer including an alkali-soluble polymer can be disposed between a photosensitive layer and a support.

Since, when the resin intermediate layer is disposed, the photosensitive layer, being disposed on an exposure surface or in the vicinity thereof, becomes excellent in the sensitivity to exposure, and, since the resin intermediate layer is present between the support and the photosensitive layer to work as a heat insulating layer, heat generated due to exposure, without diffusing to the support, is efficiently used to enable to obtain high sensitivity.

It is considered that in an exposed portion, the photosensitive layer functions as a protective layer for the resin intermediate layer, thus the development stability is improved, an image excellent in discrimination is formed and the stability with time as well is secured. On the other hand, in a non-exposed portion, since constituents of the photosensitive layer are rapidly dissolved and dispersed in a developing solution and the resin intermediate layer present adjacent to the support contains an alkali-soluble polymer, the solubility to a developing solution is excellent, and, for instance, even when a developing solution of which activity is deteriorated is used, the resin intermediate layer is speedily dissolved without generating a remaining layer, resulting in excellent developability.

[Undercoat Layer]

For the purpose of improving the adhesiveness between the recording layer and the support and stain resistance, the planographic printing plate precursor using the image recording material of the present invention may have an undercoat layer. Specific examples of the undercoat layer include those described in JP-B No. 50-7481, JP-A No. 54-72104, JP-A No. 59-101651, JP-A No. 60-149491, JP-A No. 60-232998, JP-A 3-56177, JP-A No. 4-282637, JP-A No. 5-16558, JP-A No. 5-246171, JP-A No. 7-159983, JP-A No. 7-314937, JP-A No. 8-202025, JP-A No. 8-320551, JP-A No. 9-34104, JP-A No. 9-236911, JP-A No. 9-269593, JP-A No. 10-69092, JP-A No. 10-115931, JP-A No. 10-161317, JP-A No. 10-260536, JP-A No. 10-282682, JP-A No. 11-84674, JP-A No. 10-69092, JP-A No. 10-115931, JP-A No. 11-38635, JP-A No. 11-38629, JP-A No. 10-282645, JP-A No. 10-301262, JP-A No. 11-24277, JP-A No. 11-109641, JP-A No. 10-319600, JP-A No. 11-84674, JP-A No. 11-327152, JP-A No. 2000-10292, JP-A No. 2000-235254, JP-A No. 2000-352854, JP-A No. 2001-209170, JP-A No. 2001-175001 etc.

(Back Surface Treatment of Support)

In a negative-working lithographic printing plate precursor to which an image recording material of the invention is applied, with an object to further improve the scratch resistance, a back surface of a support is preferably decorated. As a method of decorating a back surface of a support, for instance when an aluminum support is used, a method where, similarly to a photosensitive layer side, over an entire surface of a back surface, an anodic oxidation film is uniformly formed or a method where a back coat layer is formed on a back surface can be cited. When a method that forms an anodic oxidation film is applied, a film forming amount is preferably 0.6 $g/m^2$ or more and more preferably in a range of 0.7 to 6 $g/m^2$. Among these, a method of disposing a back coat layer is more effective and preferred. A treatment method of the back surface of a support will be described below.

1. Method of Forming Anodic Oxidation Film on Back Surface of Support

In the beginning, a method where, on a back surface of an aluminum support, similarly to a photosensitive layer side, uniformly over an entire surface, an anodic oxidation film is formed by 0.6 $g/m^2$ or more will be described. An anodic oxidation film is formed according to a method similar to that described in the surface treatment of a support. A thickness of the anodic oxidation film disposed on a back surface of a support is effective when it is 0.6 g/$m^2$ or more. From the viewpoint of performance, there is no particular upper limit thereof. However, when energy such as electric power necessary when a film is formed and a time necessary for forming are considered, the thickness is well when it is substantially 6 g/$m^2$, a practically preferable film thickness is in a range of 0.7 to 6 g/$m^2$ and more preferably in a range of 1.0 to 3 g/$m^2$.

An amount of an anodic oxidation film can be obtained by measuring a peak of $Al_2O_3$ by use of fluorescence X-ray, followed by calculating from a calibration curve of a peak height and a film amount.

In the invention, an anodic oxidation film being disposed over an entire surface of an aluminum support and an amount thereof being 0.6 g/$m^2$ or more can be confirmed by checking that, in each of all of a center portion of a surface having an anodic oxidation film on a side opposite to a photosensitive layer of an aluminum support in a lithographic printing plate precursor and end portions respectively 5 cm from both ends in a direction (Transverse Direction) that goes through the center portion and is orthogonal to a processing direction (Machine Direction), an amount of anodic oxidation film is 0.6 g/$m^2$ or more.

2. Method of Forming Backcoat Layer

In the next place, a method of disposing a backcoat layer on a back surface of an aluminum support will be described. As a backcoat layer in the invention, one having whatever composition can be used. However, a backcoat layer containing a metal oxide obtained by hydrolyzing and polycondensating an organic metal compound or an inorganic metal compound and colloidal silica sol or a backcoat layer containing an organic resin can be preferably cited.

2-1 Backcoat Layer Containing Metal Oxide and Colloidal Silica Sol

As a first preferable mode of a backcoat layer in the invention, a backcoat layer containing a metal oxide and colloidal silica sol can be cited.

More specifically, a backcoat layer formed from a so-called sol-gel reaction liquid obtained by hydrolysis and polycondensation of an organic or inorganic metal compound in water or in an organic solvent in the presence of a catalyst such as acid or alkali is preferred.

The organic or inorganic metal compound used for formation of the backcoat layer may be, for example, a metal alkoxide, a metal acetylacetonate, a metal acetate, a metal oxalate, a metal nitrate, a metal sulfate, a metal carbonate, a metal oxychloride, a metal chloride or a condensate obtained by partially hydrolyzing to oligomerize.

The metal alkoxide is represented by a formula, $M(OR)_n$ (wherein M expresses a metal element, R expresses an alkyl group and n expresses the oxidation number of the metal element). Specific examples thereof include $Si(OCH_3)_4$, $Si(OC_2H_5)_4$, $Si(OC_3H_7)_4$, $Si(OC_4H_9)_4$, $Al(OCH_3)_3$, $Al(OC_2H_5)_3$, $Al(OC_3H_7)_3$, $Al(OC_4H_9)_3$, $B(OCH_3)_3$, $B(OC_2H_5)_3$, $B(OC_3H_7)_3$, $B(OC_4H_9)_3$, $Ti(OCH_3)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$, and $Zr(OC_4H_9)_4$. Examples of the metal alkoxide further include alkoxides of Ge, Li, Na, Fe, Ga, Mg, P, Sb, Sn, Ta, and V, and mono-substituted silicon alkoxides such as $CH_3Si(OCH_3)_3$, $C_2H_5Si(OCH_3)_3$, $CH_3Si(OC_2H_5)_3$, and $C_2H_5Si(OC_2H_5)_3$.

The organic metal compounds or inorganic metal compounds may be used singularly or in a combination of at least two thereof. Among organic metal compounds or inorganic metal compounds, metal alkoxides are preferable because these are reactive and tend to form polymers through formation of metal-oxygen bonds. Among these, alkoxide compounds of silicon such as $Si(OCH_3)_4$, $Si(OC_2H_5)_4$, $Si(OC_3H_7)_4$ and $Si(OC_4H_9)_4$ are particularly preferable because these are readily procured cheaply and coating layers of the metal oxides obtained therefrom are excellent. Furthermore, oligomers obtained by partial hydrolysis and condensation of such silicon alkoxide compounds as well are preferable. As an example thereof, ethyl silicate oligomer containing substantially 40% by mass of $SiO_2$ with an average polymerization degree of 5 is cited.

It is also preferable to use, together with the metal alkoxide, a so-called silane coupling agent obtained by substituting one or two alkoxy groups of the silicon tetraalkoxy compound with an alkyl group or a reactive group. As a silane coupling agent added to a backcoat layer in the invention, a silane coupling agent where one or two alkoxy groups in the silicon tetraalkoxy compound are substituted with a hydrophobic substituent group such as a long chain alkyl having 4 to 20 carbon atoms or a fluorine-substituted alkyl group can be cited and a silane coupling agent having a fluorine-substituted alkyl group is particularly preferred. Specific examples of such silane coupling agents include $CF_3CH_2CH_2Si(OCH_3)_3$, $CF_3CF_2CH_2CH_2Si(OCH_3)_3$ and $CF_3CH_2CH_2Si(OC_2H_5)_3$ and, as a commercially available one, LS-1090 (trade name, produced by Shin-Etsu Chemical Co., Ltd.). The silane coupling agents substituted by a fluorine-substituted alkyl group are contained in organic fluorine compounds in the invention. A preferable content of such a silane coupling agent is in a range of 5 to 90% by mass and more preferably in a range of 10 to 80% by mass based on a total solid content of the backcoat layer.

As catalysts useful when a sol-gel coating solution for the backcoat layer is prepared, an organic or inorganic acid and alkali are being used. Examples thereof include: inorganic acids such as hydrochloric acid, sulfuric acid, sulfurous acid, nitric acid, nitrous acid, hydrofluoric acid, phosphoric acid and phosphorous acid; organic acids such as formic acid, acetic acid, propionic acid, butyric acid, glycolic acid, chloroacetic acid, dichloroacetic acid, trichloroacetic acid, fluoroacetic acid, bromoacetic acid, methoxyacetic acid, oxaloacetic acid, citric acid, oxalic acid, succinic acid, malic acid, tartaric acid, fumaric acid, maleic acid, malonic acid, ascorbic acid, benzoic acid, substituted benzoic acid such as 3,4-dimethoxybenzoic acid, phenoxyacetic acid, phthalic acid, picric acid, nicotinic acid, picolinic acid, pyrazine, pyrazol, dipicolinic acid, adipic acid, p-toluic acid, terephthalic acid, 1,4-cyclohexene-2,2-dicarboxylic acid, erucic acid, lauric acid and n-undecanoic acid; hydroxides of alkali metals and alkaline earth metals; and alkalis such as ammonia, ethanolamine, diethanolamine and triethanolamine.

Examples of other preferable catalysts include sulfonic acids, sulfinic acids, alkylsulfuric acids, phosphonic acids and phosphoric esters, and specific examples thereof include organic acids such as p-toluene sulfonic acid, dodecylbenzene sulfonic acid, p-toluene sulfinic acid, ethyl sulfuric acid, phenyl phosphonic acid, phenyl phosphinic acid, phenyl phosphate and diphenyl phosphate.

The catalysts can be used singularly or in a combination of at least two kinds thereof. An addition amount of the catalyst is, based on the metal compound as the raw material, preferably in a range of 0.001 to 10% by mass and more preferably in a range of 0.05 to 5% by mass. When the addition amount of the catalyst is smaller than the range, the initiation of the sol-gel reaction is slow. When the addition amount of the catalyst is larger than the range, the reaction proceeds rapidly to generate inhomogeneous sol-gel particles, and the obtained coating layer peels easily.

An adequate amount of water is necessary for initiating the sol-gel reaction. A preferable addition amount of water is preferably 0.05 to 50 times mole and more preferably 0.5 to 30 times mole the amount of water necessary for completely hydrolyzing the metal compound as the raw material. When the amount of water is less than the above range, the hydrolysis does not proceed sufficiently and when the amount of water is more than the range, the reaction does not proceed sufficiently probably because of the dilution of the raw material.

A solvent is further added to the sol-gel reaction solution. The solvent may be any one as far as it dissolves the metal compound as the raw material and dissolves or disperses sol-gel particles formed by a reaction. The solvent may be a lower alcohol such as methanol, ethanol, propanol, or butanol, or a ketone such as acetone, methyl ethyl ketone, or diethyl ketone. A monoalkyl ether or dialkyl ether of glycol such as ethylene glycol, diethylene glycol, triethylene glycol, propylene glycol, or dipropylene glycol and an acetic ester may be used to improve quality of a coated surface of a backcoat layer. Among the solvents, a lower alcohol miscible with water is preferable. The sol-gel reaction solution is controlled with a solvent so as to be a concentration adequate for coating. When an entire amount of the solvent is added to the reaction liquid at the beginning, the hydrolysis reaction does not proceed quickly probably because of the dilution of the raw material. Accordingly, it is preferable to add a part of the solvent to the sol-gel liquid at the beginning, and to add the remainder only after the reaction has proceeded.

A coating amount of thus formed backcoat layer containing a metal oxide and colloidal silica is preferably in a range of 0.01 to 3.0 g/$m^2$ and more preferably in a range of 0.03 to 1.0 g/$m^2$.

2-2. Backcoat Layer Containing Organic Resin

As another preferable example of the backcoat layer in the invention, a backcoat layer containing an organic resin formed on a back surface of a support can be cited.

Examples of preferable resins that can form a backcoat layer in the embodiment include thermosetting resins such as a urea resin, an epoxy resin, a melamine resin and a diallylphthalate resin. Among these, from the viewpoint of high mechanical strength of a formed layer, phenol resins are preferred and more specific examples thereof include novolak resins such as a phenol formaldehyde resin, an m-cresol formaldehyde resin, a p-cresol formaldehyde resin, an m-/p-mixed cresol formaldehyde resin and a phenol/cresol (either of m-, p- or m-/p-mixed) mixed formaldehyde resin and a pyrogallol acetone resins.

Furthermore, as the phenol resins, as described in U.S. Pat. No. 4,123,279, polycondensates of phenol having an alkyl group having 3 to 8 carbon atoms as a substituent and formaldehyde such as a t-butylphenol formaldehyde resin and an octylphenol formaldehyde resin can be cited.

The phenol resin has a weight average molecular weight preferably in a range of 500 or higher and more preferably in a range of 1,000 to 700,000 from the viewpoint of the image formability. Furthermore, a number average molecular weight thereof is preferably in a range of 500 or higher and more preferably in a range of 750 to 650,000. The dispersion (the weight average molecular weight/the number average molecular weight) is preferably in a range of 1.1 to 10.

The phenol resins can be used singularly or in a combination of at least two kinds thereof. In the case of combination, as described in U.S. Pat. No. 4,123,279, condensed polymers of phenol having an alkyl group having 3 to 8 carbon atoms as a substituent group and formaldehyde such as a condensed polymer of t-butylphenol and formaldehyde and a condensed polymer of octyl phenol and formaldehyde, and an organic resin described in JP-A No. 2000-241972 and having a phenol structure having an electron drawing group on an aromatic ring may be used in combination.

In the backcoat layer in the invention, with an intention of improving the coated surface state and of controlling the surface characteristics, a surfactant may be added. Examples of the surfactants include anion surfactants having any one of a carboxylic acid, a sulfonic acid, sulfate ester and phosphate ester; cationic surfactants such as aliphatic amine and a quaternary ammonium salt; betaine type amphoteric surfactants; nonionic surfactants such as a fatty acid ester of a polyoxy compound, a polyalkylene oxide condensate type and a polyethylene imine condensate type; and fluorine-based surfactants. Among these, the fluorine-based surfactants are particularly preferred.

The surfactant can be added, though appropriately selected depending on the object, in general, in a range of 0.1 to 10.0% by mass in the backcoat layer.

As the fluorine-based surfactants, fluorine-based surfactants having a perfluoroalkyl group in a molecule are particularly preferred. Such the fluorine-based surfactants will be detailed.

Examples of the fluorine-based surfactants that can be preferably used in the backcoat layer include anionic-type such as perfluoroalkyl carboxylate, perfluoroalkyl sulfonate, and perfluoroalkylphosphate; amphoteric type such as perfluoroalkyl betaine; cationic type such as perfluoroalkyl trimethyl ammonium salts; and nonionic types such as perfluoroalkyl amine oxides, perfluoroalkyl ethylene oxide adducts, oligomers containing a perfluoroalkyl group and a hydrophilic group, oligomers containing a perfluoroalkyl group and an oleophilic group, oligomers containing a perfluoroalkyl group, a hydrophilic group and an oleophilic group and urethanes containing a perfluoroalkyl group and an oleophilic group. Among these, the fluoroaliphatic group is preferred to be a group represented by a formula (x) below.

(x)

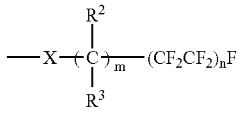

(In the formula (x), $R^2$ and $R^3$, respectively and independently, express a hydrogen atom and an alkyl group having 1 to 4 carbon atoms, X expresses a single bond or a divalent linking group selected from an alkylene group and an arylene group, m expresses an integer of 0 or more and n expresses an integer of 1 or more.)

Now, when the X expresses a divalent linking group, a linkage group such as an alkylene group or an arylene group may have a substitution group or, in a structure, may have a linkage group selected from an ether group, an ester group and an amino group. As a substitution group that can be introduced in an alkylene group and an arylene group, a halogen atom, a hydroxyl group, a mercapto group, a carboxyl group, an epoxy group, an alkyl group or an aryl group can be cited and these may further have a substitution group. Among these, X preferably expresses an alkylene group, an arylene group or an alkylene group having a linkage group selected from an ether group, an ester group and an amide group, more preferably expresses an unsubstituted alkylene group, an unsubstituted arylene group or an alkylene group having an ether group or an ester group inside thereof and most preferably expresses an unsubstituted alkylene group or an alkylene group having an ether group or an ester group inside thereof.

Such a fluorine-based surfactant is preferably contained in a backcoat layer substantially in a range of 0.5 to 10% by mass.

Various kinds of methods can be applied to cover a back surface of an aluminum support with a backcoat layer containing an organic resin on a back surface of an aluminum support. A method where, to components of the backcoat layer, specifically, the respective raw materials mainly made of an organic resin, as needs arise, fine particles such as silica gel are added, followed, for instance, by dissolving or emulsifying in an appropriate solvent to prepare a coating solution, further followed by coating on a back surface of a support, still further followed by drying, a method where an organic resin film formed in advance in film is adhered to an aluminum support through an adhesive or under heating and a method where a melt film is formed by use of an extruder and adhered to a support can be cited. Among these, the most preferable one from the viewpoint of the easiness of controlling a coating amount is a method where a solution is prepared, followed by coating and drying. As a solvent that is used here, organic solvents such as described in JP-A No. 62-251739 can be used singularly or in a combination of at least two kinds thereof.

As means of coating a backcoat layer coating solution on a support surface, known measuring coating machines such as a bar coater, a roll coater, a gravure coater or a curtain coater, an extruder and a slide hopper can be cited. However, from the viewpoint of coating without damaging a back surface of an aluminum support, a non-contact measuring coater such as a curtain coater, an extruder or a slide hopper is particularly preferred.

A thickness of a backcoat layer in the invention is, in all of a backcoat layer containing a metal oxide and colloidal silica and a backcoat layer made of an organic resin, preferably in a range of 0.1 to 8 μm as a formed film thickness. In the thickness range, the surface slipperiness of a back surface of an aluminum support can be improved and the printing characteristics can be prevented from deteriorating due to a variation of a thickness due to dissolution or swelling of a backcoat layer by chemicals used during printing and in the vicinity of a printing portion and a resultant variation of printing pressure.

Among the backcoat layers, the most preferable one is a backcoat layer containing an organic resin.

<Plate Making Method>

In what follows, a plate making method of a negative-working lithographic printing plate precursor in the invention will be described.

Negative-working lithographic printing plate precursors where an image recording material of the invention is applied, being excellent in the scratch resistance owing to the presence of a specific protective layer, without interposing an interleaf therebetween, can be formed into a stacked body. When such a stacked body is used, a removing process of interleaves becomes unnecessary to be able to improve the productivity in a plate making process. It goes without saying that a stacked body obtained by alternately superposing a lithographic printing plate precursor and an interleaf can be used in the plate making.

[Light Exposure]

The method for light-exposing the planographic printing plate precursor composed of the image recording material of the invention may be freely selected from known methods.

The light source for light-exposing the image recording layer of the image recording material of the invention may be freely selected from known ones. Light sources having a wavelength of from 300 nm to 1200 nm may be used. Specifically various lasers may be used as the light source, and in particular a semiconductor laser emitting infrared rays having a wavelength of from 760 nm to 1200 nm is useful.

The light source is preferably a laser, and examples available laser beam sources having a wavelength of from 350 nm to 450 nm include the followings: gas lasers such as an Ar ion laser (364 nm, 351 nm, 10 mW to 1 W), a Kr ion laser (356 nm, 351 nm, 10 mW to 1 W), a He—Cd laser (441 nm, 325 nm, 1 mW to 100 mW); solid lasers such as a combination of Nd:YAG ($YVO_4$) and SHG crystal×2 (355 nm, 5 mW to 1 W), and a combination of Cr:LiSAF and SHG crystal (430 nm, 10 mW); semiconductor lasers such as a $KnbO_3$ ring resonator (430 nm, 30 mW), a combination of a waveguide type wavelength converting element and AlGaAs and InGaAs semiconductors (380 nm to 450 nm, 5 mW to 100 mW), a combination of a waveguide type wavelength converting element and AlGaInP and AlGaAs semiconductors (300 nm to 350 nm, 5 mW to 100 mW) and AlGaInN (350 nm to 450 nm, 5 mW to 30 mW); and pulse lasers such as a $N_2$ laser (337 nm, pulse 0.1 to 10 mJ), and a XeF laser (351 nm, pulse 10 to 250 mJ).

Among them, particularly an AlGaInN semiconductor laser (commercially available InGaN semiconductor laser from 400 to 410 nm, 5 to 30 mW) is preferable from the viewpoints of wavelength property and cost.

Other examples of available light sources having a wavelength of 450 nm to 700 nm include an $Ar^+$ laser (488 nm), YAG-SHG laser (532 nm), a He—Ne laser (633 nm), a He—Cd laser, a red semiconductor laser (650 to 690 nm), and preferable examples of available light sources having a wavelength of 700 nm to 1200 nm include a semiconductor laser (800 to 850 nm), and a Nd—YAG laser (1064 nm).

Other examples of useful light sources include mercury lamps of ultrahigh pressure, high pressure, middle pressure, or low pressure, chemical lamps, carbon arc lamp, xenon lamps, metal halide lamps, ultraviolet laser lamps (e.g. an ArF excimer laser, a KrF excimer laser), various visible laser lamps, fluorescent lamps, tungsten lamps, solar light, and radiations such as electron beams, X rays, ion beams, and far infrared rays.

Among them, the light source of the rays used for the imagewise exposure of the image recording material according to the invention is preferably a light source having a luminescence wavelength in the near-infrared region to infrared region, and is particularly preferably a solid laser or a semiconductor laser.

The light exposure device may be any of internal drum system, external drum system, and flatbed system.

In particular, in the case where a light source having a wavelength of from 750 nm to 1400 nm is used for light exposure, the light source may be freely selected from those emitting rays having the wavelength. However, the imagewise exposure is preferably conducted by a solid laser or a semiconductor laser emitting infrared rays having a wavelength of from 750 nm to 1400 nm.

The laser preferably has an output of 100 mW or more, and preferably includes a multi-beam laser device for reducing the light exposure time. The light exposure time for one pixel is preferably 20μ seconds or shorter. The amount of radiation energy radiated per unit area of the planographic printing plate precursor is preferably from 10 to 300 mJ/$cm^2$.

The light exposure can be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient is preferably 0.1 or more.

The scanning system for a light source in the light exposure device is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

After the exposure step, as needs arise, heating and/or washing may be applied.

[Development]

After the exposure, a negative-working lithographic printing plate precursor involving the invention is subjected to a development step that uses a developing solution shown below.

<Developer>

The developer used in the invention is not particularly limited, and is usually an aqueous alkali solution containing an alkaline chemical and having a pH of 14 or lower, preferably a pH from 9.0 to 13.0.

(Alkali Agent)

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. Only one alkali agent may be used, or a combination of two or more alkali agents may be used.

Alkali agents other than those described above include alkali silicates. Alkali silicates may used in combination with a base. The alkali silicates to be used may be those showing alkalinity when dissolved in water, and examples thereof include sodium silicate, potassium silicate, lithium silicate and ammonium silicate. In an embodiment, only one alkali silicate is used. In another embodiment, a mixture of two or more alkali silicates is used.

When a silicate is used, the characteristics of the developer can be adjusted easily to the optimum range by controlling the mixing ratio and concentration of silicon oxide $SiO_2$ as silicate component and alkali oxide $M_2O$ (M is an alkali metal or an ammonium group) as alkali component. From the viewpoint of suppressing blemish attributable to excess dissolution (etching) of the anodized film on a support and preventing generation of insoluble gas attributable to formation of a complex of dissolved aluminum and a silicate, the mixing ratio of silicon oxide $SiO_2$ to alkali metal oxide $M_2O$ ($SiO_2$/$M_2O$ molar ratio) is preferably in a range of from 0.75 to 4.0, more preferably in a range of from 0.75 to 3.5.

Regarding the concentration of the alkali silicate salt in the developer, the amount of $SiO_2$ relative to the mass of the developer is preferably in a range of from 0.01 to 1 mol/L, more preferably from 0.05 to 0.8 mol/L from the viewpoint of preventory effects on dissolution (etching) of the anodized film on a support, developability, inhibitory effects on precipitation and crystallization, and inhibitory effects on gelling upon neutralization at the time of waste liquid treatment.

(Aromatic Anionic Surfactant)

The developer preferably contains an aromatic anionic surfactant from the viewpoint of the development accelerating effect, stabilization of a dispersion of the negative-working-working polymerizable recording layer components and protective layer components in the developer, and stabilization of development treatment.

The aromatic anionic surfactant is not particularly limited, but is preferably a compound represented by the following formula (A) or (B):

Formula (A)

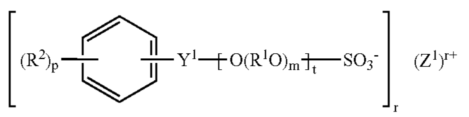

Formula (B)

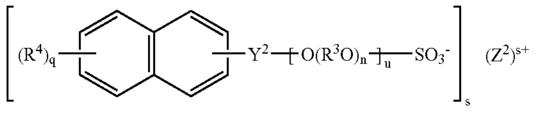

In the formula (A) or (B) above, $R^1$ and $R^3$ each independently represent a linear or branched $C_1$ to $C_5$ alkylene group, and specific examples include an ethylene group, a propylene group, a butylene group and a pentylene group, among which an ethylene group and a propylene group are particularly preferable.

m and d each independently represent an integer from 1 to 100, and is preferably from 1 to 30, more preferably from 2 to 20. When m is 2 or greater, there are plural $R^1$s which may be the same as or different from each other. When n is 2 or greater, there are plural $R^3$s which may be the same as or different from each other.

t and u each independently represent 0 or 1.

$R^2$ and $R^4$ each independently represent a linear or branched $C_1$ to $C_{20}$ alkyl group, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^1$ and $Y^2$ represents a single bond or a $C_1$ to $C_{10}$ alkylene group and is preferably a single bond, a methylene group or an ethylene group, particularly preferably a single bond.

$(Z^1)^{r+}$ and $(Z^2)^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^1)^{r+}$ and $(Z^2)^{s+}$ each is particularly preferably a sodium ion. r and s each independently represent 1 or 2.

Specific examples of the aromatic anionic surfactant are shown below. However, the examples should not be construed as limiting the invention.

K-1

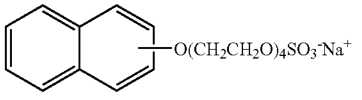

K-2

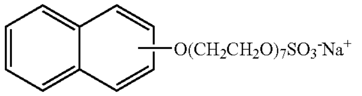

K-3

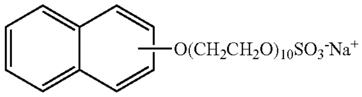

K-4

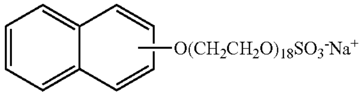

K-5

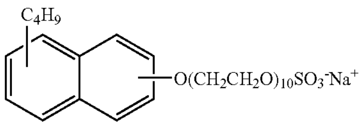

K-6

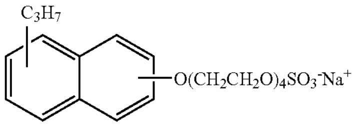

K-7

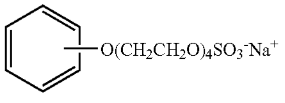

K-8

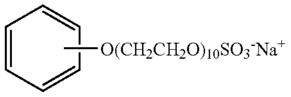

K-9

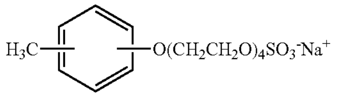

K-10

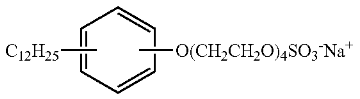

K-11

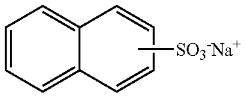

K-12

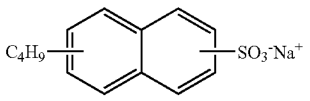

In an embodiment, only one aromatic anionic surfactant is used. In another embodiment, an arbitrary combination of two or more aromatic anionic surfactants is used. The amount of aromatic anionic surfactant to be added is not particularly limited. From the viewpoint of developability, the solubility of the recording layer components and the protective layer components, and the printing durability of the resultant printing plate, the concentration of the aromatic anionic surfactant in the developer is preferably in a range of from 1.0 to 10 mass %, more preferably in a range of from 2 to 10 mass %.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan triooleate, and monoglyceride alkyl esters such as glycerol monostearate and glycerol monooleate.

The content of such additional surfactant in the developer is preferably from 0.1 to 10 mass %.

(Chelate Agent)

For the purpose of preventing the influence from calcium ions etc. contained in hard water, for example, a chelate agent for divalent metals is preferably contained in the developer. Examples of the chelate agent for divalent metals include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutanetricarboxylic acid-1,2,4, potassium salt thereof, sodium salt thereof; 2-phosphonobutanonetricarboxylic acid-2,3,4, potassium salt thereof, sodium salt thereof), organic phosphonic acids (for example, 1-phosphonoethanetricarboxylic acid-1,2,2, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra(methylenephosphonic acid), ammonium salt thereof, potassium salt thereof; hexamethylenediaminetetra(methylenephosphonic acid), ammonium salt thereof, and potassium salt thereof are particularly preferable.

An optimum amount of such a chelating agent is, though varying depending on the hardness and a usage amount of hard water used, in general, in a developing solution in use, in a range of 0.01 to 5% by mass and more preferably in a range of 0.01 to 0.5% by mass.

In addition, in a developing solution, as a development control agent, alkali metal salts of an organic acid or alkali metal salts of an inorganic acid may be added. For instance, sodium carbonate, potassium carbonate, ammonium carbonate, sodium citrate, potassium citrate and ammonium citrate may be added singularly or in a combination of at least two kinds thereof.

Other than the above, as needs arise, components such as shown below may be used together in a developing solution. Examples thereof include organic carboxylic acids such as benzoic acid, phthalic acid, p-ethyl benzoic acid, p-n-propyl benzoic acid, p-isopropyl benzoic acid, p-n-butyl benzoic acid, p-t-butyl benzoic acid, p-2-hydroxyethyl benzoic acid, decanoic acid, salicylic acid and 3-hydroxy-2-naphtoic acid; organic solvents such as propylene glycol; and, other than the above, reducing agents, dyes, pigments and anti-septic agents.

The pH of a developing solution at 25° C. is, from the viewpoints of the developability to a non-image portion and alleviation of damage to an image portion during development and the handling property of the developing solution, preferably in a range of 10 to 12.5 and more preferably in a range of 11 to 12.5.

Furthermore, the electric conductivity x of the developing solution is preferably $2<x<30$ mS/cm and more preferably in a range of 5 to 25 mS/cm. In order to control the electric conductivity, alkali metal salts of an organic acid or alkali metal salts of an inorganic acid may be preferably added as an electric conductivity control agent.

The developing solution may be used as a developing solution and a development replenishing solution of an exposed lithographic printing plate precursor and may be preferably applied to an automatic developing machine. When an automatic developing machine is used to develop, since, corresponding to a processed quantity, the developing solution fatigues, a replenishing solution or a fresh developing solution may be used to recover the processing capability. In a plate making method in the invention as well, the replenishment method can be preferably applied.

Furthermore, in order to recover the processing capability of the developing solution with the automatic developing machine, a method described in U.S. Pat. No. 4,882,246 may be applied to replenish. Still furthermore, developing solutions described in the respective publications of JP-A Nos. 50-26601 and 58-54341 and JP-B Nos. 56-39464, 56-42860 and 57-7427 can be applied as well.

Thus-developed lithographic printing plate precursor, as described in the respective publications of JP-A Nos. 54-8002, 55-115045 and 59-58431, may be subjected to an after treatment with a rinse solution containing washing water and a surfactant and a desensitizing solution containing gum Arabic and a starch derivative or to a combination thereof.

Furthermore, in order to improve the image strength and the press life, to a developed image, overall heating or overall exposure may be applied. In the heating after development, a very strong condition can be applied; usually, a heating temperature is in a range of 200 to 500° C.

A lithographic printing plate obtained according to such treatments is mounted on an offset printing machine to print many sheets.

As a plate cleaner that is used to remove the contamination on the plate during printing, a so far known plate cleaners for PS plates such as a multi-cleaner, CL-1, CL-2, CP, CN-4, CN, CG-1, PC-1, SR and IC (trade name, produced by Fuji Photo Film Co., Ltd.) can be cited.

EXAMPLES

The invention will be described below with reference to examples. However, the invention is not restricted thereto.

Example 1

Preparation of Support

A JIS A 1050 aluminum plate having a thickness of 0.30 mm and a width of 1030 mm was subjected to a surface treatment shown below.

<Surface Treatment>

In the surface treatment, the respective treatments of (a) through (f) below were sequentially applied. After the respective treatments and washing with water, a nip roller was used to drain liquid.

(a) An aluminum plate was etched at a sodium hydroxide concentration of 26% by mass, an aluminum ion concentration of 6.5% by mass and liquid temperature of 70° C. to dissolve the aluminum plate by 5 $g/m^2$, followed by washing with water.

(b) A desmutting treatment was applied by spraying an aqueous solution of 1% by mass nitric acid (containing 0.5% by mass aluminum ion) kept at 30° C., followed by washing with water.

(c) A surface roughening treatment was electrochemically and continuously applied with an alternating-current voltage of 60 Hz. An electrolytic solution at this time was an aqueous solution of 1% by mass nitric acid (containing aluminum ion of 0.5% by mass and ammonium ion of 0.007% by mass) and a temperature thereof was 30° C. An alternating-current power source was used to supply a trapezoidal rectangular wave alternating-current where a time when a current value reaches from zero to a peak, TP, is 2 ms and the duty ratio is 1:1 to apply the electrochemical surface roughening treatment with a carbon electrode as a counter electrode. As an auxiliary anode, ferrite was used. The current density was 30 $A/dm^2$ at a peak value of the current and an amount of electricity was 250 $C/cm^2$ as a sum total of an amount of electricity when an aluminum plate was an anode. To the auxiliary electrode, 5% of a current flowing from a power source is distributed. Thereafter, washing with water was applied.

(d) An aluminum plate was etched by spraying at a sodium hydroxide concentration of 26% by mass and an aluminum ion concentration of 6.5% by mass at a liquid temperature of 32° C. to dissolve the aluminum plate by 0.2 $g/m^2$, and thereby a smutting component mainly made of aluminum hydroxide generated when the electrochemical surface roughening treatment was applied with an alternating current in the former step was removed and an edge portion of a generated pit portion was dissolved to make the edge portion smooth, followed by washing with water.

(e) A desmutting treatment was applied by spraying an aqueous solution of 25% by mass sulfuric acid (containing 0.5% by mass aluminum ion) kept at 60° C., followed by washing water.

(f) An anodic oxidation treatment was applied at a sulfuric acid concentration of 170 g/liter (containing 0.5% by mass aluminum ion), 35° C. and a current density of 5 ($A/dm^2$) for 50 seconds, followed by washing with water. A weight of an anodic oxidation film at this time was 2.7 g/m.

The surface roughness Ra of thus obtained aluminum support was 0.27 (measurement device: Surfcom (trade name, produced by Tokyo Seimitu Co., Ltd., diameter of tracer head: 2 μm).

(Undercoat Layer)

Next, the following undercoat layer coating solution was applied onto the aluminum support by using a wire bar and dried at 90° C. for 30 seconds. The coating amount was 10 $mg/m^2$.

(Undercoat Layer Forming Coating Solution)

| | |
|---|---|
| Polymer compound A having a structure below (weight average molecular weight: 30000) | 0.05 g |
| Methanol | 27 g |
| Ion-exchanged water | 3 g |

Polymer compound A

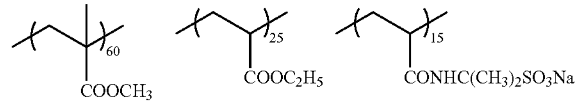

(Formation of Photosensitive Layer)

Next, a photosensitive layer forming coating solution [P-1] below was prepared and applied onto the undercoat layer by use of a wire bar. A drying operation was carried out at 115° C. for 34 seconds in a hot air drier. A dry coating amount was dried was 1.4 g/m$^2$.

<Photosensitive Layer Coating Solution [P-1]>

| | |
|---|---|
| Infrared absorbent (IR-1) | 0.074 g |
| Polymerization initiator (S-16) | 0.280 g |
| Additive (PM-1) | 0.151 g |
| Polymerizable compound (AM-1) | 1.00 g |
| Particular binder polymer (BT-1) | 1.00 g |
| Ethyl violet (C-1) | 0.04 g |
| Fluorine-based surfactant (Megafac F-780-F, produced by Dainippon Ink and Chemicals, Inc., methyl isobutyl ketone (MIBK) 30% by mass solution) | 0.015 g |
| Methyl ethyl ketone | 10.4 g |
| Methanol | 4.83 g |
| 1-Methoxy-2-propanol | 10.4 g |

The polymerization initiator (S-16) used in the photosensitive layer forming coating solution indicates one cited as examples of compounds of onium salts represented by the formula (RI-III).

Structures of the infrared absorbent (IR-1), additive (PM-1), polymerizable compound (AM-1), binder polymer (BT-1) and ethyl violet (C-1) are shown below.

(IR-1)

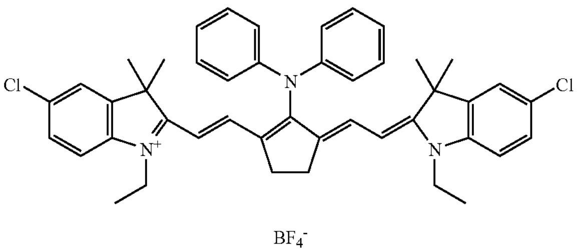

(PM-1)

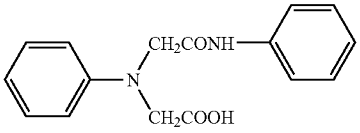

(AM-1)

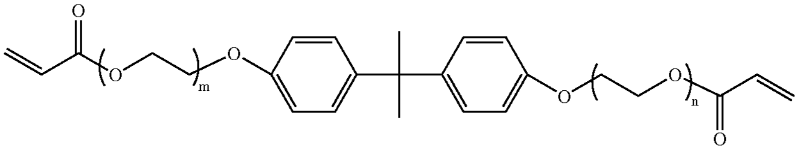

m + n ≈ 4

(BT-1)

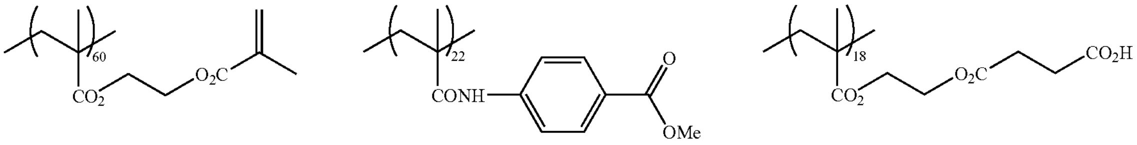

(C-1)

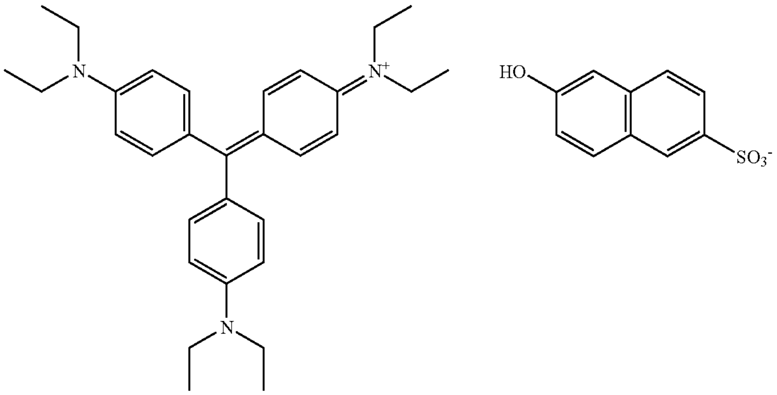

(Formation of Specific Protective Layer)

On a photosensitive layer thus obtained, a specific protective layer forming coating solution [1] below was coated by use of a wire bar, followed by drying at 125° C. for 75 sec in a hot air dryer to form a specific protective layer, thereby a negative-working lithographic printing plate precursor of example 1 was obtained. A total coating amount of the specific protective layer (dry coated amount) was 1.6 g/$m^2$.

<Coating Solution [1] for Specific Protective Layer)

| | |
|---|---|
| Synthetic mica (trade name: Somacif ME-100, 8% aqueous dispersion, produced by CO-OP Chemical Co. Ltd. | 94 g |
| Specific crosslinked polymer (1-1) | 58 g |
| Cellogen PR (trade name, produced by Dai-ichi Kogyo Seiyaku Co., Ltd.) | 24 g |
| Surfactant-1 (trade name: Pluronic P-84, produced by BASF Co., Ltd.) | 2.5 g |
| Surfactant-2 (trade name: Emalex 710, produced by Nihon-Emulsion Co., Ltd.) | 5 g |
| Pure water | 1364 g |

Examples 2 Through 7

Except that, in a composition of the specific protective layer forming coating solution of example 1, the kind of a specific crosslinked polymer was changed as described in Table 5 below and, as described in Table 5 below, an aqueous polymer was used as other polymer, similarly to example 1, negative-working lithographic printing plate precursors of examples 2 through 7 were obtained.

Example 8

Except that, in example 1, a specific protective layer was formed according to a method shown below, similarly to example 1, a negative-working lithographic printing plate precursor of example 8 was obtained.

(Formation of Specific Protective Layer)

On the photosensitive layer formed on the aluminum support described in example 1, a specific protective layer forming coating solution [2] below was coated by use of a wire bar, followed by drying at 125° C. for 75 sec in a hot air dryer to form a specific protective layer. A total coating amount of the specific protective layer (dry coated amount) was 1.6 g/$m^2$.

<Coating Solution [2] for Specific Protective Layer)

| | |
|---|---|
| Specific crosslinked polymer (2-3) | 120 g |
| Cellogen PR (trade name, produced by Dai-ichi Kogyo Seiyaku Co., Ltd.) | 24 g |
| Surfactant-1 (trade name: Pluronic P-84, produced by BASF Co., Ltd.) | 2.5 g |
| Surfactant-2 (trade name: Emalex 710, produced by Nihon-Emulsion Co., Ltd.) | 5 g |
| Pure water | 1400 g |

Example 9

Except that, as a support, one having a backcoat layer shown below on a back surface (surface opposite to a surface where an image recording layer is formed) of the aluminum support described in example 1 was used, similarly to example 1, a lithographic printing plate precursor of example 9 was obtained.

(Formation of Backcoat Layer)

On a back surface of an aluminum support, a backcoat layer forming coating solution [B-1] below was coated by use of a wire bar, followed by drying at 125° C. for 60 sec in a hot air dryer to form a backcoat layer containing an organic resin. A total coating amount of the backcoat layer (dry coated amount) was 0.5 g/$m^2$.

<Coating Solution [B-1] for Backcoat Layer>

| | |
|---|---|
| PR 55422 (trade name, produced by Sumitomo Bakelite Co., Ltd.) (phenol/m-cresol/p-cresol = 5/3/2, average molecular weight: 5300) | 1.0 g |
| Fluorine-based Surfactant (trade name: F780F, produced by Dainippon Ink & Chemical Incorporated) | 0.005 g |
| Methyl ethyl ketone | 25 g |

Comparative Example 1

Except that, in a composition of the coating solution for the specific protective layer of example 1, without using a specific crosslinked polymer, PVA (2) that is acid-denatured PVA described in Table 5 was used, similarly to example 1, a lithographic printing plate precursor of comparative example 1 was obtained.

[Evaluation of Lithographic Printing Plate Precursor]

(1) Evaluation of Sensitivity and Developability

The obtained lithographic printing plate precursor was exposed, by use of Trendsetter 800II Quantum (trade name, produced by Creo Co.), at the resolution: 2400 dpi, number of rotations of outer drum: 200 rpm, output: in a range of 0 to 8 W and with the output varying by 0.15 by log E. The exposure was carried out under conditions of 25° C. and 50% RH.

After the exposure, without applying the heat treatment and washing with water, an automatic developing machine LP-1310HII (trade name, produced by Fuji Photo Film Co., Ltd.) was used to develop at a traveling speed (line speed): 2 m/min and a developing temperature: 30° C. As a developing solution, a 1:4 aqueous dilution solution of DH-N was used, as a developing replenishment solution a 1:1.4 aqueous dilution solution of FCT-421 was used and as a finisher a 1:1 aqueous dilution solution of GN-2K (trade name, produced by Fuji Photo Film Co., Ltd.) was used.

The density of an image portion of a developed lithographic printing plate was measured as the cyan density by use of a Macbeth reflection densitometer RD-918 (trade name) provided with a red filter. An inverse number of an exposure amount necessary to obtain the measured density of 0.9 was used as an indicator of the sensitivity.

As evaluation results, with the sensitivity of the lithographic printing plate obtained in comparative example 1 assigned to 100, the sensitivities of other lithographic printing plates were shown as the relative evaluation values. The larger the value is, the more excellent the sensitivity is.

Furthermore, from the cyan density of a non-image portion of an unexposed portion, the residual color rate was measured. It was evaluated that, when the residual color rate was smaller than 7%, there was no residual color and the developability was evaluated as excellent and, when the residual color rate was 7% or more, the residual color was remarkable and the developability was evaluated as poor.

Residual color rate (%)=[(cyan density after development of an unexposed portion)−(cyan density of an aluminum substrate where the image recording layer forming coating solution was not coated)]/(cyan density of an aluminum substrate where the image recording layer forming coating solution was not coated)

(2) Evaluation of Scratch Resistance

A stacked body was formed by stacking 20 sheets of the obtained lithographic printing plate precursors without interposing an interleaf therebetween. The stacked body was stacked on the same lithographic printing plate precursor disposed by 5 cm from an edge thereof, followed by driving an edge of the protruded 20 sheets of plates (stacked body) in a horizontal direction, thereby a back surface of a support of the most-lowest plate of the stacked 20 sheets is forced to rub a surface of a specific protective layer of the lithographic printing plate precursor. A plate where a surface of a specific protective layer was rubbed by a back surface of a support was used as an evaluation plate of the scratch resistance.

The plate was mounted on a Trendsetter 3244 (trade name, produced by Creo Co.) and a 50% screen tint image was exposed at the resolution: 2400 dpi, output: 7 W, number of rotations of outer drum: 150 rpm and plate surface energy: 10 $mJ/cm^2$. After the exposure, according to a method similar to that of the sensitivity evaluation, development was applied. The presence of flaws generated in the screen tint image was evaluated visually.

The evaluation results were grouped into five levels visually, level 3 indicates a practical lower limit and level 2 or less indicates a practically unusable level.

respective treatments and the washing with water, the draining was applied with a nip roller.

(a) Mechanical Surface Roughening

By use of a mechanical surface roughening device, while feeding a suspension of a polishing agent (pumice) having the specific gravity of 1.12 and water as a polishing slurry on a surface of an aluminum plate, a rotating roller-like nylon brush was used to mechanically roughen. An average particle diameter of the polishing agent was 40 to 45 μm and the maximum particle diameter was 200 μm. As a material of the nylon brush, 6/10 nylon was used, a hair length was 50 mm and a diameter of the hair was 0.3 mm. The nylon brushes were densely planted on a φ300 mm stainless tube provided with holes. Three rotating brushes were used. A distance between two support rollers (φ200 mm) at a bottom portion of the brush was 300 mm. A brush roller was pressed against an aluminum plate until a load of a driving motor that rotates the brush became 7 kw plus to a load before the brush roller was pressed against the aluminum plate. A direction of rotation of the brush was same as a moving direction of the aluminum plate and the number of rotations was 200 rpm.

TABLE 5

| | Specific protective layer | | | | Evaluation result of lithographic printing plate precursor | | |
|---|---|---|---|---|---|---|---|
| | Specific crosslinked polymer | Addition amount (g) | Other Polymer | Addition amount (g) | Sensitivity | Developability | Scratch resistance |
| Example 1 | 1-1 | 58 | — | — | 105 | Excellent | 4 |
| Example 2 | 1-3 | 58 | — | — | 105 | Excellent | 4 |
| Example 3 | 2-3 | 58 | — | — | 110 | Excellent | 5 |
| Example 4 | 2-11 | 58 | — | — | 110 | Excellent | 5 |
| Example 5 | 3-5 | 58 | — | — | 105 | Excellent | 4 |
| Example 6 | 2-3 | 30 | *PVA (1) | 28 | 105 | Excellent | 4 |
| Example 7 | 2-11 | 30 | *PVA (1) | 28 | 105 | Excellent | 4 |
| Example 8 | 2-3 | 150 | — | — | 105 | Excellent | 4 |
| Example 9 | 2-3 | 58 | — | — | 110 | Excellent | 5 |
| Comparative Example 1 | — | — | *PVA (2) | 58 | 100 | Excellent | 3 |

*PVA (1): Gohseran CKS-50 (trade name, produced by The Nippon Synthetic Chemical Industry Co., Ltd., saponification degree: 99% by mole, polymerization degree: 300)
*PVA (2): KL-506 (trade name, produced by Kuraray Co., Ltd.)

As obvious from Table 5, it is found that the negative-working lithographic printing plate precursors of examples 1 through 9, namely, the negative-working lithographic printing plate precursors that have a specific protective layer containing a specific crosslinked polymer on a photosensitive layer, in comparison with comparative example 1, are high in the sensitivity and excellent in the scratch resistance. Furthermore, it is found that the negative-working lithographic printing plate precursors of examples 1 through 9 are excellent in the developability as well.

Examples 10 Through 14

Comparative Example 2

Preparation of Support

A JIS A 1050 aluminum plate having a thickness of 0.24 mm and a width of 1030 mm was continuously subjected to the respective treatments (a) through (g) below. After the (b) Alkali Etching Treatment The aluminum plate was etched by spraying at a sodium hydroxide concentration of 2.6% by mass, an aluminum ion concentration of 6.5% by mass and a liquid temperature of 70° C. to dissolve the aluminum plate by 0.3 $g/m^2$, followed by spraying water to wash.

(c) Desmutting Treatment

An aqueous solution of 1% by mass nitric acid (containing 0.5% by mass of aluminum ion) kept at 30° C. was sprayed to apply a desmutting treatment, followed by spraying water to wash. As the nitric acid aqueous solution used in the desmutting treatment, a waste solution in a process where electrochemical roughening was applied by use of an alternating current in a nitric acid aqueous solution was used.

(d) Electrochemical Roughening Treatment

A surface roughening treatment was electrochemically and continuously applied with an AC voltage of 60 Hz. An electrolytic solution at this time was an aqueous solution of 1% by mass nitric acid (containing aluminum ion of 0.5% by mass and ammonium ion of 0.007% by mass) and a temperature thereof was 40° C. An AC power source was used to supply a trapezoidal rectangular wave alternating-current where a time when a current value reaches from zero to a peak is 2 msec and the duty ratio is 1:1 to apply the electrochemical surface roughening with a carbon electrode as a counter electrode. As an auxiliary anode, ferrite was used.

The current density was 30 $A/dm^2$ at a peak value of the current and an amount of electricity was 255 $C/cm^2$ as a sum total of an amount of electricity when an aluminum plate was an anode. To the auxiliary electrode, 5% of a current flowing from a power source was distributed. Thereafter, washing with water was applied.

(e) Alkali Etching Treatment

The aluminum plate was etched by spraying at a sodium hydroxide concentration of 26% by mass, an aluminum ion concentration of 6.5% by mass and a liquid temperature of 32° C. to dissolve the aluminum plate by 0.2 $g/m^2$, and thereby a smutting component mainly made of aluminum hydroxide generated when the electrochemical surface roughening was applied with an alternating current in the former step was removed and an edge portion of a generated pit was dissolved to make the edge portion smooth, followed by washing with water.

(f) Desmutting Treatment

A desmutting treatment was applied by spraying an aqueous solution of 25% by mass sulfuric acid (containing 0.5% by mass aluminum ion) kept at 60° C., followed by washing with water.

(g) Electrochemical Surface Roughening Treatment

An anodic oxidation treatment was carried out by use of an anodic oxidation unit of a two-step power supplying electrolysis procedure (each of lengths of first and second electrolysis portions: 6 m, a length of the first power supply: 3 m and each of lengths of electrodes of first and second power supplies: 2.4 m) with a sulfuric acid concentration of an electrolysis portion set at 170 g/liter (containing 0.5% by mass aluminum ion) and a temperature set at 38° C. Thereafter, water washing was carried out by spraying.

At this time, in an anodic oxidation unit, a current from a power source flows to a first power supplying electrode disposed to a first power supplying portion, flows through an electrolytic solution to a planar aluminum plate to generate an oxide film on a surface of the planar aluminum plate at a first electrolysis portion, goes through an electrolysis electrode disposed to the first power supplying portion, and returns to a power source. On the other hand, a current from a power source flows to a second power supplying electrode disposed to a second power supplying portion and similarly flows through an electrolytic solution to a planar aluminum plate to generate an oxide film on a surface of the planar aluminum plate at a second electrolysis portion. An amount of electricity supplied from the power source to the first power supplying portion and an amount of electricity supplied from the power source to the second power supplying portion are same and the power supplying current density at an oxide film surface in the second power supplying portion was substantially 25 $A/dm^2$. At the second power supplying portion, an oxide film surface of 1.35 $g/m^2$ was used to supply electricity. An amount of oxide film was finally 2.7 $g/m^2$.

An aluminum plate gone through the (a) through (g) is handled as an aluminum substrate [1].

(Formation of Photosensitive Layer)

On thus treated aluminum substrate [1], a photosensitive layer forming coating solution (P-2) below was coated so that a dry coating weight may be in a range of 1.0 to 1.2 $g/m^2$, followed by drying at 100° C. for 1 min to form a photosensitive layer.

<Photosensitive Layer Forming Coating Solution (P-2)>

| | |
|---|---|
| Addition Polymerizable Compound (M-1) | 1.7 g |
| Binder polymer (B-1) | 1.9 g |
| Sensitizing dye (Dye-1) | 0.2 g |
| Photopolymerization initiator (I-1) | 0.40 g |
| Other additive (C-1) | 0.4 g |
| Fluorinated nonionic surfactant (trade name: Megafac-177, produced by Dainippon Ink & Chemicals, Incorporated) | 0.03 g |
| Thermal polymerization inhibitor (N-nitrosophenylhydroxylamine aluminum salt) | 0.01 g |
| Coloring pigment dispersion having a composition below | 2.0 g |
| Methyl ethyl ketone | 10.0 g |
| Propylene glycol monomethyl ether | 20.0 g |
| Methanol | 10.0 g |
| Water (distilled water) | 2.0 g |

Composition of Coloring Pigment Dispersion

| | |
|---|---|
| Pigment Blue 15:6 | 15 parts by mass |
| Allyl methacrylate/methacrylic acid copolymer (copolymerization molar ratio: 80/20, weight average molecular weight: 40000) | 10 parts by mass |
| Cyclohexanone | 15 parts by mass |
| Methoxypropyl acetate | 20 parts by mass |
| Propylene glycol monomethyl ether | 40 parts by mass |

Details of the respective components used in the photosensitive layer forming coating solution (P-2) are as shown below.

Addition polymerizable compound (M-1): pentaerythritol tetraacrylate (trade name: NK Ester A-TMMT, produced by Shinnakamura Kogyo K. K.)

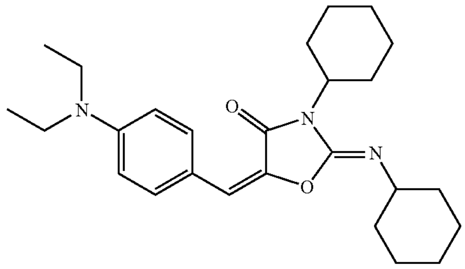

Sensitizing dye (Dye-1)

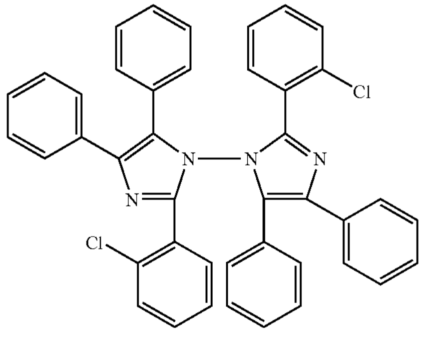

Polymerization initiator (I-1)

-continued

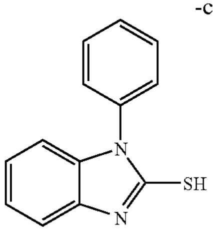

Additives (C-1)

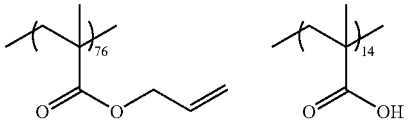

Binder polymer (B-1)

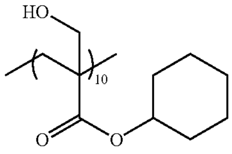

MW = 100,000

(Formation of Specific Protective Layer)

On the photosensitive layer obtained as mentioned above, a specific protective layer forming coating solution (3) below was coated by means of a bar coater, followed by drying at 125° C. for 75 sec in an oven, thereby a specific protective layer having a dry coating weight of 1.80 g/m$^2$ was formed. Thus, lithographic printing plate precursors of examples 10 through 14 and a comparative example 2 were obtained.

<Coating Solution (3) for Specific Protective Layer>

| Specific crosslinked polymer and/or other polymer (compound described in Table 6) an amount described in Table 6 | |
|---|---|
| Polyvinyl pyrrolidone (K30) | 0.0053 g |
| Surfactant (trade name: Emalex 710, produced by Kao Corporation, 1% by mass aqueous solution | 2.15 g |
| Flake synthetic mica (trade name: MEB3L, produced by Unicoo Co., Ltd.) (average particle diameter: 1 to 5 μmφ, 3.4% by mass aqueous dispersion) | 3.50 g |
| Distilled water | 10.60 g |

[Evaluation of Lithographic Printing Plate Precursor]

—Evaluation of Sensitivity—

An obtained lithographic printing plate precursor, after cutting into a size of 700 mm in a vertical direction and 500 mm in a width direction, was mounted on a Violet Semiconductor Laser Setter Vx 9600 (trade name, produced by FUJIFILM Electronic Imaging Ltd.) (having InGaN semiconductor laser; emission wavelength, 405 nm±10 nm; output, 30 mW), followed by drawing a 35% halftone dot image with an FM screen (trade name: TAFFETA 20, produced by Fuji Photo Film Co., Ltd.), at a plate surface exposure amount of 90 μJ/cm$^2$ and the resolution power of 2438 dpi. The exposed lithographic printing plate was automatically conveyed to a connected automatic developing machine LP1250PLX (trade name)(with brush), heated at 100° C. for 10 seconds, followed by washing the protective layer with water, further followed by subjecting to development processing at 28° C. for 20 seconds. The developed plate was washed with water in a rinse bath and conveyed to a gum coating bath. After the gum coating, the plate was dried with hot air and discharged, thereby a lithographic printing plate on which the halftone dot image was drawn was obtained. Here, a developing solution was prepared by diluting a developing solution (trade name: DV-2, produced by Fuji Photo Film Co., Ltd.) five times with water and used. In the gum coating, a developing solution (trade name: FP-2W, produced by Fuji Photo Film Co., Ltd.) diluted with twice water was used. An area ratio of the halftone dot of the obtained lithographic printing plate was measured using CC-dot at 24 points in total separated from each other by 10 cm vertically and horizontally, an average value thereof was calculated, and, with a value of comparative example 2 assigned to 100, the relative sensitivity was shown.

The larger the numerical value is, the higher the sensitivity is. Results are shown in Table 6 below.

—Evaluation of Developability—

With a printer (trade name: Lithron, produced by Komori Corporation) and ink (trade name: GRAPH G(N), produced by Dainippon Ink And Chemicals, Inc.), the obtained lithographic printing plate was used to continuously print and obtained 100$^{th}$ printed matter was visually observed. When there is no stain on a non-image portion at the time point, the developability is judged as excellent, and, when the non-image portion is not sufficiently removed by the development and stain remains, the developability is judged as poor. Results are shown in Table 6 below.

—Evaluation of Scratch Resistance—

A stacked body was formed by stacking 20 sheets of the obtained lithographic printing plate precursor without interposing an interleaf therebetween. The stacked body was stacked on the same lithographic printing plate precursor disposed by 5 cm from an edge thereof, followed by driving an edge of the protruded 20 sheets of plates (stacked body) in a horizontal direction to force a back surface of a support of the most-lowest plate of the stacked 20 sheets to rub a surface of a specific protective layer of a lithographic printing plate. A plate where a surface of a specific protective layer was rubbed by a back surface of a support was used as an evaluation plate of the scratch resistance.

The plate was exposed and developed similarly to the evaluation of the sensitivity and the presence of scratches generated in a screen tint image of the obtained lithographic printing plate was visually evaluated.

The evaluation results were grouped into five levels visually, level 3 indicates a practical lower limit, and level 2 or less a practically unusable level. Results are shown in Table 6 below.

TABLE 6

| | Specific protective layer | | | | Evaluation result of lithographic printing plate precursor | | |
|---|---|---|---|---|---|---|---|
| | Specific crosslinked polymer | Addition amount (g) | Other Polymer | Addition amount (g) | Sensitivity | Developability | Scratch resistance |
| Example 10 | 1-1 | 4.31 | — | — | 100 | Excellent | 4 |
| Example 11 | 1-3 | 4.31 | — | — | 100 | Excellent | 4 |
| Example 12 | 2-3 | 4.31 | — | — | 100 | Excellent | 5 |
| Example 13 | 2-11 | 4.31 | — | — | 100 | Excellent | 5 |
| Example 14 | 2-3 | 3.31 | *PVA (3) | 1.0 | 105 | Excellent | 4 |
| Comparative Example 2 | — | — | *PVA (2) | 4.31 | 100 | Excellent | 3 |

*PVA (2): KL-506 (trade name, produced by Kuraray Co., Ltd.)
*PVA (3): CKS-50 (trade name, produced by The Nippon Synthetic Chemical Industry Co., Ltd., saponification degree: 99% by mole, polymerization degree: 300)

As obvious from Table 6, it is found that the lithographic printing original plates according to examples 10 through 14 and having a specific protective layer exhibit sufficient sensitivity and developability and the scratch resistance more excellent than comparative example 2.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. An image recording material, comprising:

on a support, a protective layer that contains a crosslinked polymer formed of a polymer (a) having at least one kind of ionically crosslinkable functional group, and a low molecular weight compound (b) having from 2 to 10 of at least one kind of ionically crosslinkable functional group in a molecule thereof, on an image recording layer, the image recording layer containing a compound (A), having at least one kind of ethylenically unsaturated bond, and a polymerization initiator (B), wherein the low molecular weight compound (b) is an organic polyvalent onium compound.

2. An image recording material, comprising:

on a support, a protective layer that contains a crosslinked polymer formed of a polymer (a) having at least one kind of ionically crosslinkable functional group, and a low molecular weight compound (b) having from 2 to 10 of at least one kind of ionically crosslinkable functional group in a molecule thereof, on an image recording layer, the image recording layer containing a compound (A), having at least one kind of ethylenically unsaturated bond, a polymerization initiator (B), a binder polymer (C) and a dye (D) having an absorption maximum in a range of 300 to 1200 nm, wherein the low molecular weight compound (b) is an organic polyvalent onium compound.

3. The image recording material of claim 2, wherein the binder polymer (C) is a polymer having an alkali-soluble group.

4. The image recording material of claim 1, wherein the organic polyvalent onium compound is an organic polyammonium compound.

5. The image recording material of claim 2, wherein the organic polyvalent onium compound is an organic polyammonium compound.

6. The image recording material of claim 1, wherein the polymer (a) having at least one kind of ionically crosslinkable functional group is a modified polyvinyl alcohol.

7. The image recording material of claim 2, wherein the polymer (a) having at least one kind of ionically crosslinkable functional group is a modified polyvinyl alcohol.

8. The image recording material of claim 6, wherein the modified polyvinyl alcohol has a carboxylic acid anion or a sulfonic acid anion.

9. The image recording material of claim 7, wherein the modified polyvinyl alcohol has a carboxylic acid anion or a sulfonic acid anion.

10. The image recording material of claim 1, wherein the polymerization initiator (B) is an onium salt.

11. The image recording material of claim 2, wherein the polymerization initiator (B) is an onium salt.

* * * * *